(12) United States Patent
Maurice et al.

(10) Patent No.: US 11,899,406 B2
(45) Date of Patent: Feb. 13, 2024

(54) DEVICES, SYSTEMS, AND METHODS FOR FABRICATING ALKALI VAPOR CELLS

(71) Applicant: The Regents of the University of Colorado, Denver, CO (US)

(72) Inventors: Vincent Maurice, Boulder, CO (US); Douglas G. Bopp, Boulder, CO (US)

(73) Assignee: The Regents of the University of Colorado, a body corporate, Denver, CO (US)

( * ) Notice: Subject to any disclaimer, the term of this patent is extended or adjusted under 35 U.S.C. 154(b) by 576 days.

(21) Appl. No.: 17/143,483

(22) Filed: Jan. 7, 2021

(65) Prior Publication Data

US 2021/0208542 A1 Jul. 8, 2021

Related U.S. Application Data

(60) Provisional application No. 62/958,069, filed on Jan. 7, 2020.

(51) Int. Cl.
| | |
|---|---|
| G04D 3/00 | (2006.01) |
| G01R 33/02 | (2006.01) |
| G04F 5/14 | (2006.01) |

(52) U.S. Cl.
CPC .......... G04D 3/0069 (2013.01); G01R 33/02 (2013.01); G04F 5/14 (2013.01)

(58) Field of Classification Search
CPC .................................................. G04D 3/0069
See application file for complete search history.

(56) References Cited

U.S. PATENT DOCUMENTS

| | | | |
|---|---|---|---|
| 5,192,921 | A | 3/1993 | Chantry et al. |
| 5,327,105 | A | 7/1994 | Liberman et al. |
| 5,670,914 | A | 9/1997 | Liberman et al. |
| 6,570,459 | B1 | 5/2003 | Nathanson et al. |
| 6,806,784 | B2 | 10/2004 | Hollberg et al. |

(Continued)

FOREIGN PATENT DOCUMENTS

EP 1895372 3/2008

OTHER PUBLICATIONS

Douahi, A., et al., "Vapour Microcell for Chip Scale Atomic Frequency Standard", Electronic Letters, 2007, vol. 43 No. 5.

(Continued)

*Primary Examiner* — Michael P Wieczorek
(74) *Attorney, Agent, or Firm* — Meunier Carlin & Curfman LLC

(57) ABSTRACT

Disclosed herein are devices, systems, and methods for fabricating alkali vapor cells. The methods disclosed herein comprise depositing a fluid into a reservoir of a device, the device comprising: a reservoir, a set of receptacles, and a set of conduits fluidly connecting each of the receptacles to the reservoir; such that, when a fluid is placed in the reservoir, the fluid flows to each of the receptacles via capillary action. Also disclosed herein are methods comprising flowing a fluid from an inlet to an outlet of a lumen of a main conduit of a device, the device further comprising a set of receptacles, each of the receptacles being in fluid communication with the lumen of the main conduit; such that, when a fluid flows from the inlet to the outlet through the lumen of the main conduit, the fluid further flows into each of the receptacles via capillary action.

20 Claims, 43 Drawing Sheets

(56) References Cited

U.S. PATENT DOCUMENTS

| | | | |
|---|---|---|---|
| 6,831,522 | B2 | 12/2004 | Kitching et al. |
| 7,064,835 | B2 | 6/2006 | Riley et al. |
| 7,102,451 | B2 | 9/2006 | Happer et al. |
| 8,071,019 | B2 | 12/2011 | Touchberry et al. |
| 8,299,860 | B2 | 10/2012 | Youngner et al. |
| 8,334,690 | B2 | 12/2012 | Kitching et al. |
| 8,480,805 | B2 | 7/2013 | Enzenroth et al. |
| 8,906,470 | B2 * | 12/2014 | Overstolz ............... G04F 5/14 427/372.2 |
| 9,169,974 | B2 * | 10/2015 | Parsa .................. H03L 7/26 |
| 9,568,565 | B2 | 2/2017 | Parsa et al. |
| 9,639,062 | B2 | 5/2017 | Dyer et al. |
| 10,447,286 | B2 | 10/2019 | Park et al. |
| 10,509,369 | B1 | 12/2019 | Lemke et al. |
| 10,605,840 | B1 | 3/2020 | Amarloo et al. |
| 10,859,981 | B1 | 12/2020 | Ramirez-Serrano et al. |
| 2005/0007118 | A1 | 1/2005 | Kitching et al. |
| 2005/0184815 | A1 | 8/2005 | Lipp et al. |
| 2013/0176703 | A1 | 7/2013 | Hopper et al. |
| 2015/0107097 | A1 | 4/2015 | Nagasaka |
| 2015/0378316 | A1 | 12/2015 | Parsa et al. |
| 2016/0218726 | A1 | 7/2016 | Overstolz et al. |
| 2020/0002802 | A1 * | 1/2020 | Kitching ............. B23K 1/20 |

OTHER PUBLICATIONS

Dural, N., et al., "Gallium Phosphide as a New Material for Anodically Bonded Atomic Sensors", APL Materials, 2014, p. 086101, vol. 2.

Ermak, S.V., et al., "Microfabricated Cells for Chip-Scale Atomic Clock Based on Coherent Population Trapping: Fabrication and Investigation", SI. Petersburg Polytechnical University Journal: Physics and Mathematics 1, 2015, p. 37-41.

Espe, W., "Materials of High Vacuum Technology", Metals and Metalloids, 1966, p. 578-601, vol. 1.

Gong, F. et al., "Electrolytic Fabrication of Atomic Clock Cells", Review of Scientific Instruments, 2006, p. 076101, vol. 77.

Karlen, S., et al., "Lifetime Assessment of RbN3-filled MEMS Atomic Vapor Cells with A12O3 Coating", Optics Express, 2017, p. 2187-2194, vol. 25 No. 3.

Kitching J. "Chip-scale atomic devices," Applied Physics Review, 2018, 5, 031302.

Knappe, S. et al., "Atomic Vapor Cells for Miniature Frequency References", IEEE International Frequency Control Symposium and PDA Exhibition Jointly with the 17th European Frequency and Time Forum, 2003, p. 31-32.

Knappe, S., et al., "Atomic Vapor Cells for Chip-Scale Atomic Clocks with Improved Long-Term Frequency Stability", Optic Letters, 2005, p. 2351-2353, vol. 30, No. 18.

Liew, L., et al., "Microfabricated Alkali Atom Vapor Cells", Applied Physics Letters, 2004, p. 2 694-2696, vol. 84 No. 144.

Liew, L., et al., "Wafer-Level Fabrication and Filling of Cesium-Vapor Resonance Cells for Chip-Scale Atomic Devices", Proceedings of 20th Eurosensors Conference, 2006.

Liew, L., et al., "Wafer-Level Filling of Microfabricated Atomic Vapor Cells Based on Thin-Film Deposition and Photolysis of Cesium Azide", Applied Physics Letters, 2007, p. 114106, vol. 90.

Maurice, V., et al., "Microfabricated Vapor Cells Filled with a Cesium Dispensing Paste for Miniature Atomic Clocks", Applied Physics Letters, 2017, p. 164103, vol. 110.

Nathanson, H., et al., "Novel Functionality Using Micro-Gaseous Devices", IEEE, 1995, p. 72-76.

Nieradko, L., et al., "New Approach of Fabrication and Dispensing of Micromachined Cesium Vapor Cell", J Micro/Nanolith. MEMS MOEMS, 2008, p. 033013, vol. 7 No. 3.

Straessle, R., et al., "Microfabricated Alkali Vapor Cell with Anti-Relaxation Wall Coating", Applied Physics Letters, 2014, p. 043502, vol. 105.

Vecchio, F., et al., "Dispensing and Hermetic Sealing Rb in a Miniature Reference Cell for Integrated Atomic Clocks", Sensors and Actuators A: Physical, 2011, p. 330-335, vol. 172.

Wallis, G., et al., "Field Assisted Glass-Metal Sealing", Journal of Applied Physics, 1969, p. 3946-3949, vol. 40 No. 10.

Woetzel, S., et al., "Low-Temperature Anodic Bonding Using Thin Films of Lithium-Niobate-Phosphate Glass," Journal of Micromechanics and Microengineering, 2014, p. 095001, vol. 24.

Woetzel, S., et al., "Microfabricated Atomic Vapor Cell Arrays for Magnetic Field Measurement", Review of Scientific Instruments, 2011, p. 033111, vol. 82.

* cited by examiner

DEVICES, SYSTEMS, AND METHODS FOR FABRICATING ALKALI VAPOR CELLS

CROSS-REFERENCE TO RELATED APPLICATIONS

This application claims the benefit of priority to U.S. Provisional Application No. 62/958,069 filed Jan. 7, 2020, which is hereby incorporated herein by reference in its entirety.

STATEMENT OF GOVERNMENT SUPPORT

This invention was made with government support under Grant No. 70NANB18H006 awarded by the National Institute of Standards and Technology (NIST). The government has certain rights in the invention.

BACKGROUND

Atomic clocks are utilized in various systems which require extremely accurate and stable frequencies, such as in bistatic radars, GPS (global positioning system) and other navigation and positioning systems. Atomic clocks are also used in communications systems, cellular phone systems and for conducting various types of scientific experiments.

One type of atomic clock utilizes a cell containing an active medium such as cesium (or rubidium) vapor. The alkali vapor cell functions as a container for atoms that have natural resonant frequencies when irradiated with optical energy at a given frequency/wavelength. Light from an optical source pumps the atoms of the vapor from a ground state to a higher state from which they fall to a state which is at a hyperfine frequency different from the initial ground state. A microwave signal can then be applied to the vapor cell and an oscillator controlling the microwave signal can be tuned to a particular frequency so as to repopulate the initial ground state. In this manner a controlled amount of the light is propagated from the cell and detected by means of a photodetector.

By examining the output of the photodetector, a control means provides various control signals to the oscillator to ensure that the wavelength of the propagated light and microwave frequency are precisely controlled, e.g. so that the microwave input frequency and hyperfine wavelength frequency are locked. The oscillator thereafter provides a highly accurate and stable frequency output signal for use as a frequency standard or atomic clock.

There is a need for improved techniques for fabricating atom vapor cells. The devices, systems, and methods described herein address these and other needs.

SUMMARY

In accordance with the purposes of the disclosed devices, systems, and methods, as embodied and broadly described herein, the disclosed subject matter relates to devices, systems, and methods for fabricating alkali vapor cells.

For example, disclosed herein are methods comprising: depositing a fluid into a reservoir of a device, the device comprising: a first layer having a top surface and a bottom surface opposite and spaced apart from the top surface; a second layer having a top surface and a bottom surface opposite and spaced apart from the top surface; the second layer comprising a first cavity, a set of second cavities, and a set of grooves; wherein the first cavity perforates the second layer from the top surface to the bottom surface; wherein each of the second cavities perforates the second layer from the top surface to the bottom surface; wherein each of the grooves extends from the first cavity to one of the second cavities on the bottom surface; wherein the second layer is disposed on the first layer, such that the bottom surface of the second layer is disposed on the top surface of the first layer; wherein the first cavity together with the top surface of the first layer defines a reservoir; wherein the set of second cavities together with the top surface of the first layer defines a set of receptacles; and wherein the set of grooves together with the top surface of the first layer define a set of conduits fluidly connecting each of the receptacles to the reservoir; such that, when a fluid is placed in the reservoir, the fluid flows to each of the receptacles via capillary action, such that the fluid at least partially fills each of the receptacles; wherein the fluid comprises an alkali metal precursor and a solvent. In some examples, the alkali metal precursor comprises an alkali halide, an alkali azide, or a combination thereof. In some examples, the first layer comprises glass. In some examples, the second layer comprises silicon.

In some examples, the method further comprises drying the fluid to form a residue comprising the alkali metal precursor as a solid in the receptacles and reservoir. In some examples, the method further comprises disposing a vapor cell preform on the device, the vapor cell preform comprising: a third layer having a top surface and a bottom surface opposite and spaced apart from the top surface; a fourth layer having a top surface and a bottom surface opposite and spaced apart from the top surface; the fourth layer comprising a set of third cavities, wherein each of the third cavities perforates the fourth layer from the top surface to the bottom surface; wherein the fourth layer is disposed on the third layer, such that the bottom surface of the fourth layer is disposed on the top surface of the third layer; wherein the set of third cavities together with the top surface of the third layer defines a set of containers; and wherein the vapor cell perform is disposed on the device such that the top surface of the fourth layer is disposed on the top surface of the second layer and the set of containers are aligned over the set of receptacles. In some examples, the methods further comprise making the vapor cell preform.

In some examples, the methods further comprise subjecting the residue to a reaction stimulus to form an alkali metal vapor, which enters the set of containers, thereby depositing an alkali metal into the containers. In some examples, the reaction stimulus comprises heating the residue at an elevated temperature, irradiating the residue with ultraviolet radiation, or a combination thereof. In some examples, the methods further comprise separating the vapor cell preform from the device after the alkali metal has been deposited into the containers, optionally injecting a buffer gas into the containers, and sealing the containers, thereby forming alkali metal vapor cells.

Also disclosed herein are methods comprising: flowing a fluid from an inlet to an outlet of a lumen of a main conduit of a device, the device comprising: a first layer having a top surface and a bottom surface opposite and spaced apart from the top surface; a second layer having a top surface and a bottom surface opposite and spaced apart from the top surface; the second layer comprising a set of first cavities, a groove, and a set of second cavities; wherein the set of first cavities comprise an inlet shaft and an outlet shaft, wherein the inlet shaft and the outlet shaft each perforates the second layer from the top surface to the bottom surface; wherein each of the second cavities perforates the second layer from the top surface to the bottom surface; wherein the groove extends from the inlet shaft to the outlet shaft along the bottom surface of the second layer; wherein the inlet shaft, the outlet shaft, and each of the second cavities are in fluid communication with the groove; wherein the second layer is disposed on the first layer, such that the bottom surface of the second layer is disposed on the top surface of the first layer; wherein the inlet shaft, the outlet shaft, and the groove together with the top surface of the first layer defines the main conduit having a longitudinal axis, the inlet, the outlet axially spaced apart from the inlet, and the lumen for fluid flow extending from the inlet to the outlet; wherein the set of second cavities together with the top surface of the first layer defines a set of receptacles; and wherein each of the receptacles is in fluid communication with the lumen of the main conduit; such that, when a fluid flows from the inlet to the outlet through the lumen of the main conduit, the fluid further flows into each of the receptacles via capillary action, such that the fluid at least partially fills each of the receptacles; wherein the fluid comprises an alkali metal precursor and a solvent. In some examples, the alkali metal precursor comprises an alkali halide, an alkali azide, or a combination thereof. In some examples, the first layer comprises glass. In some examples, the second layer comprises silicon.

In some examples, the method further comprises drying the fluid to form a residue comprising the alkali metal precursor as a solid in the receptacles and reservoir. In some examples, the method further comprises disposing a vapor cell preform on the device, the vapor cell preform comprising: a third layer having a top surface and a bottom surface opposite and spaced apart from the top surface; a fourth layer having a top surface and a bottom surface opposite and spaced apart from the top surface; the fourth layer comprising a set of third cavities, wherein each of the third cavities perforates the fourth layer from the top surface to the bottom surface; wherein the fourth layer is disposed on the third layer, such that the bottom surface of the fourth layer is disposed on the top surface of the third layer; wherein the set of third cavities together with the top surface of the third layer defines a set of containers; wherein the vapor cell perform is disposed on the device such that the top surface 722 of the fourth layer is disposed on the top surface of the second layer and the set of containers are aligned over the set of receptacles. In some examples, the method further comprises making the vapor cell preform. In some examples, the method further comprises subjecting the residue to a reaction stimulus, thereby forming an alkali metal vapor, which enters the set of containers, thereby depositing the alkali metal into the containers. In some examples, the reaction stimulus comprises heating the residue at an elevated temperature, irradiating the residue with ultraviolet radiation, or a combination thereof. In some examples, the methods further comprise separating the vapor cell preform from the device after the alkali metal has been deposited into the containers, optionally injecting a buffer gas into the containers, and sealing the containers, thereby forming alkali metal vapor cells.

Additional advantages of the disclosed devices, systems, and methods will be set forth in part in the description which follows, and in part will be obvious from the description. The advantages of the disclosed devices, systems, and methods will be realized and attained by means of the elements and combinations particularly pointed out in the appended claims. It is to be understood that both the foregoing general description and the following detailed description are exemplary and explanatory only and are not restrictive of the disclosed devices and methods, as claimed.

The details of one or more embodiments of the invention are set forth in the accompanying drawings and the description below. Other features, objects, and advantages of the invention will be apparent from the description and drawings, and from the claims.

DESCRIPTION OF FIGURES

The accompanying figures, which are incorporated in and constitute a part of this specification, illustrate several aspects of the disclosure, and together with the description, serve to explain the principles of the disclosure.

Figure 1:
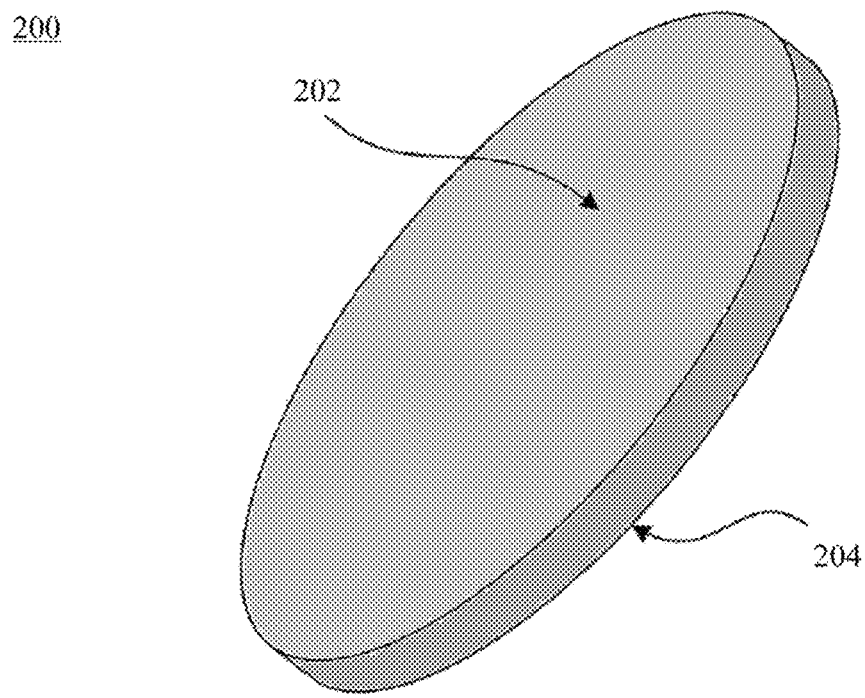
FIG. 1 is a schematic illustration of an example first layer as disclosed herein according to one implementation.

The drawings have not necessarily been drawn to scale. Similarly, some components and/or operations may be separated into different blocks or combined into a single block for the purposes of discussion of some of the embodiments of the present technology. Moreover, while the technology is amenable to various modifications and alternative forms, specific embodiments have been shown by way of example in the drawings and are described in detail below. The intention, however, is not to limit the technology to the particular embodiments described. On the contrary, the technology is intended to cover all modifications, equivalents, and alternatives falling within the scope of the technology as defined by the appended claims.

DETAILED DESCRIPTION

The devices, systems, and methods described herein may be understood more readily by reference to the following detailed description of specific aspects of the disclosed subject matter and the Examples included therein.

Before the present devices, systems, and methods are disclosed and described, it is to be understood that the aspects described below are not limited to specific synthetic methods or specific reagents, as such may, of course, vary. It is also to be understood that the terminology used herein is for the purpose of describing particular aspects only and is not intended to be limiting.

Also, throughout this specification, various publications are referenced. The disclosures of these publications in their entireties are hereby incorporated by reference into this application in order to more fully describe the state of the art to which the disclosed matter pertains. The references disclosed are also individually and specifically incorporated by reference herein for the material contained in them that is discussed in the sentence in which the reference is relied upon.

In this specification and in the claims that follow, reference will be made to a number of terms, which shall be defined to have the following meanings:

Throughout the description and claims of this specification the word "comprise" and other forms of the word, such as "comprising" and "comprises," means including but not limited to, and is not intended to exclude, for example, other additives, components, integers, or steps.

As used in the description and the appended claims, the singular forms "a," "an," and "the" include plural referents unless the context clearly dictates otherwise. Thus, for example, reference to "a composition" includes mixtures of two or more such compositions, reference to "the compound" includes mixtures of two or more such compounds, reference to "an agent" includes mixture of two or more such agents, and the like.

Ranges can be expressed herein as from "about" one particular value, and/or to "about" another particular value. By "about" is meant within 5% of the value, e.g., within 4, 3, 2, or 1% of the value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

"Exemplary" means "an example of" and is not intended to convey an indication of a preferred or ideal embodiment.

"Such as" is not used in a restrictive sense, but for explanatory purposes.

"Optional" or "optionally" means that the subsequently described event or circumstance can or cannot occur, and that the description includes instances where the event or circumstance occurs and instances where it does not.

It is understood that throughout this specification the identifiers "first" and "second" are used solely to aid the reader in distinguishing the various components, features, or steps of the disclosed subject matter. The identifiers "first" and "second" are not intended to imply any particular order, amount, preference, or importance to the components or steps modified by these terms.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

Disclosed herein are devices, systems, and methods for fabricating alkali vapor cells.

Figure 2:
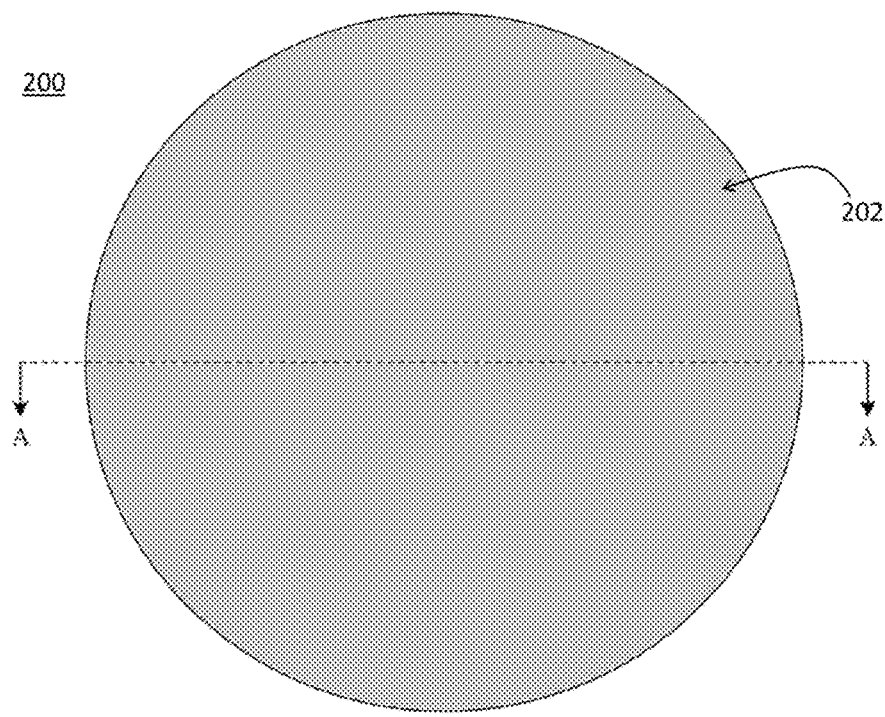
FIG. 2 is a is a schematic plan view of the example first layer shown in FIG. 1.
Figure 3:
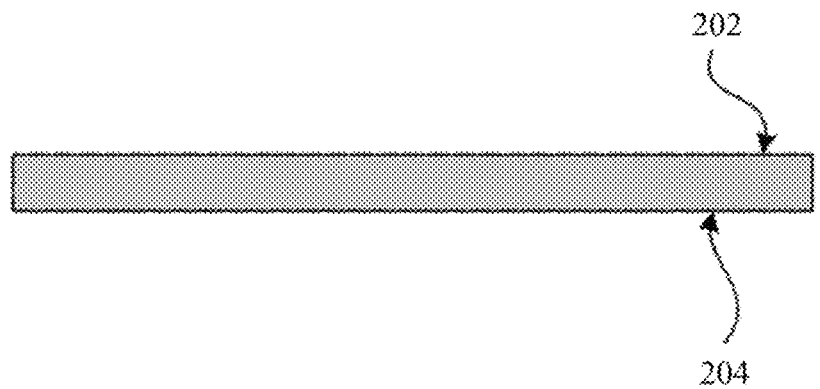
FIG. 3 is a cross-sectional plan view along line A-A in FIG. 2 of the example first layer shown in FIG. 1 and FIG. 2.

Referring now to FIG. 1-FIG. 3, the devices comprise a first layer 200 having a top surface 202 and a bottom surface 204 opposite and spaced apart from the top surface 202. In some examples, the top surface 202 and the bottom surface 204 of the first layer 200 are substantially parallel to each other.

The first layer 200 can comprise any material consistent with the methods, devices, and systems disclosed herein. In some examples, the first layer 200 can comprise a dielectric, a semiconductor, a ceramic, a transparent conducing oxide, a polymer, a metal, or a combination thereof. Examples of first layers 200 include, but are not limited to, glass, quartz, Pyrex, fused silica, silicon dioxide, silicon nitride, sapphire, a polymer (e.g., polycarbonate), and combinations thereof. In some examples, the first layer 200 can be transparent. As used herein, a "transparent layer" is meant to include any layer that is transparent at the wavelength or wavelength region of interest. In some examples, the first layer 200 comprises glass (e.g., aluminosilicate glass, borosilicate glass, etc.).

The first layer 200 has an average thickness, the average thickness being the average dimension from the top surface 202 to the bottom surface 204. The average thickness of the first layer 200 can, for example be 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the first layer 200 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average thickness of the first layer 200 can range from any of the minimum values described above to any of the maximum values described above. For example, the average thickness of the first layer 200 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 202 and the bottom surface 204 of the first layer 200 can, independently, be any shape. In some examples, the top surface 202 and the bottom surface 204 of the first layer 200 can, independently, be substantially circular, ovate, ovoid, elliptic, triangular, rectangular, polygonal, etc. In some examples, the top surface 202 and the bottom surface 204 of the first layer 200 can be substantially the same shape. In some examples, the top surface 202 and the bottom surface 204 of the first layer 200 can be substantially circular.

The first layer 200 has an average lateral dimension (e.g., diameter when the first layer 200 is a circular wafer) of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the first layer 200 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average lateral dimension of the first layer 200 can range from any of the minimum values described above to any of the maximum values described above. For example, the average lateral dimension of the first layer 200 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

The devices further comprise a second layer 300 having a top surface 302 and a bottom surface 304 opposite and spaced apart from the top surface. In some examples, the top surface 302 and the bottom surface 304 of the second layer 300 are substantially parallel to each other.

The second layer 300 can comprise any material consistent with the methods, devices, and systems disclosed herein. In some examples, the second layer 300 can comprise a dielectric, a semiconductor, a ceramic, a transparent conducting oxide, a polymer, a metal, or a combination thereof. Examples of second layers 300 include, but are not limited to, silicon, glass (e.g. aluminum coated glass), sapphire, a ceramic, and combinations thereof. In some examples, the second layer 300 comprises silicon. In some examples, the second layer 300 is hydrophilic.

The second layer 300 has an average thickness, the average thickness being the average dimension from the top surface 302 to the bottom surface 304. The average thickness of the second layer 300 can, for example be 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the second layer 300 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average thickness of the second layer 300 can range from any of the minimum values described above to any of the maximum values described above. For example, the average thickness of the second layer 300 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 302 and the bottom surface 304 of the second layer 300 can, independently, be any shape. In some examples, the top surface 302 and the bottom surface 304 of the second layer 300 can, independently, be substantially circular, ovate, ovoid, elliptic, triangular, rectangular, polygonal, etc. In some examples, the top surface 302 and the bottom surface 304 of the second layer 300 can be substantially the same shape. In some examples, the top surface 302 and the bottom surface 304 of the second layer 300 can be substantially circular.

In some examples, the top surface 202 and the bottom surface 204 of the first layer 200 and the top surface 302 and the bottom surface 304 of the second layer 300 are all substantially circular.

The second layer 300 has an average lateral dimension (e.g., diameter when the second layer 300 is a circular wafer) of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the second layer 300 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average lateral dimension of the second layer 300 can range from any of the minimum values described above to any of the maximum values described above. For example, the average lateral dimension of the second layer 300 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm). In some examples, the average lateral dimension of the second layer 300 and the average lateral dimension of the first layer 200 are substantially equal.

Figure 4:
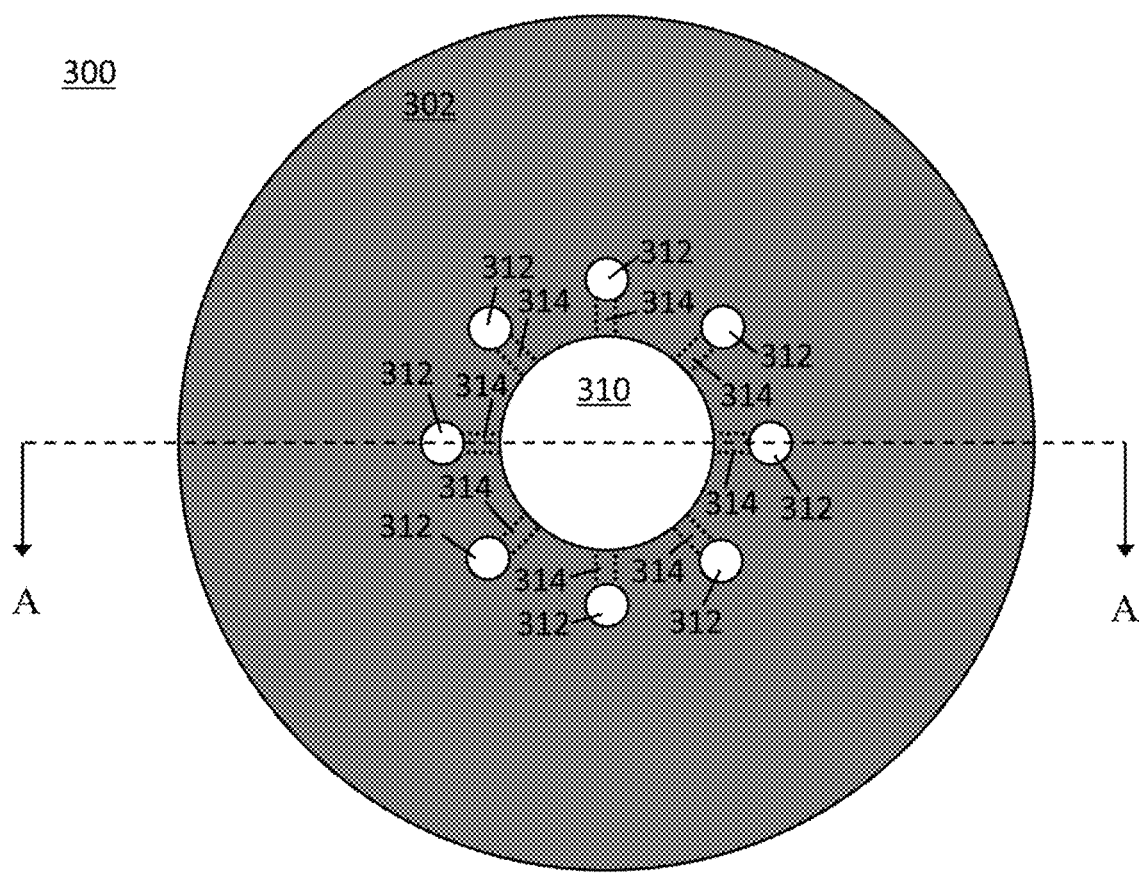
FIG. 4 is a schematic plan view of an example second layer as disclosed herein according to one implementation.
Figure 5:
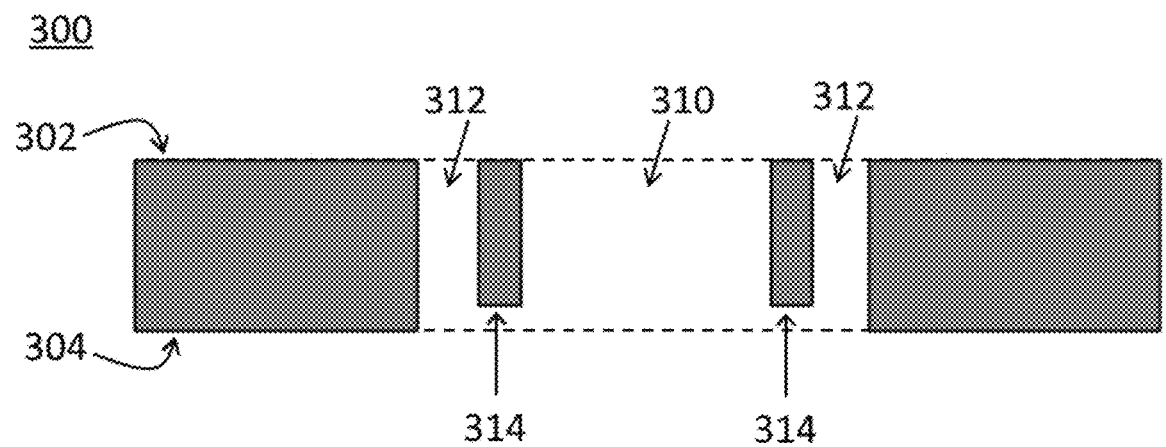
FIG. 5 is a cross-sectional plan view along line A-A in FIG. 4 of the example second layer.

Referring now to FIG. 4-FIG. 5, the second layer 300 comprises a first cavity 310, a set of second cavities 312, and a set of grooves 314; wherein the first cavity 310 perforates the second layer 300 from the top surface 302 to the bottom surface 304; wherein each of the second cavities 312 perforates the second layer 300 from the top surface 302 to the bottom surface 304; wherein each of the grooves 314 extends from the first cavity 310 to one of the second cavities 312 on the bottom surface 304.

As used herein, "a first cavity 310" and "the first cavity 310" are meant to include any number of first cavities 310 in any arrangement. Thus, for example, "a first cavity 310" includes one or more first cavities 310 (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more;

750,000 or more; or 1,000,000 or more). In some examples, the first cavity 310 can comprise a plurality of first cavities 310.

Figure 24:
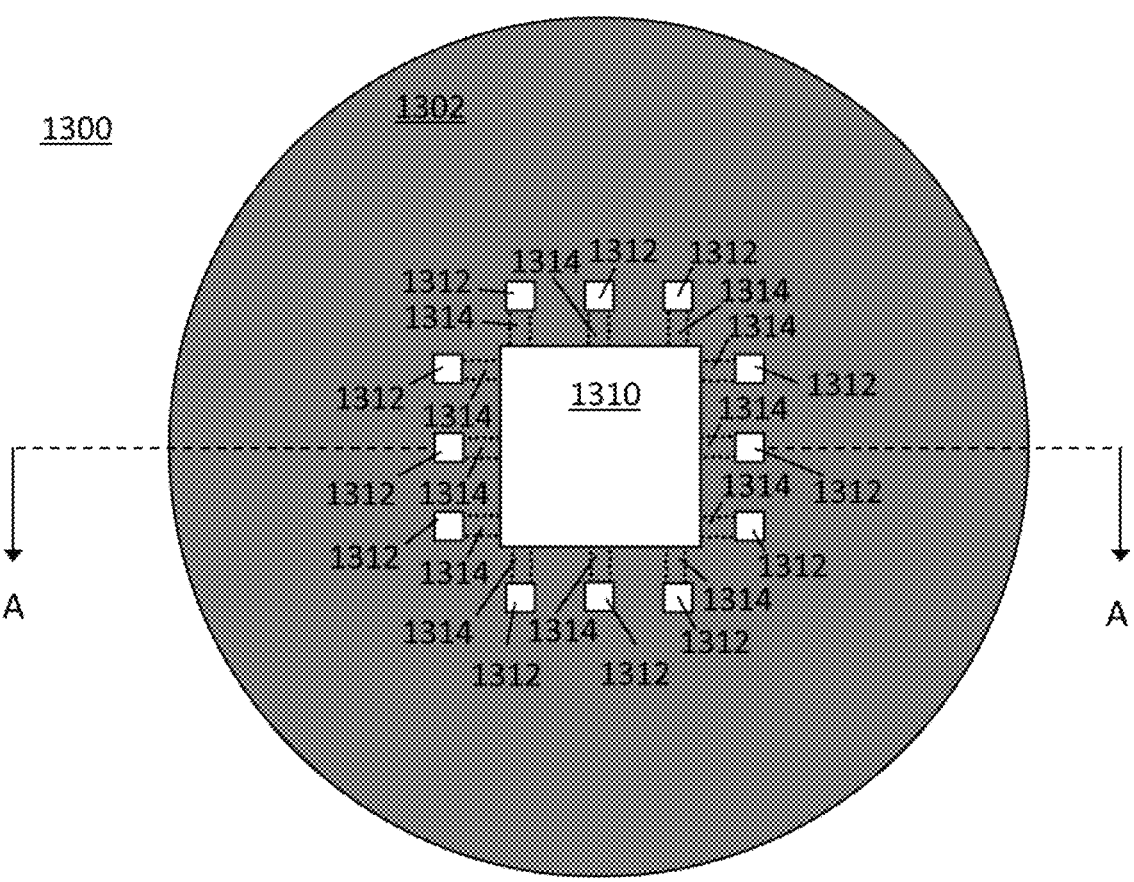
FIG. 24 is a schematic plan view of an example second layer as disclosed herein according to one implementation.

The first cavity 310 has a central longitudinal axis and a cross-sectional shape in a plane perpendicular to the central longitudinal axis of said cavity 310, wherein the cross-sectional shape can be any shape, such as a regular shape, an irregular shape, an isotropic shape, or an anisotropic shape. In some examples, the cross-sectional shape of the first cavity 310 can be substantially circular, ovate, ovoid, elliptic, triangular, rectangular, polygonal, etc. In some examples, the cross-sectional shape of the first cavity 310 can be substantially circular, as shown in FIG. 4. In some examples, the cross-sectional shape of the first cavity can be substantially rectangular, as shown in FIG. 24. In some examples, the central longitudinal axis of the first cavity 310 is substantially perpendicular to the bottom surface 304 of the second layer 300 (e.g., such that the cross-sectional shape is in a plane substantially parallel to the bottom surface 304 of the second layer 300).

The first cavity 310 can have an average characteristic dimension. The term "characteristic dimension," as used herein refers to the largest straight line distance between two points in the plane of the cross-sectional shape of the first cavity 310 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension. For example, for a cylindrical first cavity 310, the cross-sectional shape can be substantially circular and the average characteristic dimension can refer to the diameter. In some examples, the average characteristic dimension of the first cavity 310 can be substantially the same for the entire thickness. In some examples, the average characteristic dimension of the first cavity 310 can vary with the thickness (e.g., tapered or stepped).

The first cavity 310 can have an average characteristic dimension of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the first cavity 310 can have an average characteristic dimension of 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average characteristic dimension of the first cavity 310 can range from any of the minimum values described above to any of the maximum values described above. For example, the average characteristic dimension of the first cavity 310 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

As used herein, "a set of second cavities 312" and "the set of second cavities 312" are meant to include any number of second cavities 312 in any arrangement. Thus, for example, "a set of second cavities 312" includes one or more second cavities 312 (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of second cavities 312 can comprise a plurality of second cavities 312, wherein each of the second cavities 312 is located adjacent the first cavity 310. In some examples, the set of second cavities 312 comprises a plurality of second cavities 312, wherein each of the second cavities 312 is located adjacent the first cavity 310 in an ordered array.

Each of the set of second cavities 312 has a central longitudinal axis and a cross-sectional shape in a plane perpendicular to the central longitudinal axis of said cavity 312, wherein the cross-sectional shape can be any shape, such as a regular shape, an irregular shape, an isotropic shape, or an anisotropic shape. In some examples, the cross-sectional shape of each of the set of second cavities 312 can be substantially circular, ovate, ovoid, elliptic, triangular, rectangular, polygonal, etc. In some examples, the cross-sectional shape of each of the set of second cavities 312 is substantially the same. In some examples, the cross-sectional shape of the set of second cavities 312 can be substantially circular, as shown in FIG. 4. In some examples, the cross-sectional shape of the set of second cavities can be substantially rectangular, as shown in FIG. 24. In some examples, the cross-sectional shape of each of the second cavities 312 is the same. In some examples, the cross-sectional shape of the set of second cavities 312 can be the same as the cross-sectional shape of the first cavity 310. In some examples, the cross-sectional shape of the set of second cavities 312 can be different than the cross-sectional shape of the first cavity 310.

In some examples, the central longitudinal axis of each of the set of second cavities 312 are substantially parallel to each other. In some examples, the central longitudinal axis of each of the set of second cavities 312 are substantially parallel to the central longitudinal axis of the first cavity 310. In some examples, the central longitudinal axis of each of the set of second cavities 312 is substantially perpendicular to the bottom surface 304 of the second layer 300 (e.g., such that the cross-sectional shape is in a plane substantially parallel to the bottom surface 304 of the second layer 300).

The set of second cavities 312 can have an average characteristic dimension. The term "characteristic dimension," as used herein refers to the largest straight line distance between two points in the plane of the cross-sectional shape of each of the second cavities 312 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of second cavities 312, the cross-sectional shape can be substantially circular and the average characteristic dimension can refer to the average diameter. In some examples, the average characteristic dimension of the set of second cavities 312 can be substantially the same for the entire thickness. In some examples, the average characteristic dimension of the set of second cavities 312 can vary with the thickness (e.g., tapered or stepped).

The set of second cavities 312 can, for example, have an average characteristic dimension of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the set of second cavities 312 can have an average characteristic dimension of 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average characteristic dimension of the set of second cavities 312 can range from any of the minimum values described above to any of the maximum values described above. For example, the average characteristic dimension of the set of second cavities 312 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

In some examples, the average characteristic dimension of each of the set of second cavities 312 is substantially the same (e.g., the average characteristic dimension of each of the set of second cavities 312 is substantially the same as the average characteristic dimension of the set of second cavities 312). In some examples, the average characteristic dimension of the set of second cavities 312 is less than or equal to the average characteristic dimension of the first cavity 310.

As used herein, "a set of grooves 314" and "the set of grooves 314" are meant to include any number of grooves 314 in any arrangement. Thus, for example, "a set of grooves 314" includes one or more grooves 314 (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of grooves 314 can comprise a plurality of grooves 314. In some examples, the number of grooves 314 in the set of grooves 314 is equal to the number of second cavities 312 in the set of second cavities 312.

Figure 6:
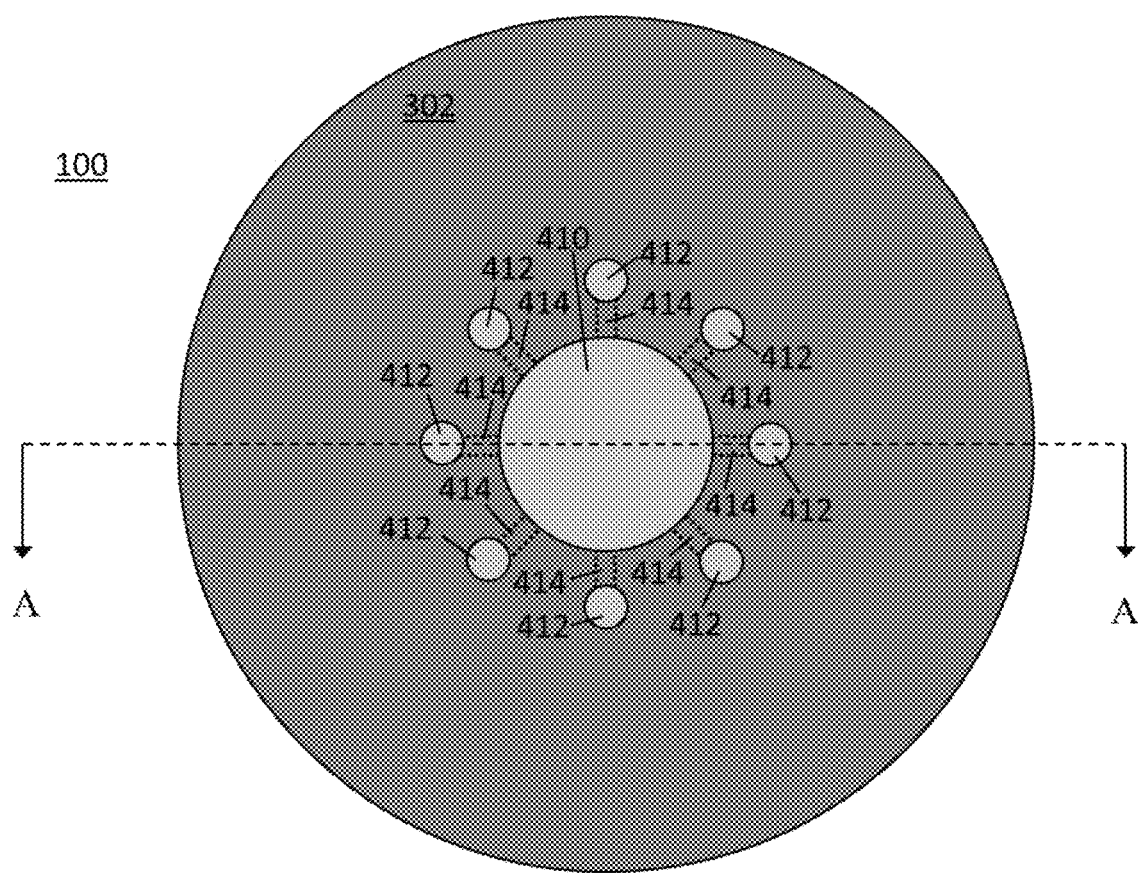
FIG. 6 is a schematic plan view of an example device as disclosed herein according to one implementation.
Figure 7:
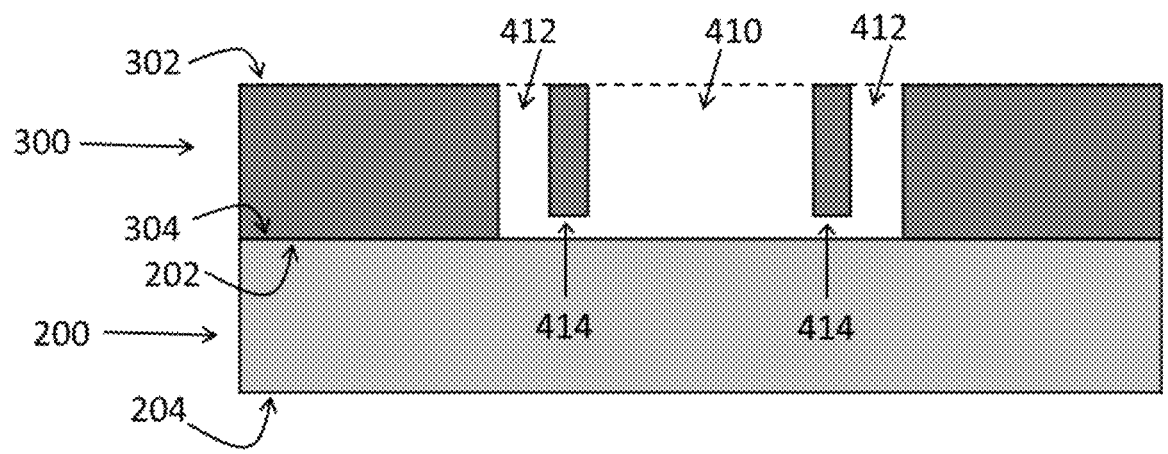
FIG. 7 is a cross-sectional plan view along line A-A in FIG. 6 of the example device.
Figure 8:
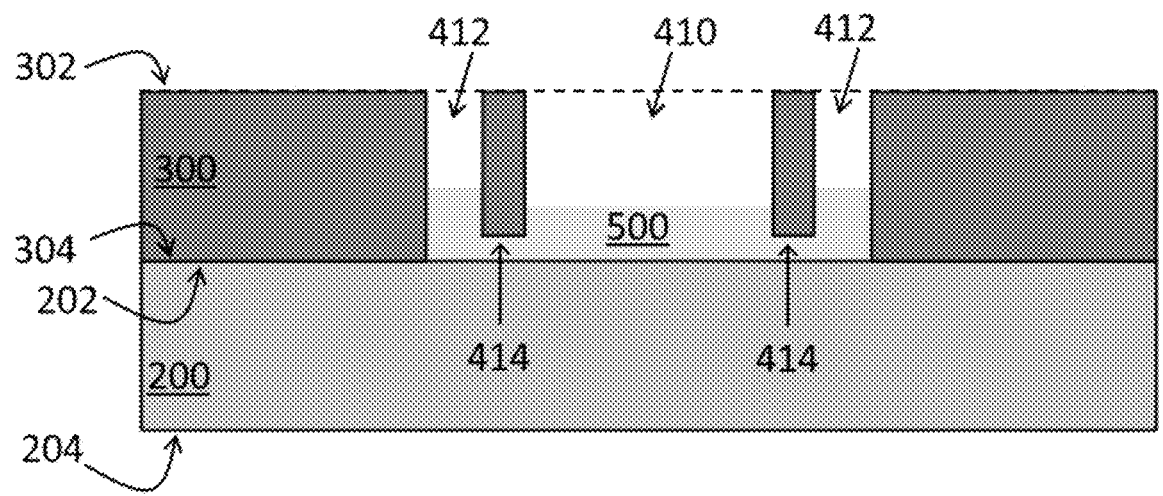
FIG. 8 is a cross-sectional plan view of the example device along line A-A in FIG. 6 wherein the example device includes a fluid according to one example implementation.

Referring now to FIG. 6-FIG. 8, the second layer 300 is disposed on the first layer 200 in the devices 100, such that the bottom surface 304 of the second layer 300 is disposed on the top surface 202 of the first layer 200, such that: the first cavity 310 together with the top surface 202 of the first layer 200 defines a reservoir 410; the set of second cavities 312 together with the top surface 202 of the first layer 200 defines a set of receptacles 412; and the set of grooves 314 together with the top surface 202 of the first layer 200 define a set of conduits 314 fluidly connecting each of the receptacles 412 to the reservoir 410; such that, when a fluid 500 is placed in the reservoir 410, the fluid flows to each of the receptacles 412 via capillary action, such that the fluid at least partially fills each of the receptacles 412. The reservoir 410 and the set of receptacles 412 each have an open top (e.g., open at the top surface 302 of the second layer 300). In some examples, the top surface 202 and the bottom surface 204 of the first layer 200 and the top surface 302 and the bottom surface 304 of the second layer 300 are all substantially parallel to each other in the device 100. In some examples, the second layer 300 is disposed on the first layer 200 in the devices 100, such that the bottom surface 304 of the second layer 300 is disposed on and in physical contact with the top surface 202 of the first layer 200. In some examples, the first layer 200 is bonded to the second layer 300. For example, the first layer 200 can be bonded to the second layer 300 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein comprise, for example, depositing the fluid 500 into the reservoir 410, such that the fluid flows to each of the receptacles 412 via capillary action and the fluid at least partially fills each of the receptacles 412. The fluid can, for example, comprise an alkali metal precursor and a solvent.

The alkali metal precursor can, for example, comprise any compound or composition capable of reacting to form a free alkali metal. The alkali metal precursor can, for example, comprise an alkali metal compound, wherein the alkali metal can include an alkali atom, an alkaline earth atom, a lanthanide, an actinide, or combinations thereof. In some examples, the alkali metal precursor can, for example, comprise an alkali metal compound, wherein the alkali metal can include potassium (K), rubidium (Rb), cesium (Cs), or a combination thereof. The alkali metal precursor can, for example, comprise an alkali halide (e.g., an alkali chloride), an azide, a chromate, a molibdate, or a combination thereof. Exemplary alkali halides include RbCl, CsCl, KCl, RbBr, CsBr, KBr, and the like. Exemplary alkali azides include $RbN_3$, $CsN_3$, $KN_3$, and the like. In some examples, the alkali metal precursor can include $RbN_3$, $CsN_3$, $KN_3$ that can produce alkali metal in response to being subjected to ultraviolet light. Alkali halides can, for example, be reacted with $BaN_6$ or Ca to produce alkali metal. In some examples, alkali metal precursor includes $BaN_6$ and an alkali chloride, which can react to form BaCl, $N_2$, and alkali metal in response to heating.

In some examples, the fluid can further comprise a reducing agent such as barium azide, calcium, zirconium, or aluminum.

Examples of suitable solvents include, but are not limited to, tetrahydrofuran (THF), N-methyl-2-pyrrolidone (NMP), dimethylformamide (DMF), N-methylformamide, formamide, dimethyl sulfoxide (DMSO), dimethylacetamide, dichloromethane ($CH_2Cl_2$), ethylene glycol, polyethylene glycol, glycerol, alkane diol, tetraglyme, propylene carbonate, diglyme, dimethoxyethane, ethanol, methanol, propanol, isopropanol, water, acetonitrile, chloroform, acetone, hexane, heptane, toluene, xylene, methyl acetate, ethyl acetate, and combinations thereof. In some examples, the solvent comprises water such that the fluid comprises an aqueous solution comprising the alkali metal precursor.

The methods can, for example, comprise drying the fluid, for example by evaporating the solvent, thereby forming a residue 520 comprising the alkali metal precursor as a solid. Wherein, upon drying the liquid, the residue comprising the alkali metal precursor as a solid is stable (e.g., stable at room temperature).

In some examples, the methods can further comprise making the first cavity 310, the set of second cavities 312, and the set of grooves 314 in second layer 300. The first cavity 310, the set of second cavities 312, and the set of grooves 314 can be patterned in the second layer using standard techniques known in the art, such as lithographic patterning, etching, micromachining, deep reactive ion etching, direct laser ablation, and the like. In some examples, the methods can further comprise disposing the second layer 300 on the first layer 200. In some examples, the methods can further comprise bonding the first layer 200 and the second layer 300. For example, the first layer 200 can be bonded to the second layer 300 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

Figure 9:
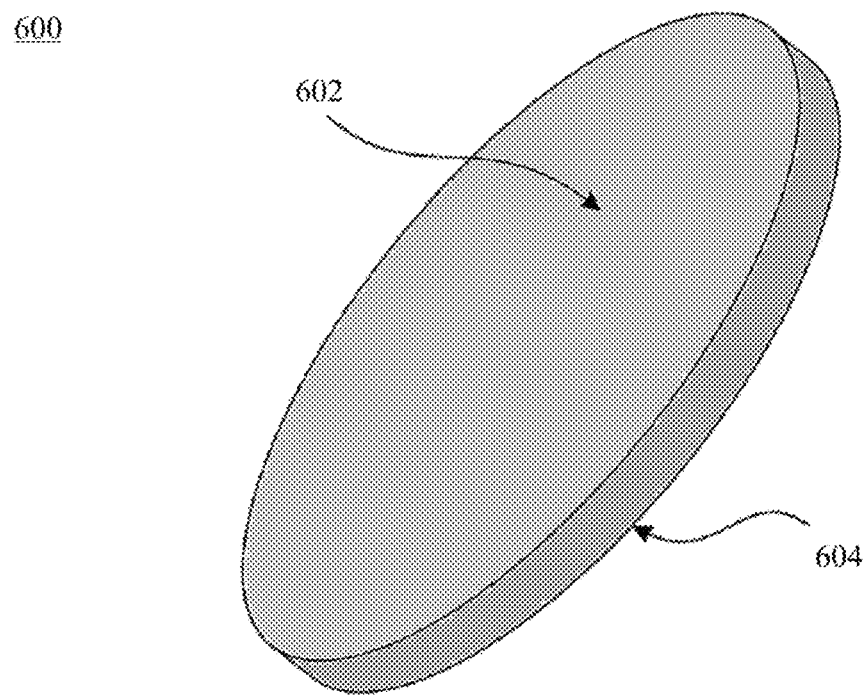
FIG. 9 is a schematic illustration of an example third layer as disclosed herein according to one implementation.
Figure 10:
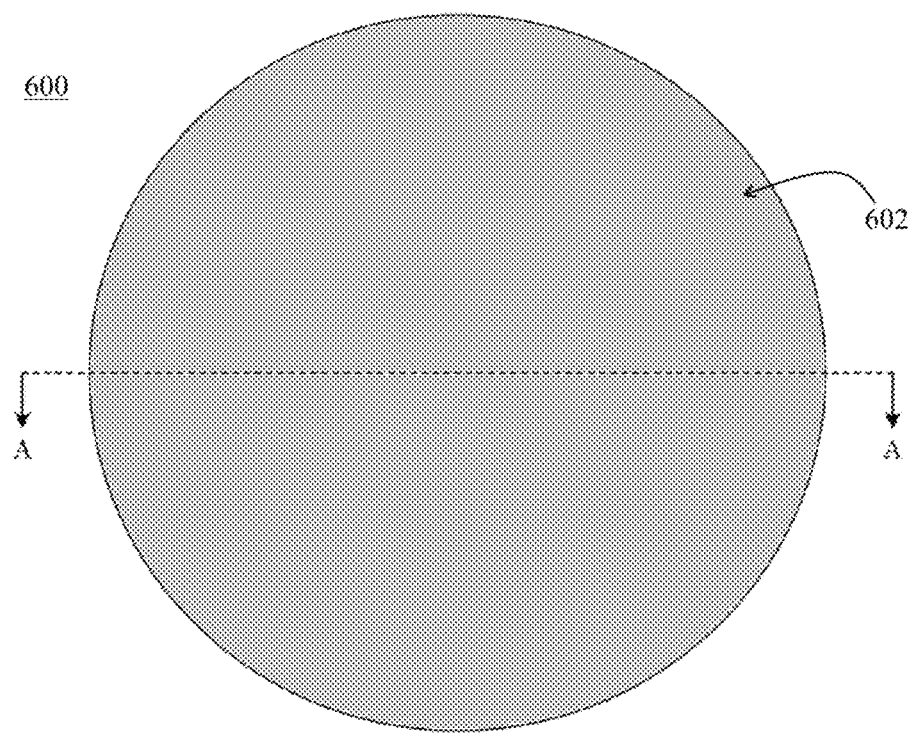
FIG. 10 is a is a schematic plan view of the example third layer shown in FIG. 9.
Figure 11:
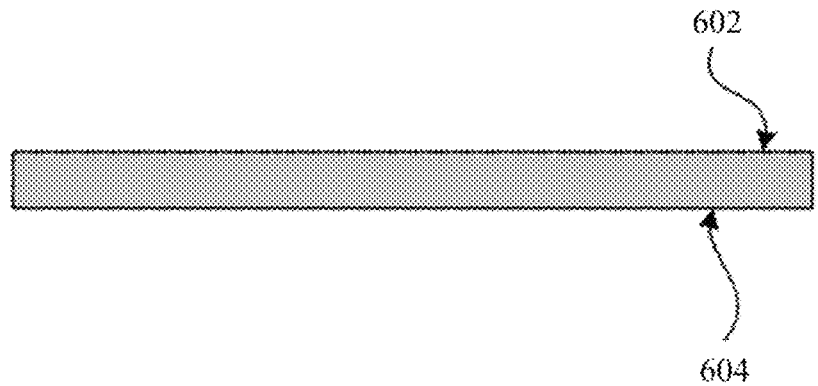
FIG. 11 is a cross-sectional plan view along line A-A in FIG. 10 of the example third layer shown in FIG. 9 and FIG. 10.

Also disclosed herein are vapor cell preforms. Referring now to FIG. 9-FIG. 11, the vapor cell preforms can comprise a third layer 600 having a top surface 602 and a bottom surface 604 opposite and spaced apart from the top surface 602. In some examples, the top surface 602 and the bottom surface 604 of the third layer 600 are substantially parallel to each other.

The third layer 600 can comprise any material consistent with the methods, devices, and systems disclosed herein. In some examples, the third layer 600 can comprise a dielectric, a semiconductor, a ceramic, a transparent conducing oxide, a polymer, a metal, or a combination thereof. Examples of third layers 600 include, but are not limited to, glass, quartz, Pyrex, fused silica, silicon dioxide, silicon nitride, sapphire, a polymer (e.g., polycarbonate), and combinations thereof. In some examples, the third layer 600 can be transparent. As used herein, a "transparent layer" is meant to include any layer that is transparent at the wavelength or wavelength region of interest. In some examples, the third layer 600 comprises glass (e.g., aluminosilicate glass, borosilicate glass, etc.).

The third layer 600 has an average thickness, the average thickness being the average dimension from the top surface 602 to the bottom surface 604. The average thickness of the third layer 600 can, for example be 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the third layer 600 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average thickness of the third layer 600 can range from any of the minimum values described above to any of the maximum values described above. For example, the average thickness of the third layer 600 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 602 and the bottom surface 604 of the third layer 600 can, independently, be any shape. In some examples, the top surface 602 and the bottom surface 604 of the third layer 600 can, independently, be substantially circular, ovate, ovoid, elliptic, triangular, rectangular, polygonal, etc. In some examples, the top surface 602 and the bottom surface 604 of the third layer 600 can be substantially the same shape. In some examples, the top surface 602 and the bottom surface 604 of the third layer 600 can be substantially circular.

The third layer 600 has an average lateral dimension (e.g., diameter when the third layer 600 is a circular wafer) of 1 micrometer (micron, µm) or more (e.g., 2 µm or more, 3 µm or more, 4 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the third layer 600 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (µm) or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average lateral dimension of the third layer 600 can range from any of the minimum values described above to any of the maximum values described above. For example, the average lateral dimension of the third layer 600 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm).

The vapor cell preforms further comprise a fourth layer 700 having a top surface 702 and a bottom surface 704 opposite and spaced apart from the top surface 702. In some examples, the top surface 702 and the bottom surface 704 are substantially parallel to each other.

The fourth layer 700 can comprise any material consistent with the methods, devices, and systems disclosed herein. In some examples, the fourth layer 700 can comprise a dielectric, a semiconductor, a ceramic, a transparent conducing oxide, a polymer, a metal, or a combination thereof. Examples of fourth layers 700 include, but are not limited to, silicon, glass (e.g. aluminum coated glass), sapphire, a ceramic, and combinations thereof. In some examples, the fourth layer 700 comprises silicon.

The fourth layer 700 has an average thickness, the average thickness being the average dimension from the top surface 702 to the bottom surface 704. The average thickness of the fourth layer 700 can, for example be 1 micrometer (micron, µm) or more (e.g., 2 µm or more, 3 µm or more, 4 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the fourth layer 700 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (µm) or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average thickness of the fourth layer 700 can range from any of the minimum values described above to any of the maximum values described above. For example, the average thickness of the fourth layer 700 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 702 and the bottom surface 704 of the fourth layer 700 can, independently, be any shape. In some examples, the top surface 702 and the bottom surface 704 of the fourth layer 700 can, independently, be substantially circular, ovate, ovoid, elliptic, triangular, rectangular, polygonal, etc. In some examples, the top surface 702 and the bottom surface 704 of the fourth layer 700 can be substantially the same shape. In some examples, the top surface 702 and the bottom surface 704 of the fourth layer 700 can be substantially circular.

In some examples, the top surface 602 and the bottom surface 604 of the third layer 600 and the top surface 702 and the bottom surface 704 of the fourth layer 700 are all substantially circular. In some examples, the top surface 202 and the bottom surface 204 of the first layer 200; the top surface 302 and the bottom surface 304 of the second layer 300; the top surface 602 and the bottom surface 604 of the third layer 600; and the top surface 702 and the bottom surface 704 of the fourth layer 700 are all substantially circular.

The fourth layer 700 has an average lateral dimension (e.g., diameter when the fourth layer 700 is a circular wafer) of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the fourth layer 700 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average lateral dimension of the fourth layer 700 can range from any of the minimum values described above to any of the maximum values described above. For example, the average lateral dimension of the fourth layer 700 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

In some examples, the average lateral dimension of the third layer 600 and the average lateral dimension of the fourth layer 700 are substantially equal. In some examples, the average lateral dimension of the first layer 200, the average lateral dimension of the second layer 300, the average lateral dimension of the third layer 600, and the average lateral dimension of the fourth layer 700 are substantially equal.

Figure 12:
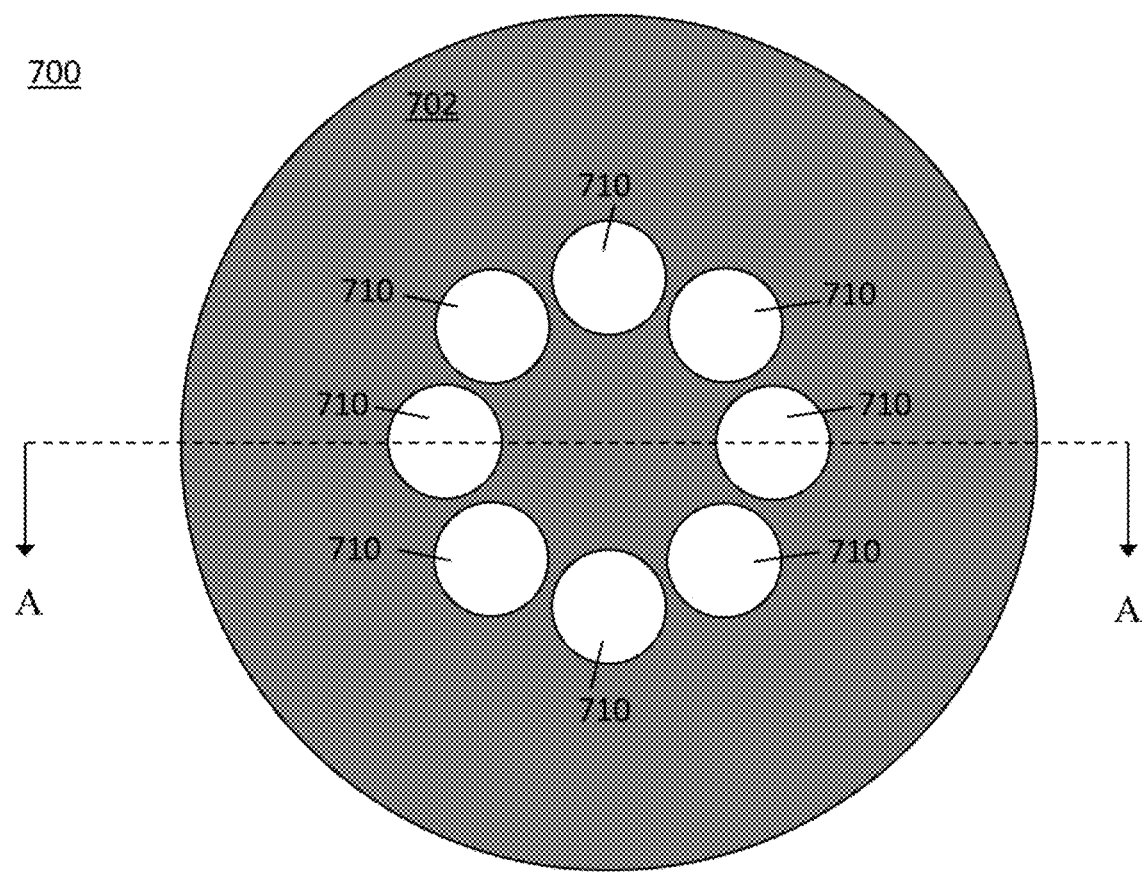
FIG. 12 is a schematic plan view of an example fourth layer as disclosed herein according to one implementation.
Figure 13:
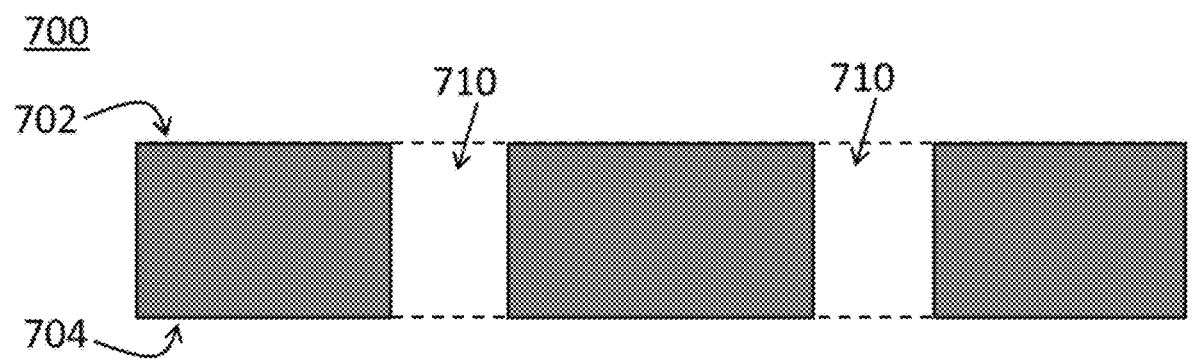
FIG. 13 is a cross-sectional plan view along line A-A in FIG. 12 of the example fourth layer.

Referring now to FIG. 12-FIG. 13, the fourth layer 700 comprises a set of third cavities 710, wherein each of the third cavities 710 perforates the fourth layer 700 from the top surface 702 to the bottom surface 704.

As used herein, "a set of third cavities 710" and "the set of third cavities 710" are meant to include any number of third cavities 710 in any arrangement. Thus, for example, "a set of third cavities 710" includes one or more third cavities 710 (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of third cavities 710 can comprise a plurality of third cavities 710. In some examples, the set of third cavities 710 comprises a plurality of third cavities 710 arranged in an ordered array. In some examples, the number of third cavities 710 is equal to the number of second cavities 312.

Each of the set of third cavities 710 has a central longitudinal axis and a cross-sectional shape in a plane perpendicular to the central longitudinal axis of said cavity 710, wherein the cross-sectional shape can be any shape, such as a regular shape, an irregular shape, an isotropic shape, or an anisotropic shape. In some examples, the cross-sectional shape of each of the set of third cavities 710 can be substantially circular, ovate, ovoid, elliptic, triangular, rectangular, polygonal, etc. In some examples, the cross-sectional shape of each of the set of third cavities 710 is substantially the same. In some examples, the cross-sectional shape of the set of third cavities 710 can be substantially circular, as shown in FIG. 12. In some examples, the cross-sectional shape of each of the third cavities 710 is the same. In some examples, the cross-sectional shape of the set of third cavities 710 can be the same as the cross-sectional shape of the set of second cavities 312. In some examples, the cross-sectional shape of the set of third cavities 710 can be different than the cross-sectional shape of the set of second cavities 312.

Figure 29:
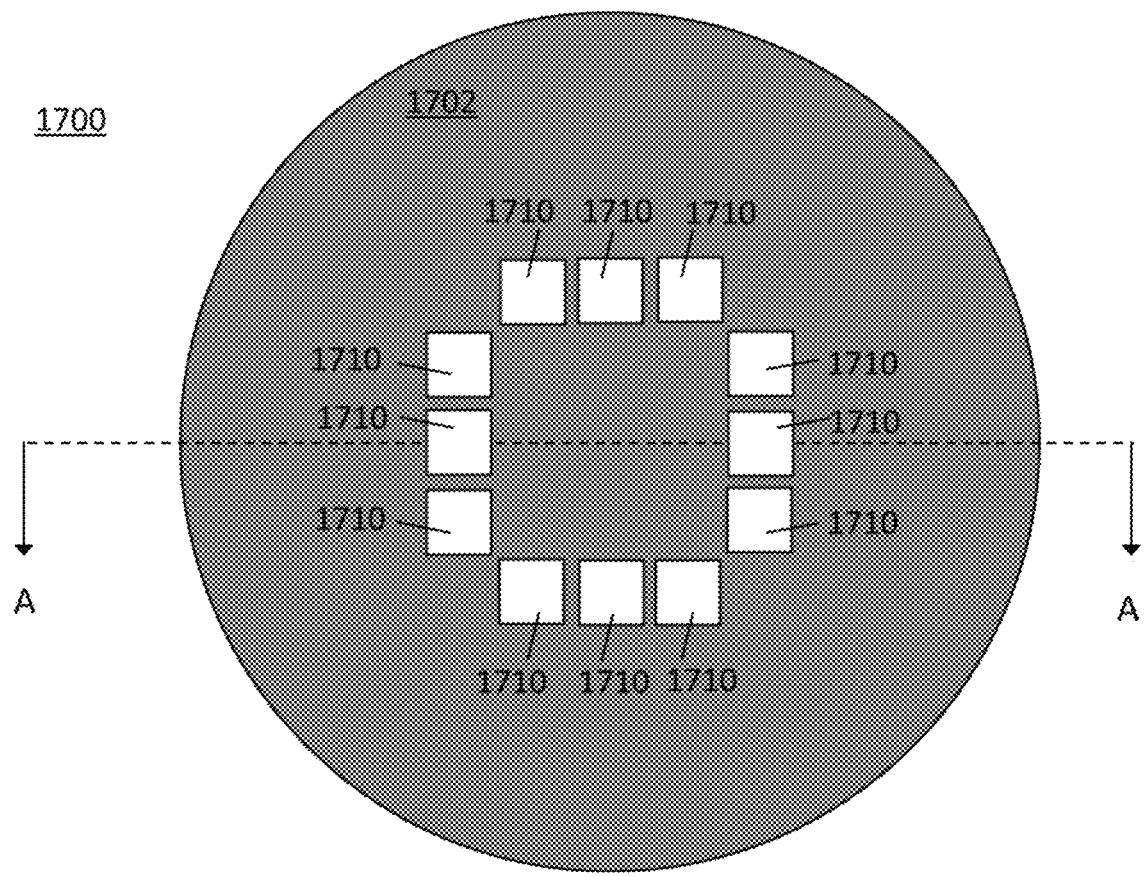
FIG. 29 is a schematic plan view of an example fourth layer as disclosed herein according to one implementation.

In some examples, the cross-sectional shape of the set of third cavities can be substantially rectangular, as shown in FIG. 29. In some examples, the central longitudinal axis of each of the set of third cavities 710 are substantially parallel to each other. In some examples, the central longitudinal axis of each of the set of third cavities 710 is substantially perpendicular to the bottom surface 704 of the fourth layer 700 (e.g., such that the cross-sectional shape is in a plane substantially parallel to the bottom surface 704 of the fourth layer 700).

The set of third cavities 710 can have an average characteristic dimension. The term "characteristic dimension," as used herein refers to the largest straight line distance between two points in the plane of the cross-sectional shape of each of the third cavities 710 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of third cavities 710, the cross-sectional shape can be substantially circular and the average characteristic dimension can refer to the average diameter. In some examples, the average characteristic dimension of the set of third cavities 710 can be substantially the same for the entire thickness. In some examples, the average characteristic dimension of the set of third cavities 710 can vary with the thickness (e.g., tapered or stepped).

The set of third cavities 710 can have an average characteristic dimension of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the set of third cavities 710 can have an average characteristic dimension of 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average characteristic dimension of the set of third cavities 710 can range from any of the minimum values described above to any of the maximum values described above. For example, the average characteristic dimension of the set of third cavities 710 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

In some examples, the average characteristic dimension of each of the set of third cavities 710 is substantially the same (e.g., the average characteristic dimension of each of the set of third cavities 710 is substantially the same as the average characteristic dimension of the set of third cavities 710). In some examples, the average characteristic dimension of the set of third cavities 710 is greater than the average characteristic dimension of the set of second cavities 312.

Figure 14:
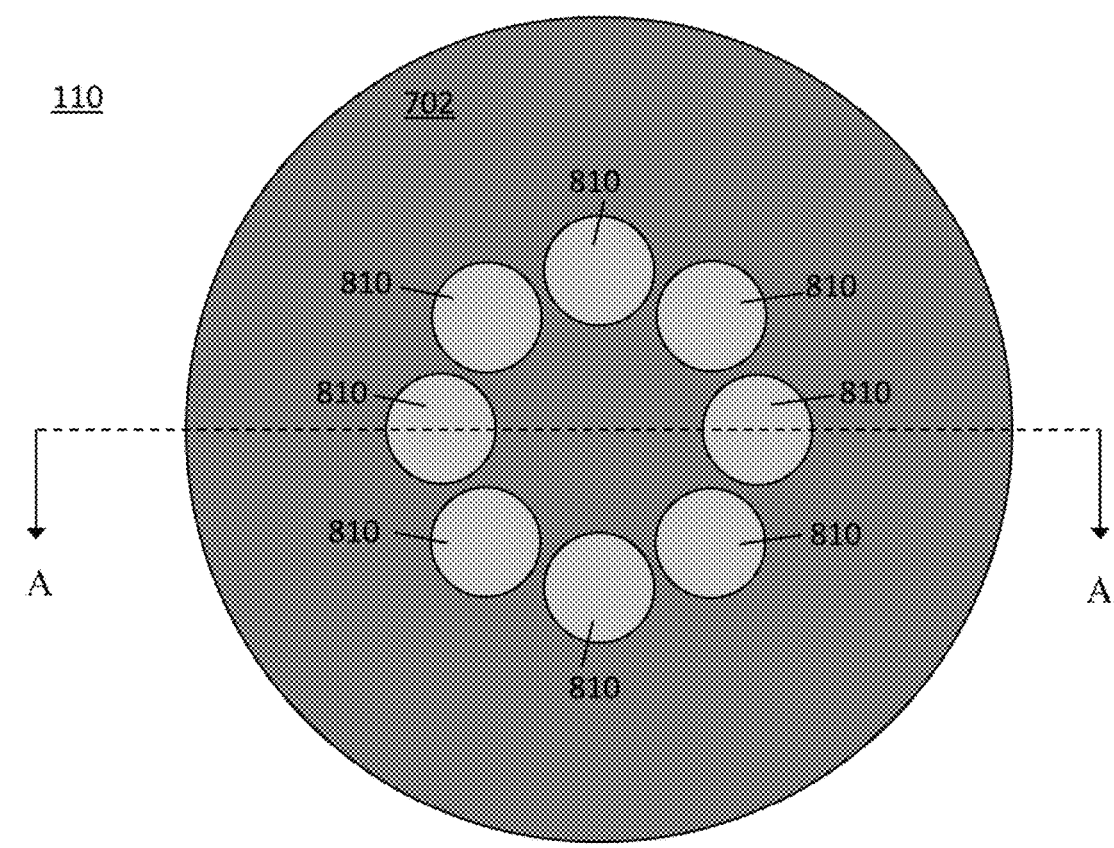
FIG. 14 is a schematic plan view of an example vapor cell preform as disclosed herein according to one implementation.
Figure 15:
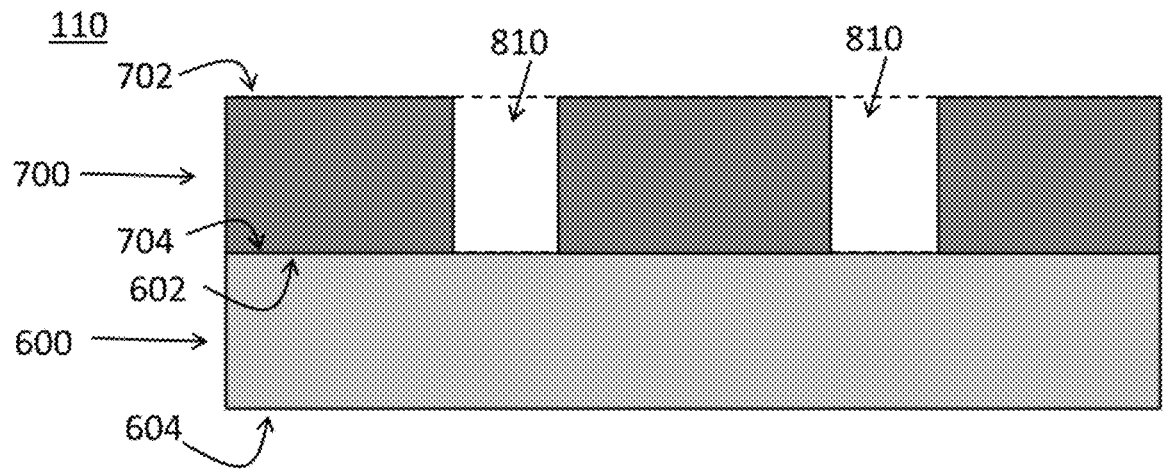
FIG. 15 is a cross-sectional plan view along line A-A in FIG. 14 of the example vapor cell preform.
Figure 16:
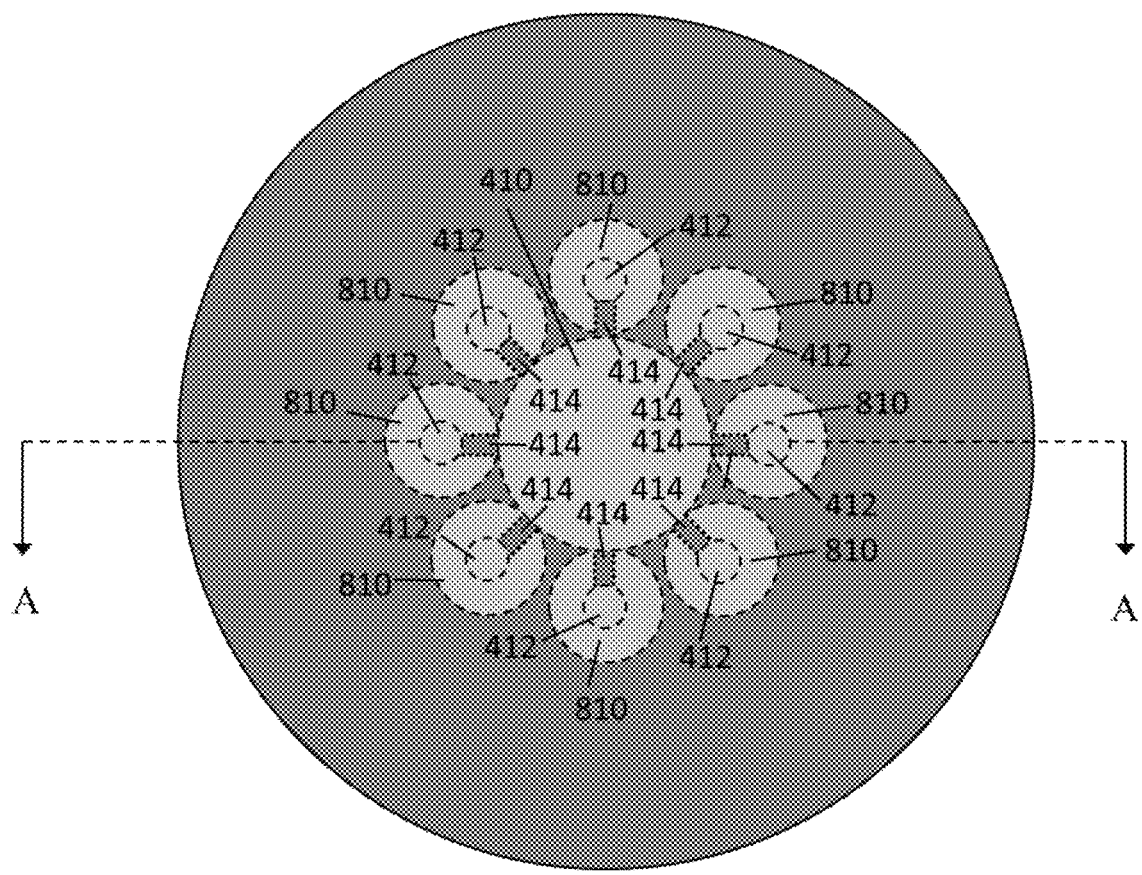
FIG. 16 is a schematic plan view of an example system comprising an example vapor cell preform and an example device as disclosed herein according to one implementation.
Figure 17:
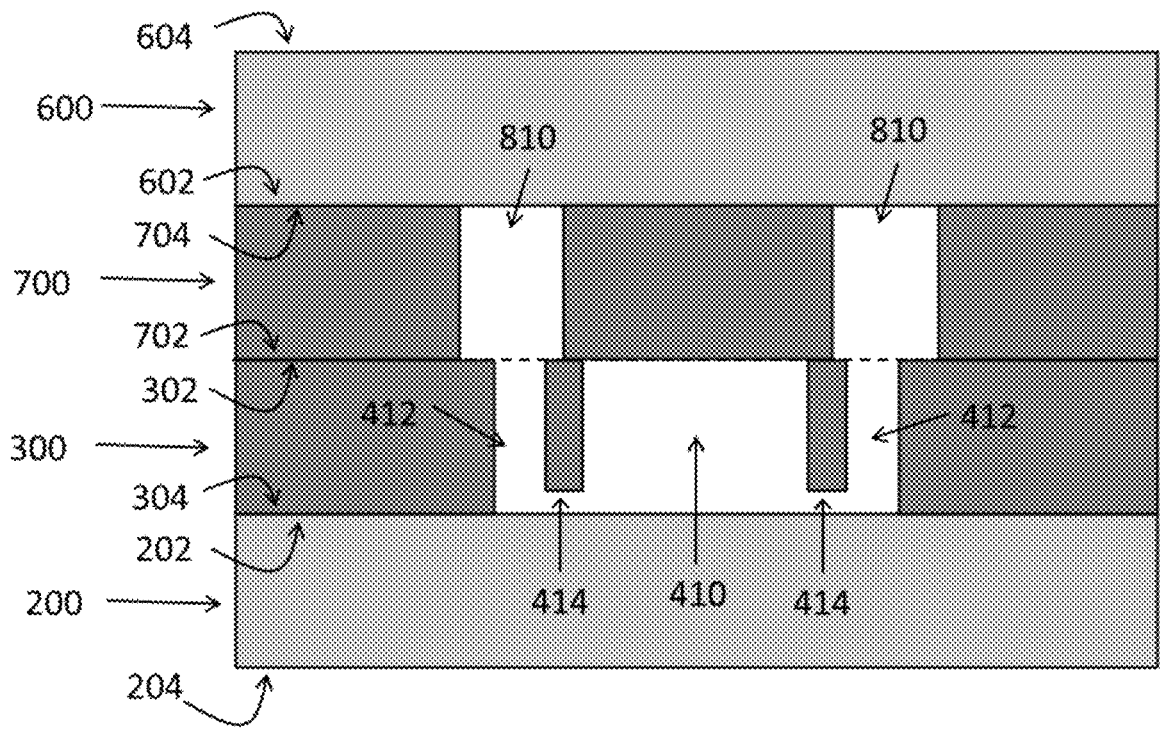
FIG. 17 is a cross-sectional plan view along line A-A in FIG. 16 of the example system.
Figure 18:
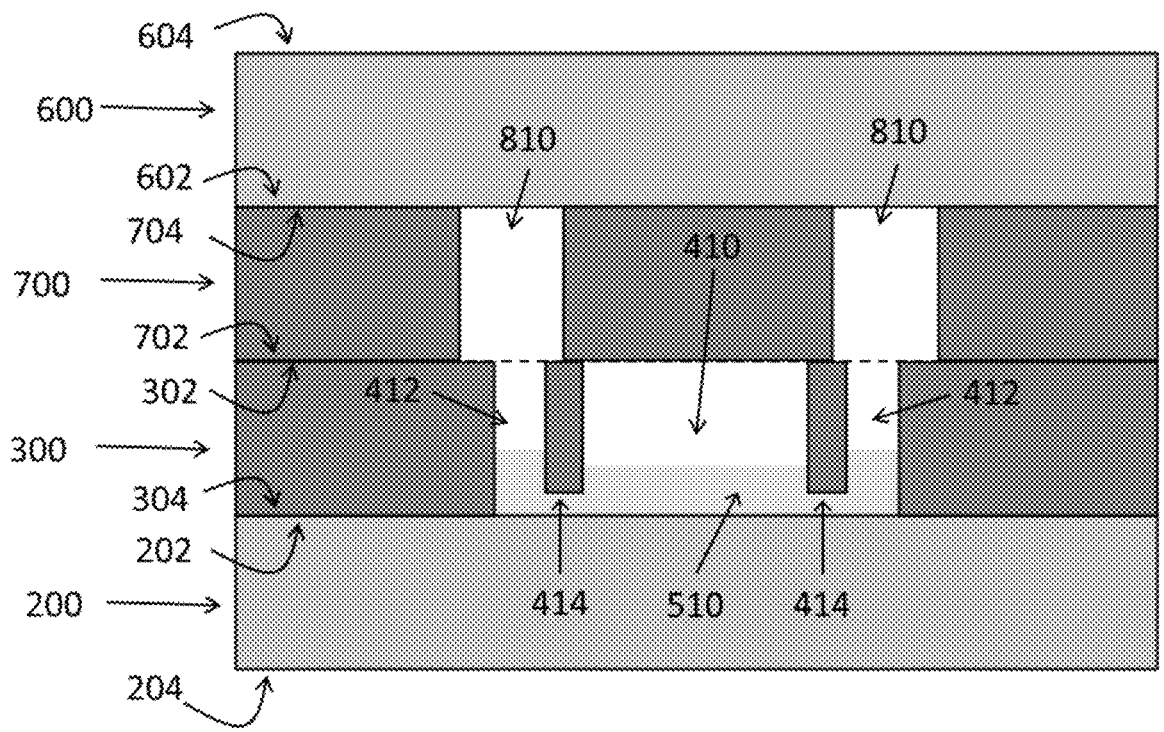
FIG. 18 is a cross-sectional plan view of the example system along line A-A in FIG. 16 wherein the example system includes a residue according to one example implementation.
Figure 19:
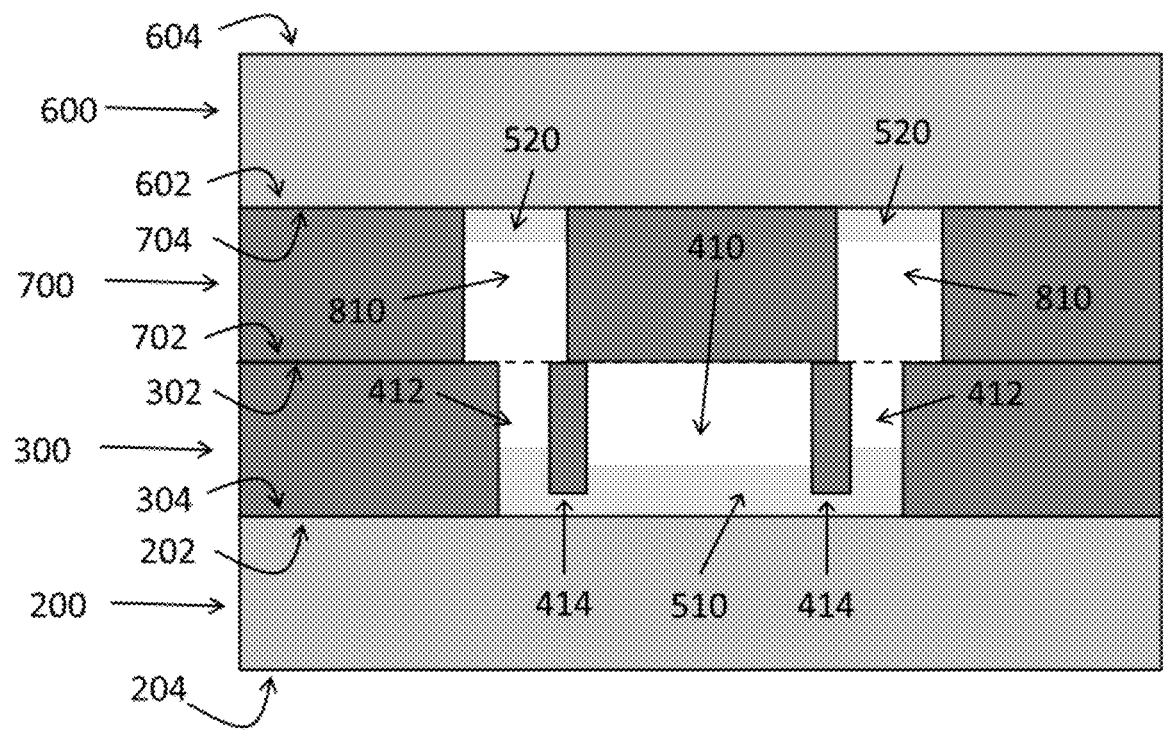
FIG. 19 is a cross-sectional plan view of the example system along line A-A in FIG. 16 wherein the example system includes an alkali metal deposited in the containers according to one example implementation.

Referring now to FIG. 14-FIG. 15, the fourth layer 700 is disposed on the third layer 600 in the vapor cell preform 110, such that the bottom surface 704 of the fourth layer 700 is disposed on the top surface 602 of the third layer 600, wherein the set of third cavities 710 together with the top surface 602 of the third layer 600 defines a set of containers 810. The set of containers 810 each have an open top (e.g., open at the top surface 702 to the fourth layer 700).

In some examples, the top surface 602 and the bottom surface 604 of the third layer 600 and the top surface 702 and the bottom surface 704 of the fourth layer 700 are all substantially parallel to each other in the vapor cell preform 110. In some examples, the fourth layer 700 is disposed on the third layer 600 in the vapor cell preform 110, such that the bottom surface 704 of the fourth layer 700 is disposed on and in physical contact with the top surface 602 of the third layer 600. In some examples, the third layer 600 is bonded to the fourth layer 700. For example, the third layer 600 can be bonded to the fourth layer 700 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

In some examples, the methods can further comprise making the set of third cavities 710 in fourth layer 700. The set of third cavities 710 can be patterned in the fourth layer 700 using standard techniques known in the art, such as lithographic patterning, etching, micromachining, deep reactive ion etching, direct laser ablation, and the like. In some examples, the methods can further comprise disposing the fourth layer 700 on the third layer 600. In some examples, the methods can further comprise bonding the fourth layer 700 and the third layer 600. For example, the fourth layer 700 can be bonded to the third layer 600 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein can, for example, further comprise, disposing the vapor cell preform 110 on the device 100 after the fluid 500 has dried to form the residue 510.

Referring now to FIG. 16-FIG. 19, also disclosed herein are systems wherein the vapor cell perform 110 is disposed on the device 100 such that the top surface 702 of the fourth layer 700 is disposed on the top surface 302 of the second layer 300 and the set of containers 810 are aligned over the set of receptacles 412. In some examples, the central longitudinal axis of each of the set of third cavities 710 are substantially parallel to the central longitudinal axis of the each of the set of second cavities 312.

The methods disclosed herein can, for example, further comprise, disposing the vapor cell preform 110 on the device 100 after the fluid 500 has dried to form the residue 510, subjecting the residue 510 to a reaction stimulus, thereby forming an alkali metal vapor, which enters the set of containers 810, thereby depositing the alkali metal 520 into the containers 810. The alkali metal vapor can comprise, for example, potassium, rubidium, cesium, or a combination thereof. The reaction stimulus can, for example, comprise heating the residue 510 at an elevated temperature, irradiating the residue 510 with ultraviolet radiation, electrolyzing the residue 510, a diffusive stimulus, or a combination thereof. In some examples, the alkali metal in the containers condenses to form a condensate.

The methods can, in some examples, further comprise separating the vapor cell preform from the device after the alkali metal has been deposited into the containers 810, optionally injecting a buffer gas (e.g., Na, Ne, Ar, $CH_4$, etc.) into the containers (the alkali metal and the buffer gas being inert to each other), and sealing the containers 810. As used herein, "sealed" and variants thereof (e.g., seal, sealing, and the like) refer to a fluid impermeable barrier the prevents communication of fluids into or out of the sealed container.

Figure 20:
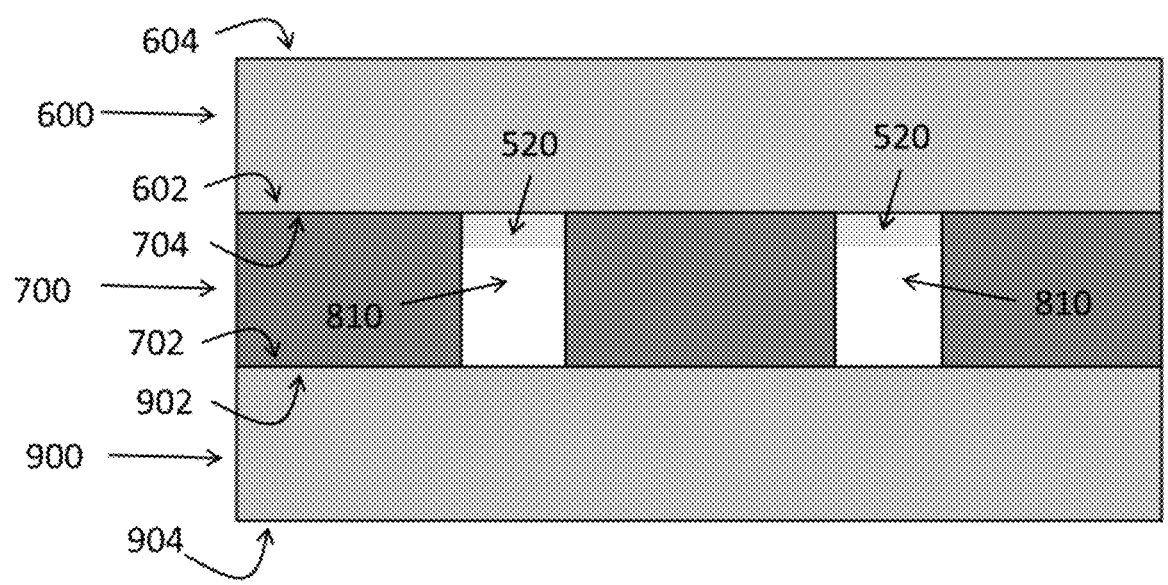
FIG. 20 is a cross-sectional plan view of the example system wherein the example system includes a substrate according to one example implementation.
Figure 21:
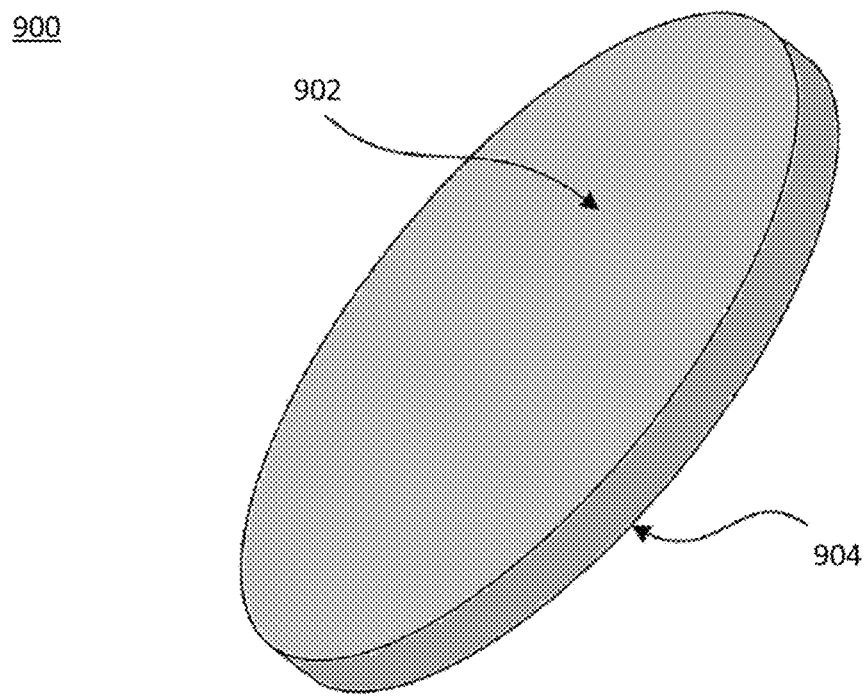
FIG. 21 is a schematic illustration of an example substrate as disclosed herein according to one implementation.
Figure 22:
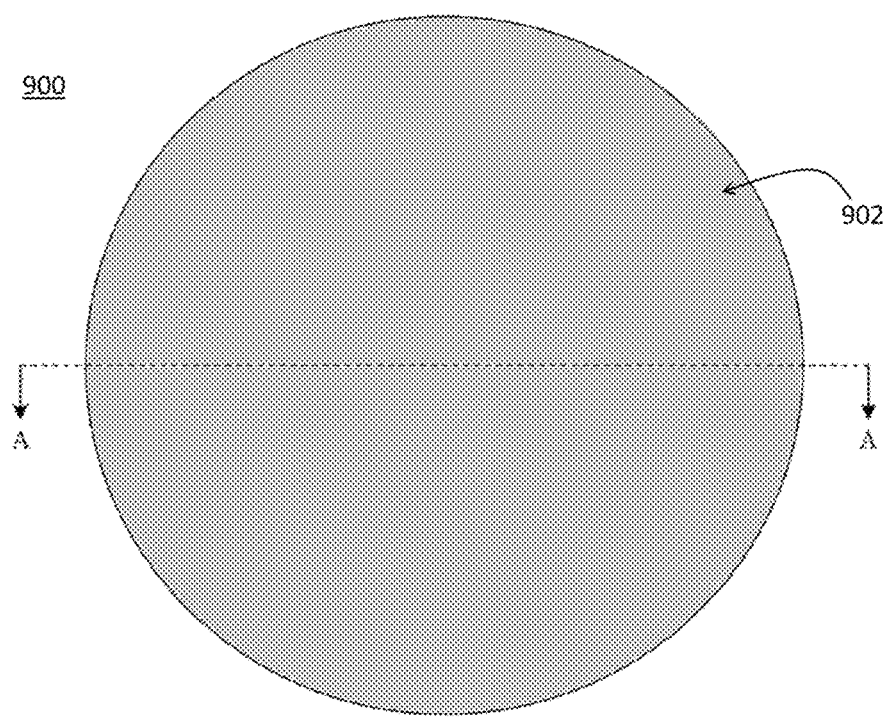
FIG. 22 is a is a schematic plan view of the example substrate shown in FIG. 21.
Figure 23:
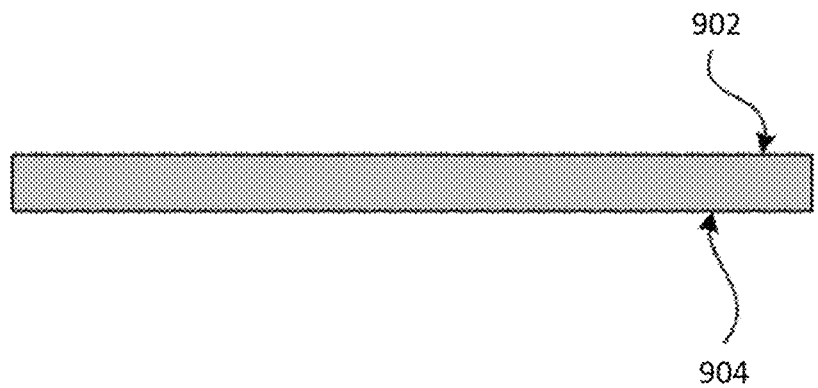
FIG. 23 is a cross-sectional plan view along line A-A in FIG. 22 of the example substrate shown in FIG. 21 and FIG. 22.

Referring now to FIG. 20, sealing the containers 810 can, for example, comprise disposing the vapor cell preform on a substrate 900 after the alkali metal has been deposited into the containers 810, and optionally after injecting a buffer gas into the containers 810, such that the top surface 702 of the fourth layer 700 is disposed on the substrate 900, thereby closing the open tops of the set of containers 810. In some examples, the methods can further comprise bonding the fourth layer 700 to the substrate 900, thereby sealing the alkali metal (and optional buffer gas) in the containers. For example, the fourth layer 700 can be bonded to the substrate 900 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

Referring now to FIG. 21-FIG. 24, the substrate 900 can have a top surface 902 and a bottom surface 904 opposite and spaced apart from the top surface 902. In some examples, the top surface 902 and the bottom surface 904 of the substrate 900 are substantially parallel to each other. The substrate 900 can comprise any material consistent with the methods, devices, and systems disclosed herein. In some examples, the substrate 900 can comprise a dielectric, a semiconductor, a ceramic, a transparent conducing oxide, a polymer, a metal, or a combination thereof. Examples of substrates 900 include, but are not limited to, glass, quartz, Pyrex, fused silica, silicon dioxide, silicon nitride, sapphire, a polymer (e.g., polycarbonate), and combinations thereof. In some examples, the substrate 900 can be transparent. As used herein, a "transparent substrate 900" is meant to include any substrate 900 that is transparent at the wavelength or wavelength region of interest. In some examples, the substrate 900 comprises glass (e.g., aluminosilicate glass, borosilicate glass, etc.).

The substrate 900 has an average thickness, the average thickness being the average dimension from the top surface 902 to the bottom surface 904. The average thickness of the substrate 900 can, for example be 1 micrometer (micron, $\mu m$) or more (e.g., 2 $\mu m$ or more, 3 $\mu m$ or more, 4 $\mu m$ or more, 5 $\mu m$ or more, 6 $\mu m$ or more, 7 $\mu m$ or more, 8 $\mu m$ or more, 9 $\mu m$ or more, 10 $\mu m$ or more, 15 $\mu m$ or more, 20 $\mu m$ or more, 25 $\mu m$ or more, 30 $\mu m$ or more, 35 $\mu m$ or more, 40 $\mu m$ or more, 45 $\mu m$ or more, 50 $\mu m$ or more, 60 $\mu m$ or more, 70 $\mu m$ or more, 80 $\mu m$ or more, 90 $\mu m$ or more, 100 $\mu m$ or more, 125 $\mu m$ or more, 150 $\mu m$ or more, 175 $\mu m$ or more, 200 $\mu m$ or more, 225 $\mu m$ or more, 250 $\mu m$ or more, 300 $\mu m$ or more, 350 $\mu m$ or more, 400 $\mu m$ or more, 450 $\mu m$ or more, 500 $\mu m$ or more, 600 $\mu m$ or more, 700 $\mu m$ or more, 800 $\mu m$ or more, 900 $\mu m$ or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the substrate 900 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer ($\mu m$) or less, 800 $\mu m$ or less, 700 $\mu m$ or less, 600 $\mu m$ or less, 500 $\mu m$ or less, 450 $\mu m$ or less, 400 $\mu m$ or less, 350 $\mu m$ or less, 300 $\mu m$ or less, 250 $\mu m$ or less, 225 $\mu m$ or less, 200 $\mu m$ or less, 175 $\mu m$ or less, 150 $\mu m$ or less, 125 $\mu m$ or less, 100 $\mu m$ or less, 90 $\mu m$ or less, 80 $\mu m$ or less, 70 $\mu m$ or less, 60 $\mu m$ or less, 50 $\mu m$ or less, 45 $\mu m$ or less, 40 $\mu m$ or less, 35 $\mu m$ or less, 30 $\mu m$ or less, 25 $\mu m$ or less, 20 $\mu m$ or less, 15 $\mu m$ or less, 10 $\mu m$ or less, 9 $\mu m$ or less, 8 $\mu m$ or less, 7 $\mu m$ or less, 6 $\mu m$ or less, 5 $\mu m$ or less, 4 $\mu m$ or less, 3 $\mu m$ or less, or 2 $\mu m$ or less). The average thickness of the substrate 900 can range from any of the minimum values described above to any of the maximum values described above. For example, the average thickness of the substrate 900 can be from 1 micrometer ($\mu m$) to 10 millimeters (mm) (e.g., from 1 $\mu m$ to 100 $\mu m$, from 100 $\mu m$ to 10 mm, from 1 $\mu m$ to 10 $\mu m$, from 10 $\mu m$ to 100 $\mu m$, from 100 $\mu m$ to 1 mm, from 1 mm to 10 mm, from 1 $\mu m$ to 1 mm, from 10 $\mu m$ to 10 mm, or from 10 $\mu m$ to 1 mm).

The top surface 902 and the bottom surface 904 of the substrate 900 can, independently, be any shape. In some examples, the top surface 902 and the bottom surface 904 of the substrate 900 can, independently, be substantially circular, ovate, ovoid, elliptic, triangular, rectangular, polygonal, etc. In some examples, the top surface 902 and the bottom surface 904 of the substrate 900 can be substantially the same shape. In some examples, the top surface 902 and the bottom surface 904 of the substrate 900 can be substantially circular.

The substrate 900 has an average lateral dimension (e.g., diameter when the substrate 900 is a circular wafer) of 1 micrometer (micron, $\mu m$) or more (e.g., 2 $\mu m$ or more, 3 $\mu m$ or more, 4 $\mu m$ or more, 5 $\mu m$ or more, 6 $\mu m$ or more, 7 $\mu m$ or more, 8 $\mu m$ or more, 9 $\mu m$ or more, 10 $\mu m$ or more, 15 $\mu m$ or more, 20 $\mu m$ or more, 25 $\mu m$ or more, 30 $\mu m$ or more, 35 $\mu m$ or more, 40 $\mu m$ or more, 45 $\mu m$ or more, 50 $\mu m$ or more, 60 $\mu m$ or more, 70 $\mu m$ or more, 80 $\mu m$ or more, 90 $\mu m$ or more, 100 $\mu m$ or more, 125 $\mu m$ or more, 150 $\mu m$ or more, 175 $\mu m$ or more, 200 $\mu m$ or more, 225 $\mu m$ or more, 250 $\mu m$ or more, 300 $\mu m$ or more, 350 $\mu m$ or more, 400 $\mu m$ or more, 450 $\mu m$ or more, 500 $\mu m$ or more, 600 $\mu m$ or more, 700 $\mu m$ or more, 800 $\mu m$ or more, 900 $\mu m$ or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the substrate 900 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer ($\mu m$) or less, 800 $\mu m$ or less, 700 $\mu m$ or less, 600 $\mu m$ or less, 500 $\mu m$ or less, 450 $\mu m$ or less, 400 $\mu m$ or less, 350 $\mu m$ or less, 300 $\mu m$ or less, 250 $\mu m$ or less, 225 $\mu m$ or less, 200 $\mu m$ or less, 175 $\mu m$ or less, 150 $\mu m$ or less, 125 $\mu m$ or less, 100 $\mu m$ or less, 90 $\mu m$ or less, 80 $\mu m$ or less, 70 $\mu m$ or less, 60 $\mu m$ or less, 50 $\mu m$ or less, 45 $\mu m$ or less, 40 $\mu m$ or less, 35 $\mu m$ or less, 30 $\mu m$ or less, 25 $\mu m$ or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average lateral dimension of the substrate 900 can range from any of the minimum values described above to any of the maximum values described above. For example, the average lateral dimension of the substrate 900 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm).

In some examples, the average lateral dimension of the substrate 900 and the average lateral dimension of the fourth layer 700 are substantially equal. In some examples, the top surface 902 and the bottom surface 904 of the substrate 900 and the top surface 702 and the bottom surface 704 of the fourth layer 700 are all substantially parallel to each other. In some examples, the fourth layer 700 is disposed on the substrate 900, such that the top surface 702 of the fourth layer 700 is disposed on and in physical contact with the top surface 902 of the substrate 900.

In some examples, the methods described herein can be used to form a plurality of alkali metal vapor cells on a single wafer simultaneously in parallel (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more).

In some examples, the methods can further comprise separating one or more of the sealed containers (e.g., one or more of the alkali metal vapor cells) from the others without disrupting the seal. In some examples, the methods can further comprise separating each of the sealed containers (e.g., each of the alkali metal vapor cells) from one another without disrupting the seal. The sealed containers can be separated using methods known in the art, such as, for example, dicing, laser cutting, abrasive machining, chemical etching, micromachining, etc.

One or more of the method steps can, for example, be carried out either under vacuum or in a buffer-gas (e.g., anaerobic) environment, consistent with the requirements for application of the sealed containers in an atomic clock or magnetometer.

Also disclosed herein are devices comprising a first layer 1200 having a top surface 1202 and a bottom surface 1204 opposite and spaced apart from the top surface 1202. In some examples, the top surface 1202 and the bottom surface 1204 of the first layer 1200 are substantially parallel to each other.

The first layer 1200 can comprise any material consistent with the methods, devices, and systems disclosed herein. In some examples, the first layer 1200 can comprise a dielectric, a semiconductor, a ceramic, a transparent conducting oxide, a polymer, a metal, or a combination thereof. Examples of first layers 1200 include, but are not limited to, glass, quartz, Pyrex, fused silica, silicon dioxide, silicon nitride, sapphire, a polymer (e.g., polycarbonate), and combinations thereof. In some examples, the first layer 1200 can be transparent. As used herein, a "transparent layer" is meant to include any layer that is transparent at the wavelength or wavelength region of interest. In some examples, the first layer 1200 comprises glass (e.g., aluminosilicate glass, borosilicate glass, etc.).

The first layer 1200 has an average thickness, the average thickness being the average dimension from the top surface 1202 to the bottom surface 1204. The average thickness of the first layer 1200 can, for example be 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the first layer 1200 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average thickness of the first layer 1200 can range from any of the minimum values described above to any of the maximum values described above. For example, the average thickness of the first layer 1200 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 1202 and the bottom surface 1204 of the first layer 1200 can, independently, be any shape. In some examples, the top surface 1202 and the bottom surface 1204 of the first layer 1200 can, independently, be substantially circular, ovate, ovoid, elliptic, triangular, rectangular, polygonal, etc. In some examples, the top surface 1202 and the bottom surface 1204 of the first layer 1200 can be substantially the same shape. In some examples, the top surface 202 and the bottom surface 1204 of the first layer 1200 can be substantially circular.

The first layer 1200 has an average lateral dimension (e.g., diameter when the first layer 1200 is a circular wafer) of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the first layer 1200 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average lateral dimension of the first layer 1200 can range from any of the minimum values described above to any of the maximum values described above. For example, the average lateral dimension of the first layer 1200 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm).

The devices further comprise a second layer 1300 having a top surface 1302 and a bottom surface 1304 opposite and spaced apart from the top surface. In some examples, the top surface 1302 and the bottom surface 1304 of the second layer 1300 are substantially parallel to each other.

The second layer 1300 can comprise any material consistent with the methods, devices, and systems disclosed herein. In some examples, the second layer 1300 can comprise a dielectric, a semiconductor, a ceramic, a transparent conducting oxide, a polymer, a metal, or a combination thereof. Examples of second layers 1300 include, but are not limited to, silicon, glass (e.g. aluminum coated glass), sapphire, a ceramic, and combinations thereof. In some examples, the second layer 1300 comprises silicon. In some examples, the second layer 1300 is hydrophilic.

The second layer 1300 has an average thickness, the average thickness being the average dimension from the top surface 1302 to the bottom surface 1304. The average thickness of the second layer 1300 can, for example be 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the second layer 1300 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average thickness of the second layer 1300 can range from any of the maximum values described above to any of the maximum values described above. For example, the average thickness of the second layer 1300 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 1302 and the bottom surface 1304 of the second layer 1300 can, independently, be any shape. In some examples, the top surface 1302 and the bottom surface 1304 of the second layer 1300 can, independently, be substantially circular, ovate, ovoid, elliptic, triangular, rectangular, polygonal, etc. In some examples, the top surface 302 and the bottom surface 1304 of the second layer 1300 can be substantially the same shape. In some examples, the top surface 1302 and the bottom surface 1304 of the second layer 1300 can be substantially circular.

In some examples, the top surface 1202 and the bottom surface 1204 of the first layer 1200 and the top surface 1302 and the bottom surface 1304 of the second layer 1300 are all substantially circular.

The second layer 1300 has an average lateral dimension (e.g., diameter when the second layer 1300 is a circular wafer) of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the second layer 1300 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average lateral dimension of the second layer 1300 can range from any of the minimum values described above to any of the maximum values described above. For example, the average lateral dimension of the second layer 1300 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm). In some examples, the average lateral dimension of the second layer 1300 and the average lateral dimension of the first layer 1200 are substantially equal.

Figure 25:
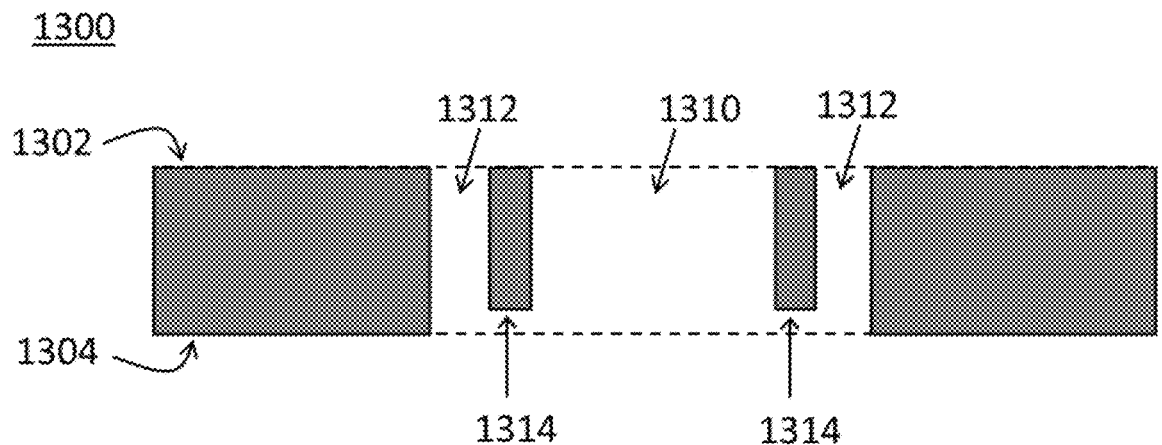
FIG. 25 is a cross-sectional plan view along line A-A in FIG. 24 of the example second layer.

Referring now to FIG. 24-FIG. 25, the second layer 1300 comprises a first cavity 1310, a set of second cavities 1312, and a set of grooves 1314; wherein the first cavity 1310 perforates the second layer 1300 from the top surface 1302 to the bottom surface 1304; wherein each of the second cavities 1312 perforates the second layer 1300 from the top surface 1302 to the bottom surface 1304; wherein each of the grooves 1314 extends from the first cavity 1310 to one of the second cavities 1312 on the bottom surface 1304.

As used herein, "a first cavity 1310" and "the first cavity 1310" are meant to include any number of first cavities 1310 in any arrangement. Thus, for example, "a first cavity 310" includes one or more first cavities 1310 (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the first cavity 1310 can comprise a plurality of first cavities 1310.

The first cavity 1310 has a central longitudinal axis and a cross-sectional shape in a plane perpendicular to the central longitudinal axis of said cavity 1310, wherein the cross-sectional shape can be any shape, such as a regular shape, an irregular shape, an isotropic shape, or an anisotropic shape. In some examples, the cross-sectional shape of the first cavity 1310 can be substantially circular, ovate, ovoid, elliptic, triangular, rectangular, polygonal, etc. In some examples, the cross-sectional shape of the first cavity can be substantially circular, as shown in FIG. 4. In some examples, the cross-sectional shape of the first cavity 1310 can be substantially rectangular, as shown in FIG. 24. In some examples, the central longitudinal axis of the first cavity 1310 is substantially perpendicular to the bottom surface 1304 of the second layer 1300 (e.g., such that the cross-sectional shape is in a plane substantially parallel to the bottom surface 1304 of the second layer 1300).

The first cavity 1310 can have an average characteristic dimension. The term "characteristic dimension," as used herein refers to the largest straight line distance between two points in the plane of the cross-sectional shape of the first cavity 1310 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension. For example, for a cylindrical first cavity 1310, the cross-sectional shape can be substantially circular and the average characteristic dimension can refer to the diameter. In some examples, the average characteristic dimension of the first cavity 1310 can be substantially the same for the entire thickness. In some examples, the average characteristic dimension of the first cavity 1310 can vary with the thickness (e.g., tapered or stepped).

The first cavity 1310 can have an average characteristic dimension of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the first cavity 1310 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average characteristic dimension of the first cavity 1310 can range from any of the minimum values described above to any of the maximum values described above. For example, the average characteristic dimension of the first cavity 1310 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, from 10 µm to 1 mm, from 100 µm to 10 mm, from or 100 µm to 1 mm).

As used herein, "a set of second cavities 1312" and "the set of second cavities 1312" are meant to include any number of second cavities 1312 in any arrangement. Thus, for example, "a set of second cavities 1312" includes one or more second cavities 1312 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of second cavities 1312 can comprise a plurality of second cavities 1312, wherein each of the second cavities 1312 is located adjacent the first cavity 1310. In some examples, the set of second cavities 1312 comprises a plurality of second cavities 1312, wherein each of the second cavities 1312 is located adjacent the first cavity 1310 in an ordered array.

Each of the set of second cavities 1312 has a central longitudinal axis and a cross-sectional shape in a plane perpendicular to the central longitudinal axis of said cavity 1312, wherein the cross-sectional shape can be any shape, such as a regular shape, an irregular shape, an isotropic shape, or an anisotropic shape. In some examples, the cross-sectional shape of each of the set of second cavities 1312 can be substantially circular, ovate, ovoid, elliptic, triangular, rectangular, polygonal, etc. In some examples, the cross-sectional shape of each of the set of second cavities 1312 is substantially the same. In some examples, the cross-sectional shape of the set of second cavities can be substantially circular, as shown in FIG. 4. In some examples, the cross-sectional shape of the set of second cavities 1312 can be substantially rectangular, as shown in FIG. 24. In some examples, the cross-sectional shape of each of the second cavities 1312 is the same. In some examples, the cross-sectional shape of the set of second cavities 1312 can be the same as the cross-sectional shape of the first cavity 1310. In some examples, the cross-sectional shape of the set of second cavities 1312 can be different than the cross-sectional shape of the first cavity 1310.

In some examples, the central longitudinal axis of each of the set of second cavities 1312 are substantially parallel to each other. In some examples, the central longitudinal axis of each of the set of second cavities 1312 are substantially parallel to the central longitudinal axis of the first cavity 1310. In some examples, the central longitudinal axis of each of the set of second cavities 1312 is substantially perpendicular to the bottom surface 1304 of the second layer 1300 (e.g., such that the cross-sectional shape is in a plane substantially parallel to the bottom surface 1304 of the second layer 1300).

The set of second cavities 1312 can have an average characteristic dimension. The term "characteristic dimension," as used herein refers to the largest straight line distance between two points in the plane of the cross-sectional shape of each of the second cavities 1312 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of second cavities 1312, the cross-sectional shape can be substantially circular and the average characteristic dimension can refer to the average diameter. In some examples, the average characteristic dimension of the set of second cavities 1312 can be substantially the same for the entire thickness. In some examples, the average characteristic dimension of the set of second cavities 1312 can vary with the thickness (e.g., tapered or stepped).

The set of second cavities 1312 can have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the set of second cavities 1312 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the set of second cavities 1312 can range from any of the minimum values described above to any of the maximum values described above. For example, the average characteristic dimension of the set of second cavities 1312 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm)

In some examples, the average characteristic dimension of each of the set of second cavities 1312 is substantially the same (e.g., the average characteristic dimension of each of the set of second cavities 1312 is substantially the same as the average characteristic dimension of the set of second cavities 1312). In some examples, the average characteristic dimension of the set of second cavities 1312 is less than or equal to the average characteristic dimension of the first cavity 1310.

As used herein, "a set of grooves 1314" and "the set of grooves 1314" are meant to include any number of grooves 1314 in any arrangement. Thus, for example, "a set of grooves 1314" includes one or more grooves 1314 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of grooves 1314 can comprise a plurality of grooves 1314. In some examples, the number of grooves 1314 in the set of grooves 1314 is equal to the number of second cavities 1312 in the set of second cavities 1312.

Figure 26:
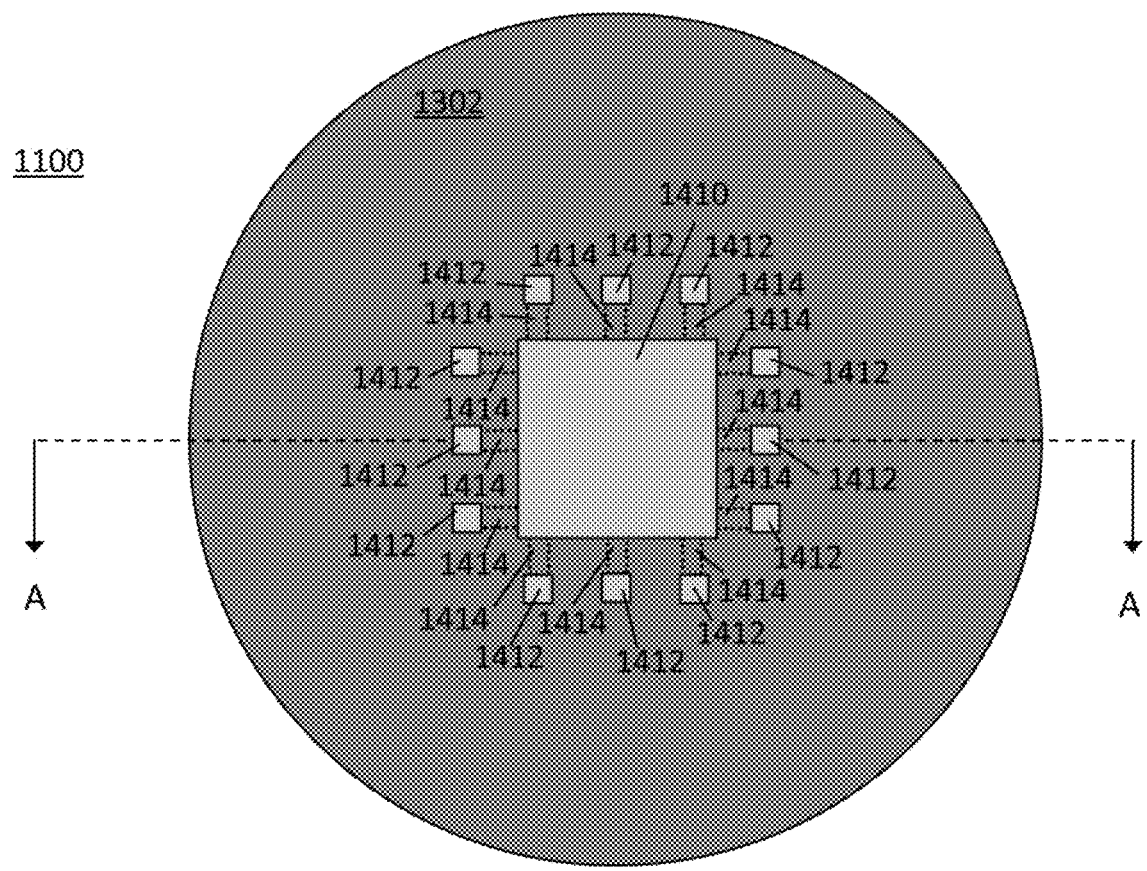
FIG. 26 is a schematic plan view of an example device as disclosed herein according to one implementation.
Figure 27:
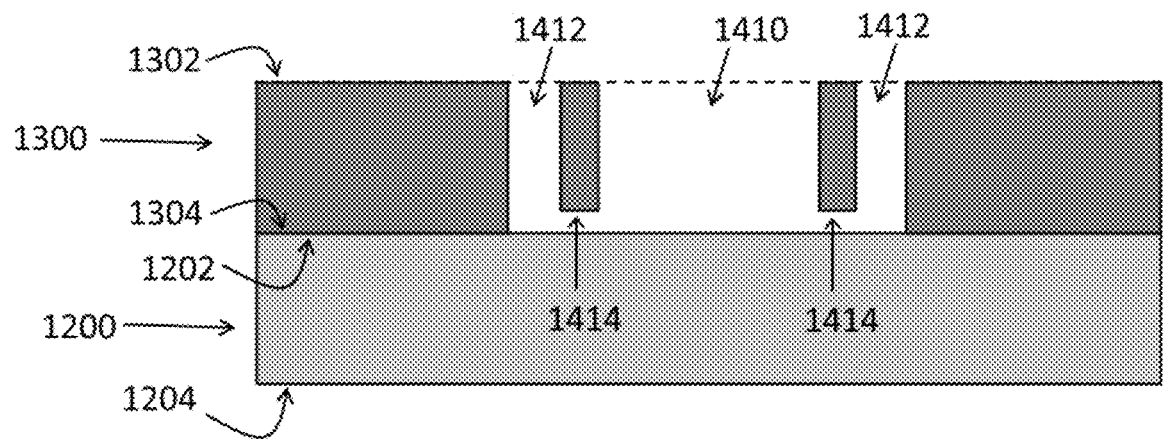
FIG. 27 is a cross-sectional plan view along line A-A in FIG. 26 of the example device.
Figure 28:
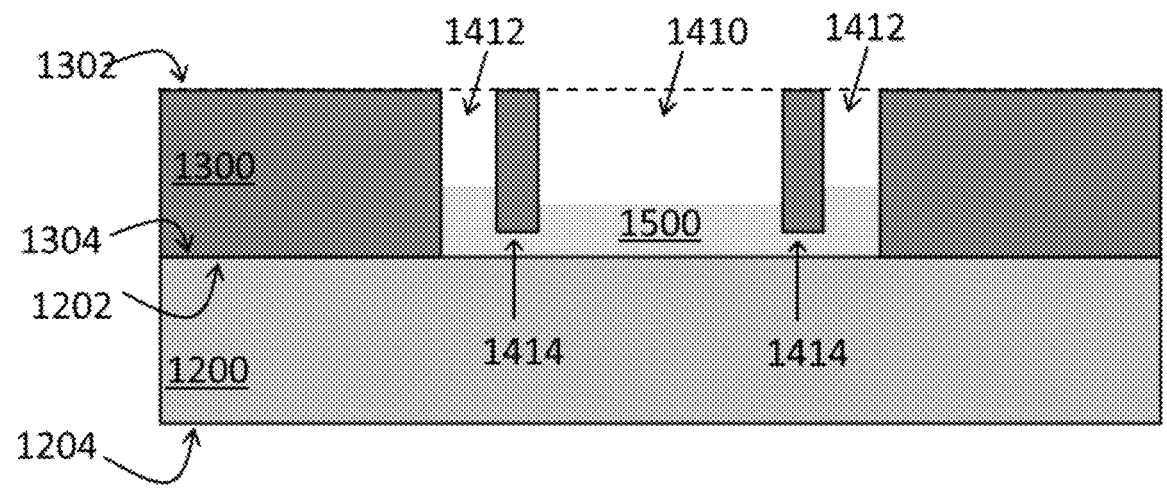
FIG. 28 is a cross-sectional plan view of the example device along line A-A in FIG. 26 wherein the example device includes a fluid according to one example implementation.

Referring now to FIG. 26-FIG. 28, the second layer 1300 is disposed on the first layer 1200 in the devices 1100, such that the bottom surface 1304 of the second layer 1300 is disposed on the top surface 1202 of the first layer 1200, such that: the first cavity 1310 together with the top surface 1202 of the first layer 1200 defines a reservoir 1410; the set of second cavities 1312 together with the top surface 1202 of the first layer 1200 defines a set of receptacles 1412; and the set of grooves 1314 together with the top surface 1202 of the first layer 1200 define a set of conduits 1314 fluidly connecting each of the receptacles 1412 to the reservoir 1410; such that, when a fluid 1500 is placed in the reservoir 1410, the fluid flows to each of the receptacles 1412 via capillary action, such that the fluid at least partially fills each of the receptacles 1412. The reservoir 1410 and the set of receptacles 1412 each have an open top (e.g., open at the top surface 1302 of the second layer 1300). In some examples, the top surface 1202 and the bottom surface 1204 of the first layer 1200 and the top surface 1302 and the bottom surface 1304 of the second layer 1300 are all substantially parallel to each other in the device 1100. In some examples, the second layer 1300 is disposed on the first layer 1200 in the devices 1100, such that the bottom surface 1304 of the second layer 1300 is disposed on and in physical contact with the top surface 1202 of the first layer 1200. In some examples, the first layer 1200 is bonded to the second layer 1300. For example, the first layer 1200 can be bonded to the second layer 1300 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein comprise, for example, depositing the fluid 1500 into the reservoir 1410, such that the fluid flows to each of the receptacles 1412 via capillary action and the fluid at least partially fills each of the receptacles 1412. The fluid can, for example, comprise an alkali metal precursor and a solvent. The alkali metal precursor can, for example, comprise any compound or composition capable of reacting to form a free alkali metal. The alkali metal precursor can, for example, comprise an alkali metal compound, wherein the alkali metal can include an alkali atom, an alkaline earth atom, a lanthanide, an actinide, or combinations thereof. In some examples, the alkali metal precursor can, for example, comprise an alkali metal compound, wherein the alkali metal can include potassium (K), rubidium (Rb), cesium (Cs), or a combination thereof. The alkali metal precursor can, for example, comprise an alkali halide (e.g., an alkali chloride), an azide, a chromate, a molibdate, or a combination thereof. Exemplary alkali halides include RbCl, CsCl, KCl, RbBr, CsBr, KBr, and the like. Exemplary alkali azides include $RbN_3$, $CsN_3$, $KN_3$, and the like. In some examples, the alkali metal precursor can include $RbN_3$, $CsN_3$, $KN_3$ that can produce alkali metal in response to being subjected to ultraviolet light. Alkali halides can, for example, be reacted with $BaN_6$ or Ca to produce alkali metal. In some examples, alkali metal precursor includes $BaN_6$ and an alkali chloride, which can react to form BaCl, $N_2$, and alkali metal in response to heating. In some examples, the fluid can further comprise a reducing agent such as barium azide, calcium, zirconium, or aluminum.

Examples of suitable solvents include, but are not limited to, tetrahydrofuran (THF), N-methyl-2-pyrrolidone (NMP), dimethylformamide (DMF), N-methylformamide, formamide, dimethyl sulfoxide (DMSO), dimethylacetamide, dichloromethane ($CH_2Cl_2$), ethylene glycol, polyethylene glycol, glycerol, alkane diol, tetraglyme, propylene carbonate, diglyme, dimethoxyethane, ethanol, methanol, propanol, isopropanol, water, acetonitrile, chloroform, acetone, hexane, heptane, toluene, xylene, methyl acetate, ethyl acetate, and combinations thereof. In some examples, the solvent comprises water such that the fluid comprises an aqueous solution comprising the alkali metal precursor.

The methods can, for example, comprise drying the fluid, for example by evaporating the solvent, thereby forming a residue 1520 comprising the alkali metal precursor as a solid. Wherein, upon drying the liquid, the residue comprising the alkali metal precursor as a solid is stable (e.g., stable at room temperature).

In some examples, the methods can further comprise making the first cavity 1310, the set of second cavities 1312, and the set of grooves 1314 in second layer 1300. The first cavity 1310, the set of second cavities 1312, and the set of grooves 1314 can be patterned in the second layer 1300 using standard techniques known in the art, such as lithographic patterning, etching, micromachining, deep reactive ion etching, direct laser ablation, and the like. In some examples, the methods can further comprise disposing the second layer 1300 on the first layer 1200 to form the device 1100. In some examples, the methods can further comprise bonding the first layer 1200 and the second layer 1300. For example, the first layer 1200 can be bonded to the second layer 1300 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

Also disclosed herein are vapor cell preforms. The vapor cell preforms can comprise a third layer 1600 having a top surface 1602 and a bottom surface 1604 opposite and spaced apart from the top surface 1602. In some examples, the top surface 1602 and the bottom surface 1604 of the third layer 1600 are substantially parallel to each other.

The third layer 1600 can comprise any material consistent with the methods, devices, and systems disclosed herein. In some examples, the third layer 1600 can comprise a dielectric, a semiconductor, a ceramic, a transparent conducing oxide, a polymer, a metal, or a combination thereof. Examples of third layers 1600 include, but are not limited to, glass, quartz, Pyrex, fused silica, silicon dioxide, silicon nitride, sapphire, a polymer (e.g., polycarbonate), and combinations thereof. In some examples, the third layer 1600 can be transparent. As used herein, a "transparent layer" is meant to include any layer that is transparent at the wavelength or wavelength region of interest. In some examples, the third layer 1600 comprises glass (e.g., aluminosilicate glass, borosilicate glass, etc.).

The third layer 1600 has an average thickness, the average thickness being the average dimension from the top surface 1602 to the bottom surface 1604. The average thickness of the third layer 1600 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the third layer 1600 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the third layer 1600 can range from any of the minimum values described above to any of the maximum values described above. For example, the average thickness of the third layer 1600 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 1602 and the bottom surface 1604 of the third layer 1600 can, independently, be any shape. In some examples, the top surface 1602 and the bottom surface 1604 of the third layer 1600 can, independently, be substantially circular, ovate, ovoid, elliptic, triangular, rectangular, polygonal, etc. In some examples, the top surface 1602 and the bottom surface 1604 of the third layer 1600 can be substantially the same shape. In some examples, the top surface 1602 and the bottom surface 1604 of the third layer 1600 can be substantially circular.

The third layer 1600 has an average lateral dimension (e.g., diameter when the third layer 1600 is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the third layer 1600 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the third layer 1600 can range from any of the minimum values described above to any of the maximum values described above. For example, the average lateral dimension of the third layer 1600 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

The vapor cell preforms further comprise a fourth layer 1700 having a top surface 1702 and a bottom surface 1704 opposite and spaced apart from the top surface 1702. In some examples, the top surface 1702 and the bottom surface 1704 are substantially parallel to each other.

The fourth layer 1700 can comprise any material consistent with the methods, devices, and systems disclosed herein. In some examples, the fourth layer 1700 can comprise a dielectric, a semiconductor, a ceramic, a transparent conducting oxide, a polymer, a metal, or a combination thereof. Examples of fourth layers 1700 include, but are not limited to, silicon, glass (e.g. aluminum coated glass), sapphire, a ceramic, and combinations thereof. In some examples, the fourth layer 1700 comprises silicon.

The fourth layer 1700 has an average thickness, the average thickness being the average dimension from the top surface 1702 to the bottom surface 1704. The average thickness of the fourth layer 1700 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the fourth layer 1700 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the fourth layer 1700 can range from any of the minimum values described above to any of the maximum values described above. For example, the average thickness of the fourth layer 1700 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 1702 and the bottom surface 1704 of the fourth layer 1700 can, independently, be any shape. In some examples, the top surface 1702 and the bottom surface 1704 of the fourth layer 1700 can, independently, be substantially circular, ovate, ovoid, elliptic, triangular, rectangular, polygonal, etc. In some examples, the top surface 1702 and the bottom surface 1704 of the fourth layer 1700 can be substantially the same shape. In some examples, the top surface 1702 and the bottom surface 1704 of the fourth layer 1700 can be substantially circular.

In some examples, the top surface 1602 and the bottom surface 1604 of the third layer 1600 and the top surface 1702 and the bottom surface 1704 of the fourth layer 1700 are all substantially circular. In some examples, the top surface 1202 and the bottom surface 1204 of the first layer 1200; the top surface 1302 and the bottom surface 1304 of the second layer 1300; the top surface 1602 and the bottom surface 1604 of the third layer 1600; and the top surface 1702 and the bottom surface 1704 of the fourth layer 1700 are all substantially circular.

The fourth layer 1700 has an average lateral dimension (e.g., diameter when the fourth layer 1700 is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the fourth layer 1700 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the fourth layer 1700 can range from any of the minimum values described above to any of the maximum values described above. For example, the average lateral dimension of the fourth layer 1700 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

In some examples, the average lateral dimension of the third layer 1600 and the average lateral dimension of the fourth layer 1700 are substantially equal. In some examples, the average lateral dimension of the first layer 1200, the average lateral dimension of the second layer 1300, the average lateral dimension of the third layer 1600, and the average lateral dimension of the fourth layer 1700 are substantially equal.

Figure 30:
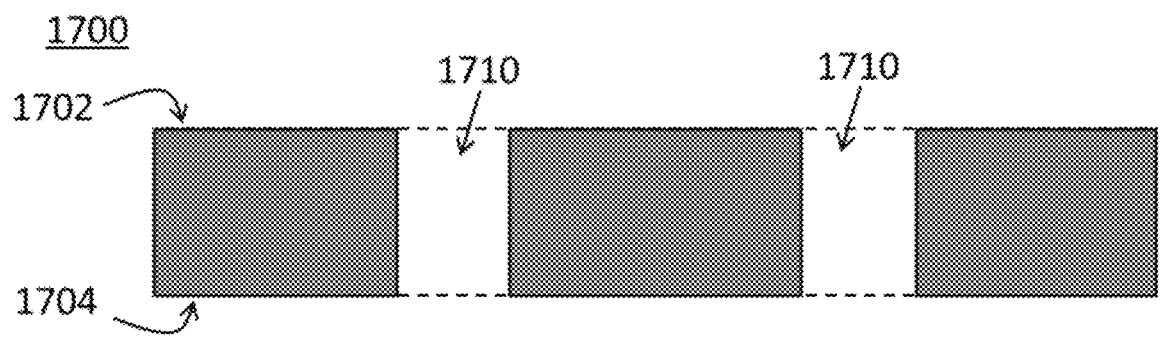
FIG. 30 is a cross-sectional plan view along line A-A in FIG. 29 of the example fourth layer.

Referring now to FIG. 29-FIG. 30, the fourth layer 1700 comprises a set of third cavities 1710, wherein each of the third cavities 1710 perforates the fourth layer 1700 from the top surface 1702 to the bottom surface 1704.

As used herein, "a set of third cavities 1710" and "the set of third cavities 1710" are meant to include any number of third cavities 1710 in any arrangement. Thus, for example, "a set of third cavities 1710" includes one or more third cavities 1710 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of third cavities 1710 can comprise a plurality of third cavities 1710. In some examples, the set of third cavities 1710 comprises a plurality of third cavities 1710 arranged in an ordered array. In some examples, the number of third cavities 1710 is equal to the number of second cavities 1312.

Each of the set of third cavities 1710 has a central longitudinal axis and a cross-sectional shape in a plane perpendicular to the central longitudinal axis of said cavity 1710, wherein the cross-sectional shape can be any shape, such as a regular shape, an irregular shape, an isotropic shape, or an anisotropic shape. In some examples, the cross-sectional shape of each of the set of third cavities 1710 can be substantially circular, ovate, ovoid, elliptic, triangular, rectangular, polygonal, etc. In some examples, the cross-sectional shape of each of the set of third cavities 1710 is substantially the same. In some examples, the cross-sectional shape of the set of third cavities can be substantially circular, as shown in FIG. 12. In some examples, the cross-sectional shape of the set of third cavities 1710 can be substantially rectangular, as shown in FIG. 29. In some examples, the cross-sectional shape of each of the third cavities 1710 is the same. In some examples, the cross-sectional shape of the set of third cavities 1710 can be the same as the cross-sectional shape of the set of second cavities 1312. In some examples, the cross-sectional shape of the set of third cavities 1710 can be different than the cross-sectional shape of the set of second cavities 1312.

In some examples, the central longitudinal axis of each of the set of third cavities 1710 are substantially parallel to each other. In some examples, the central longitudinal axis of each of the set of third cavities 1710 is substantially perpendicular to the bottom surface 1704 of the fourth layer 1700 (e.g., such that the cross-sectional shape is in a plane substantially parallel to the bottom surface 1704 of the fourth layer 1700).

The set of third cavities 1710 can have an average characteristic dimension. The term "characteristic dimension," as used herein refers to the largest straight line distance between two points in the plane of the cross-sectional shape of each of the third cavities 1710 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of third cavities 1710, the cross-sectional shape can be substantially circular and the average characteristic dimension can refer to the average diameter. In some examples, the average characteristic dimension of the set of third cavities 1710 can be substantially the same for the entire thickness. In some examples, the average characteristic dimension of the set of third cavities 1710 can vary with the thickness (e.g., tapered or stepped).

The set of third cavities 1710 can have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the set of third cavities 1710 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the set of third cavities 1710 can range from any of the minimum values described above to any of the maximum values described above. For example, the average characteristic dimension of the set of third cavities 1710 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

In some examples, the average characteristic dimension of each of the set of third cavities 1710 is substantially the same (e.g., the average characteristic dimension of each of the set of third cavities 1710 is substantially the same as the average characteristic dimension of the set of third cavities 1710). In some examples, the average characteristic dimension of the set of third cavities 1710 is greater than the average characteristic dimension of the set of second cavities 1312.

Figure 31:
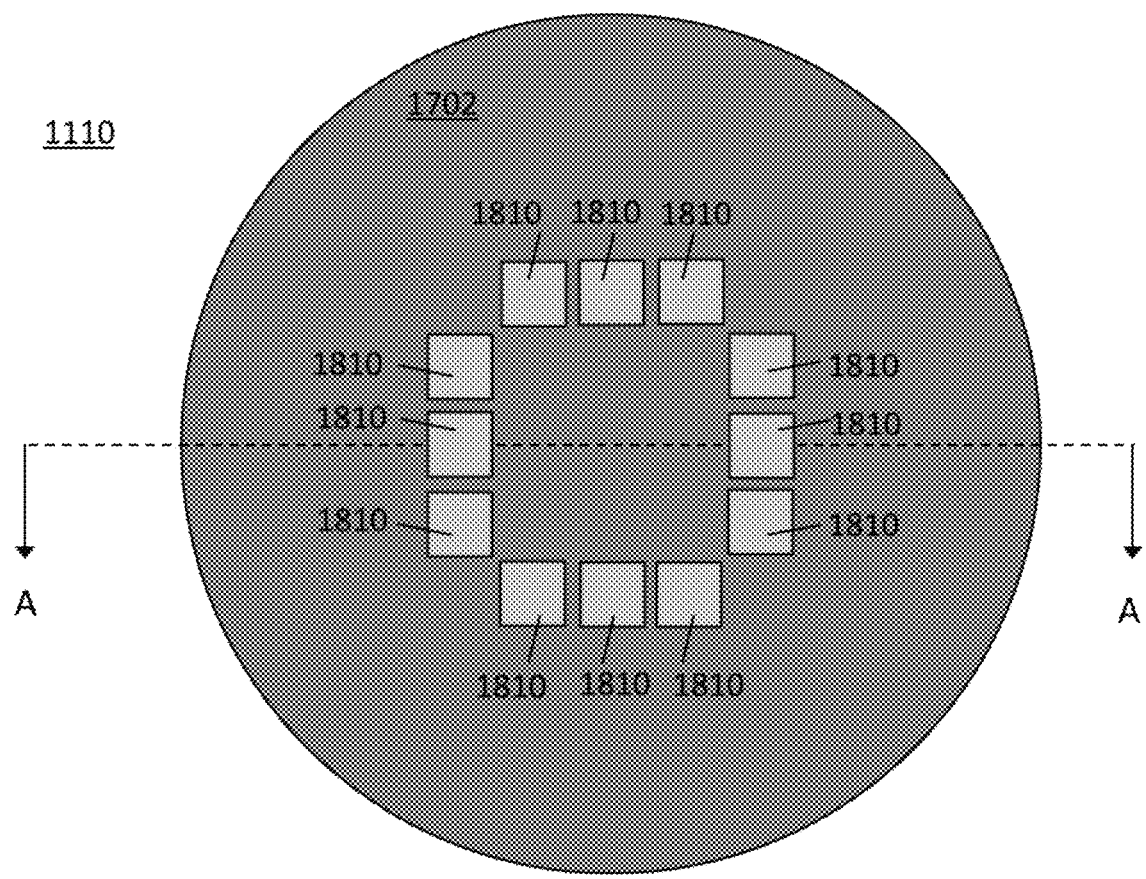
FIG. 31 is a schematic plan view of an example vapor cell preform as disclosed herein according to one implementation.
Figure 32:
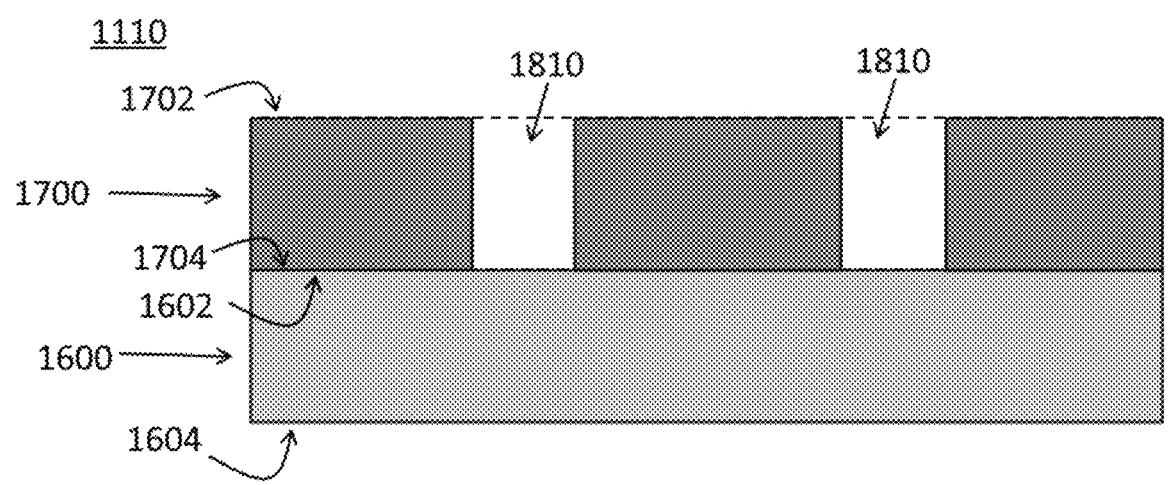
FIG. 32 is a cross-sectional plan view along line A-A in FIG. 31 of the example vapor cell preform.
Figure 33:
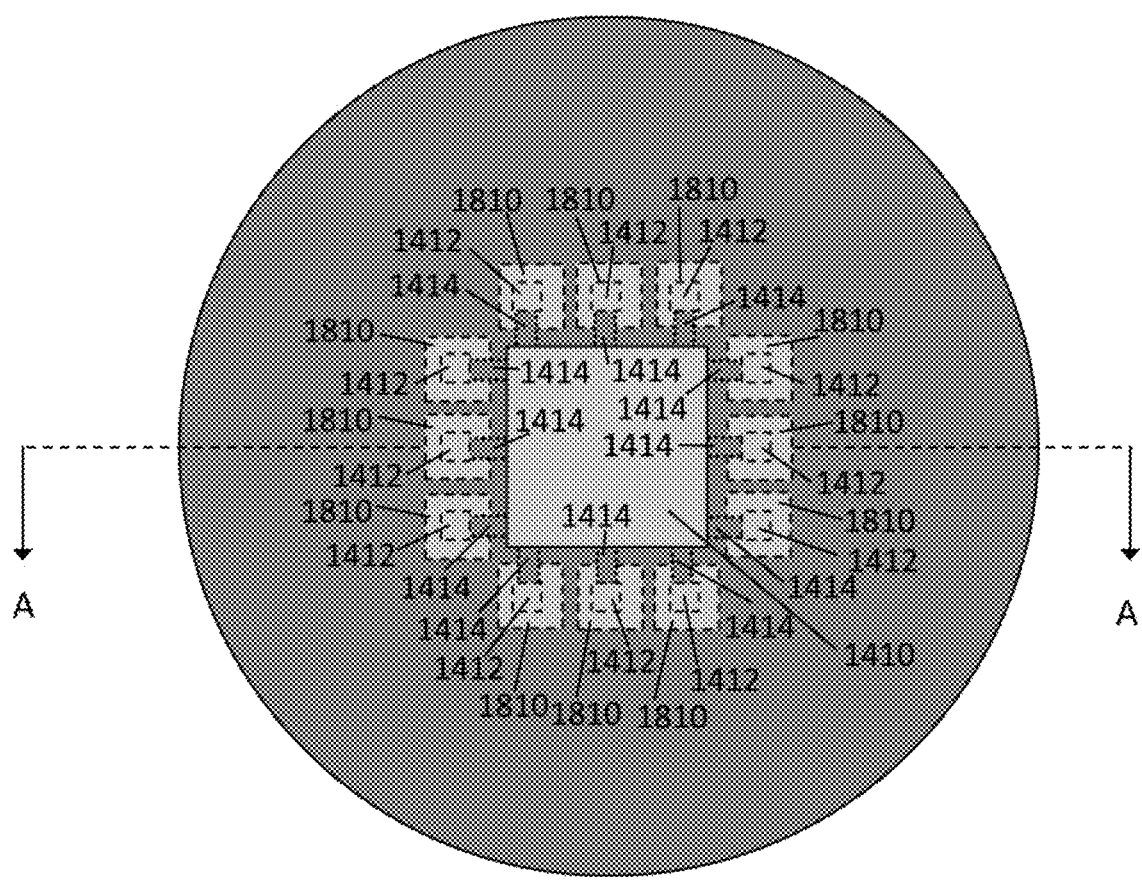
FIG. 33 is a schematic plan view of an example system comprising an example vapor cell preform and an example device as disclosed herein according to one implementation.
Figure 34:
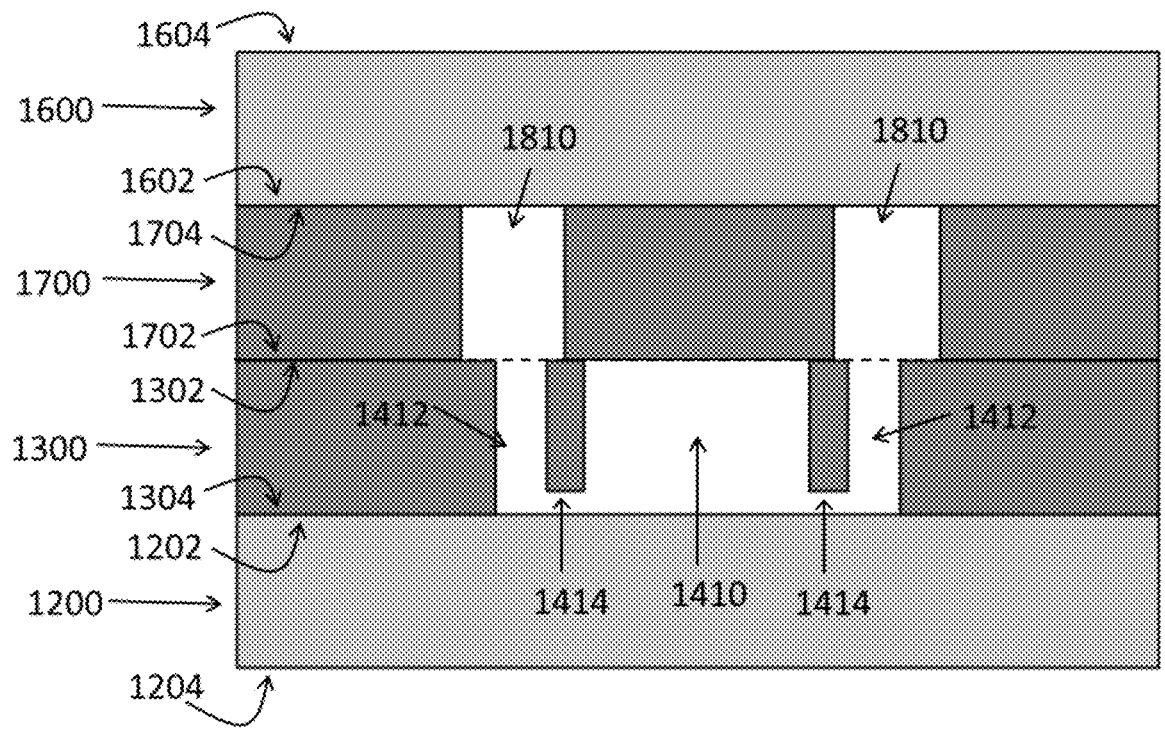
FIG. 34 is a cross-sectional plan view along line A-A in FIG. 33 of the example system.
Figure 35:
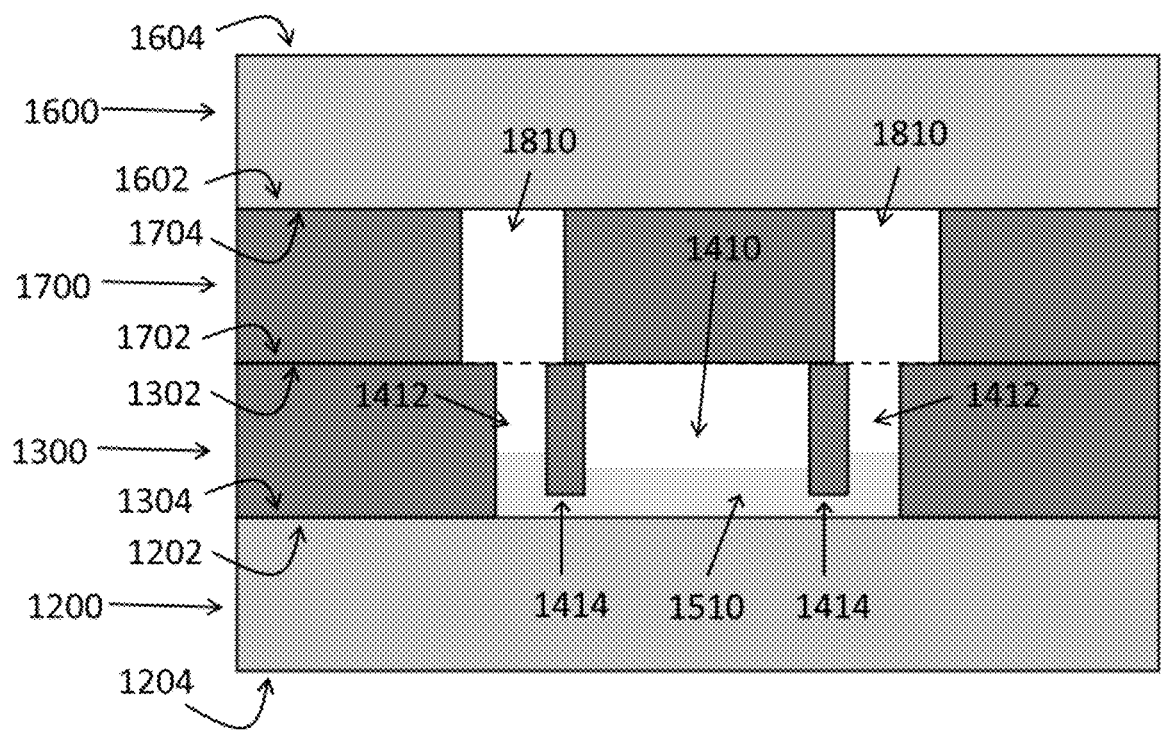
FIG. 35 is a cross-sectional plan view of the example system along line A-A in FIG. 33 wherein the example system includes a residue according to one example implementation.
Figure 36:
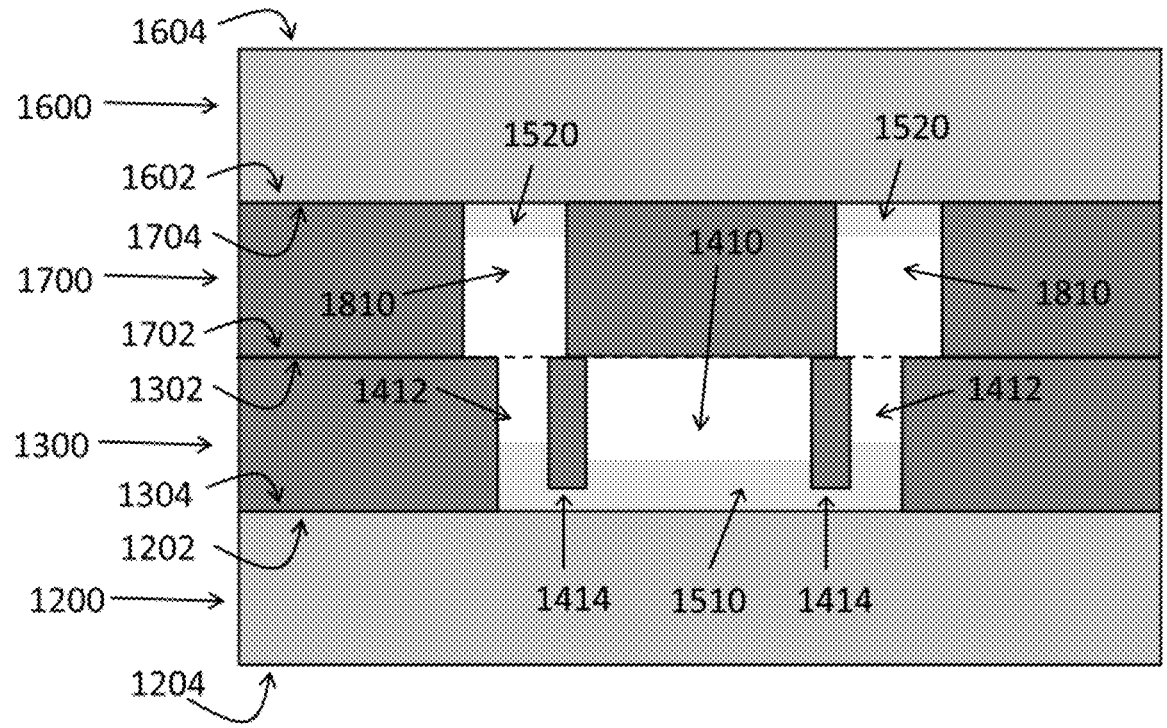
FIG. 36 is a cross-sectional plan view of the example system along line A-A in FIG. 33 wherein the example system includes an alkali metal deposited in the containers according to one example implementation.

Referring now to FIG. 31-FIG. 32, the fourth layer 1700 is disposed on the third layer 1600 in the vapor cell preform 1110, such that the bottom surface 1704 of the fourth layer 1700 is disposed on the top surface 1602 of the third layer 1600, wherein the set of third cavities 1710 together with the top surface 1602 of the third layer 1600 defines a set of containers 1810. The set of containers 1810 each have an open top (e.g., open at the top surface 1702 to the fourth layer 1700).

In some examples, the top surface 1602 and the bottom surface 1604 of the third layer 1600 and the top surface 1702 and the bottom surface 1704 of the fourth layer 1700 are all substantially parallel to each other in the device. In some examples, the fourth layer 1700 is disposed on the third layer 1600 in the vapor cell preform 1110, such that the bottom surface 1704 of the fourth layer 1700 is disposed on and in physical contact with the top surface 1602 of the third layer 1600. In some examples, the third layer 1600 is bonded to the fourth layer 1700. For example, the third layer 1600 can be bonded to the fourth layer 1700 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

In some examples, the methods can further comprise making the set of third cavities 1710 in fourth layer 1700. The set of third cavities 1710 can be patterned in the fourth layer 1700 using standard techniques known in the art, such as lithographic patterning, etching, micromachining, deep reactive ion etching, direct laser ablation, and the like. In some examples, the methods can further comprise disposing the fourth layer 1700 on the third layer 1600. In some examples, the methods can further comprise bonding the fourth layer 1700 and the third layer 1600. For example, the fourth layer 1700 can be bonded to the third layer 1600 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein can, for example, further comprise, disposing the vapor cell preform 1110 on the device 1100 after the fluid 1500 has dried to form the residue 1510.

Referring now to FIG. 33-FIG. 36, also disclosed herein are systems wherein the vapor cell perform 1110 is disposed on the device 1100 such that the top surface 1702 of the fourth layer 1700 is disposed on the top surface 1302 of the second layer 1300 and the set of containers 1810 are aligned over the set of receptacles 1412. In some examples, the central longitudinal axis of each of the set of third cavities 1710 are substantially parallel to the central longitudinal axis of the each of the set of second cavities 1312.

The methods disclosed herein can, for example, further comprise, disposing the vapor cell preform 1110 on the device 1100 after the fluid 1500 has dried to form the residue 1510, subjecting the residue 1510 to a reaction stimulus, thereby forming an alkali metal vapor, which enters the set of containers 1810, thereby depositing the alkali metal 1520 into the containers 1810. The alkali metal vapor can comprise, for example, potassium, rubidium, cesium, or a combination thereof. The reaction stimulus can, for example, comprise heating the residue 1510 at an elevated temperature, irradiating the residue 1510 with ultraviolet radiation, electrolyzing the residue 1510, a diffusive stimulus, or a combination thereof. In some examples, the alkali metal in the containers condenses to form a condensate.

The methods can, in some examples, further comprise separating the vapor cell preform 1110 from the device after the alkali metal has been deposited into the containers 1810, optionally injecting a buffer gas (e.g., $N_2$, Ne, Ar, Xe, He, Kr, $CH_4$, etc.) into the containers 1810 (the alkali metal and the buffer gas being inert to each other), and sealing the containers 1810. As used herein, "sealed" and variants thereof (e.g., seal, sealing, and the like) refer to a fluid impermeable barrier the prevents communication of fluids into or out of the sealed container.

Figure 37:
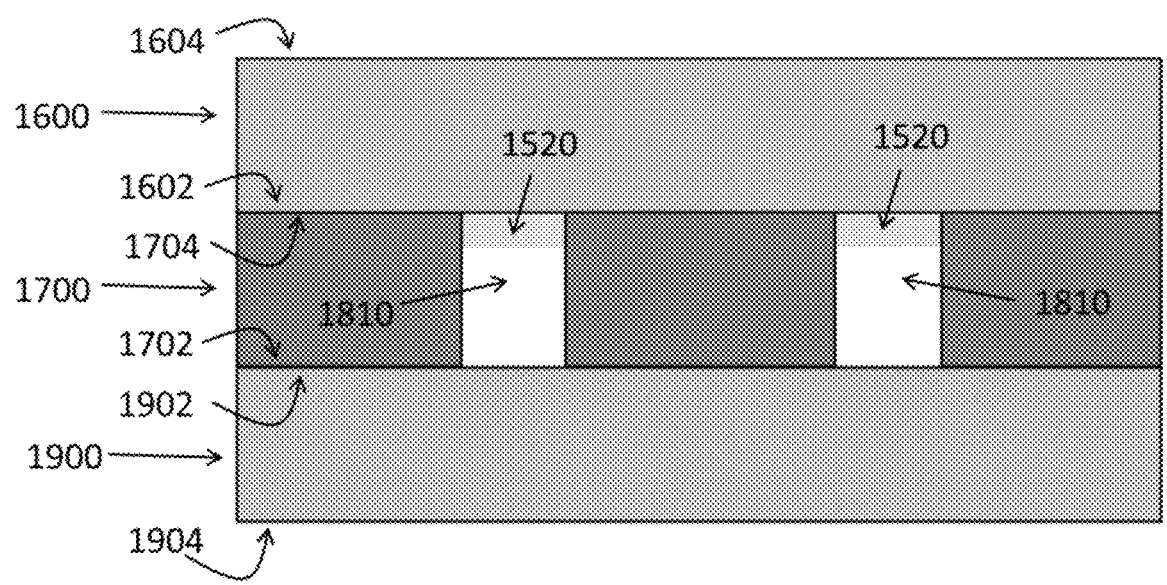
FIG. 37 is a cross-sectional plan view of the example system wherein the example system includes a substrate according to one example implementation.

Sealing the containers 1810 can, for example, comprise disposing the vapor cell preform on a substrate 1900 after the alkali metal has been deposited into the containers 1810, and optionally after injecting a buffer gas into the containers, such that the top surface 1702 of the fourth layer 1700 is disposed on the substrate 1900, thereby closing the open tops of the set of containers 1810 (FIG. 37). In some examples, the methods can further comprise bonding the fourth layer 1700 to the substrate 1900, thereby sealing the alkali metal (and optional buffer gas) in the containers. For example, the fourth layer 1700 can be bonded to the substrate 1900 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The substrate 1900 can have a top surface 1902 and a bottom surface 1904 opposite and spaced apart from the top surface 1902. In some examples, the top surface 1902 and the bottom surface 1904 of the substrate 1900 are substantially parallel to each other. The substrate 1900 can comprise any material consistent with the methods, devices, and systems disclosed herein. In some examples, the substrate 1900 can comprise a dielectric, a semiconductor, a ceramic, a transparent conducting oxide, a polymer, a metal, or a combination thereof. Examples of substrates 1900 include, but are not limited to, glass, quartz, Pyrex, fused silica, silicon dioxide, silicon nitride, sapphire, a polymer (e.g., polycarbonate), and combinations thereof. In some examples, the substrate 1900 can be transparent. As used herein, a "transparent substrate 1900" is meant to include any substrate 1900 that is transparent at the wavelength or wavelength region of interest. In some examples, the substrate 1900 comprises glass (e.g., aluminosilicate glass, borosilicate glass, etc.).

The substrate 1900 has an average thickness, the average thickness being the average dimension from the top surface 1902 to the bottom surface 1904. The average thickness of the substrate 1900 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the substrate 1900 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the substrate 1900 can range from any of the minimum values described above to any of the maximum values described above. For example, the average thickness of the substrate 1900 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 1902 and the bottom surface 1904 of the substrate 1900 can, independently, be any shape. In some examples, the top surface 1902 and the bottom surface 1904 of the substrate 1900 can, independently, be substantially circular, ovate, ovoid, elliptic, triangular, rectangular, polygonal, etc. In some examples, the top surface 1902 and the bottom surface 1904 of the substrate 1900 can be substantially the same shape. In some examples, the top surface 1902 and the bottom surface 1904 of the substrate 1900 can be substantially circular.

The substrate 1900 has an average lateral dimension (e.g., diameter when the substrate is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the substrate 1900 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the substrate 1900 can range from any of the minimum values described above to any of the maximum values described above. For example, the average lateral dimension of the substrate 1900 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

In some examples, the average lateral dimension of the substrate 1900 and the average lateral dimension of the fourth layer 1700 are substantially equal. In some examples, the top surface 1902 and the bottom surface 1904 of the substrate 1900 and the top surface 1702 and the bottom surface 1704 of the fourth layer 1700 are all substantially parallel to each other. In some examples, the fourth layer 1700 is disposed on the substrate 1900, such that the top surface 1702 of the fourth layer 1700 is disposed on and in physical contact with the top surface 1902 of the substrate 1900.

In some examples, the methods described herein can be used to form a plurality of alkali metal vapor cells on a single wafer simultaneously in parallel (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more).

In some examples, the methods can further comprise separating one or more of the sealed containers (e.g., one or more of the alkali metal vapor cells) from the others without disrupting the seal. In some examples, the methods can further comprise separating each of the sealed containers (e.g., each of the alkali metal vapor cells) from one another without disrupting the seal. The sealed containers can be separated using methods known in the art, such as, for example, dicing, laser cutting, abrasive machining, chemical etching, micromachining, etc.

One or more of the method steps can, for example, be carried out either under vacuum or in a buffer-gas (e.g., anaerobic) environment, consistent with the requirements for application of the sealed containers in an atomic clock or magnetometer.

Also disclosed herein are devices comprising a first layer 2200 having a top surface 2202 and a bottom surface 2204 opposite and spaced apart from the top surface 2202. In some examples, the top surface 2202 and the bottom surface 2204 of the first layer 2200 are substantially parallel to each other.

The first layer 2200 can comprise any material consistent with the methods, devices, and systems disclosed herein. In some examples, the first layer 2200 can comprise a dielectric, a semiconductor, a ceramic, a transparent conducing oxide, a polymer, a metal, or a combination thereof. Examples of first layers 2200 include, but are not limited to, glass, quartz, Pyrex, fused silica, silicon dioxide, silicon nitride, sapphire, a polymer (e.g., polycarbonate), and combinations thereof. In some examples, the first layer 2200 can be transparent. As used herein, a "transparent layer" is meant to include any layer that is transparent at the wavelength or wavelength region of interest. In some examples, the first layer 2200 comprises glass (e.g., aluminosilicate glass, borosilicate glass, etc.).

The first layer 2200 has an average thickness, the average thickness being the average dimension from the top surface 2202 to the bottom surface 2204. The average thickness of the first layer 2200 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the first layer 2200 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the first layer 2200 can range from any of the minimum values described above to any of the maximum values described above. For example, the average thickness of the first layer 2200 can be from 1 micrometer (μm) to 10 millimeters (mm) (e.g., from 1 μm to 100 μm, from 100 μm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 2202 and the bottom surface 2204 of the first layer 2200 can, independently, be any shape. In some examples, the top surface 2202 and the bottom surface 2204 of the first layer 2200 can, independently, be substantially circular, ovate, ovoid, elliptic, triangular, rectangular, polygonal, etc. In some examples, the top surface 2202 and the bottom surface 2204 of the first layer 2200 can be substantially the same shape. In some examples, the top surface 2202 and the bottom surface 2204 of the first layer 2200 can be substantially circular.

The first layer 2200 has an average lateral dimension (e.g., diameter when the first layer 2200 is a circular wafer) of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the first layer 2200 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average lateral dimension of the first layer 2200 can range from any of the minimum values described above to any of the maximum values described above. For example, the average lateral dimension of the first layer 2200 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 µm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm).

The devices further comprise a second layer 2300 having a top surface 2302 and a bottom surface 2304 opposite and spaced apart from the top surface. In some examples, the top surface 2302 and the bottom surface 2304 of the second layer 2300 are substantially parallel to each other.

The second layer 2300 can comprise any material consistent with the methods, devices, and systems disclosed herein. In some examples, the second layer 2300 can comprise a dielectric, a semiconductor, a ceramic, a transparent conducting oxide, a polymer, a metal, or a combination thereof. Examples of second layers 2300 include, but are not limited to, silicon, glass (e.g. aluminum coated glass), sapphire, a ceramic, and combinations thereof. In some examples, the second layer 2300 comprises silicon. In some examples, the second layer 2300 is hydrophilic.

The second layer 2300 has an average thickness, the average thickness being the average dimension from the top surface 2302 to the bottom surface 2304. The average thickness of the second layer 2300 can, for example be 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the second layer 2300 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average thickness of the second layer 2300 can range from any of the minimum values described above to any of the maximum values described above. For example, the average thickness of the second layer 2300 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 2302 and the bottom surface 2304 of the second layer 2300 can, independently, be any shape. In some examples, the top surface 2302 and the bottom surface 2304 of the second layer 2300 can, independently, be substantially circular, ovate, ovoid, elliptic, triangular, rectangular, polygonal, etc. In some examples, the top surface 2302 and the bottom surface 2304 of the second layer 2300 can be substantially the same shape. In some examples, the top surface 2302 and the bottom surface 2304 of the second layer 2300 can be substantially circular.

In some examples, the top surface 2202 and the bottom surface 2204 of the first layer 2200 and the top surface 2302 and the bottom surface 2304 of the second layer 2300 are all substantially circular.

The second layer 2300 has an average lateral dimension (e.g., diameter when the second layer 2300 is a circular wafer) of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the second layer 2300 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the second layer 2300 can range from any of the minimum values described above to any of the maximum values described above. For example, the average lateral dimension of the second layer 2300 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm). In some examples, the average lateral dimension of the second layer 2300 and the average lateral dimension of the first layer 2200 are substantially equal.

Figure 38:
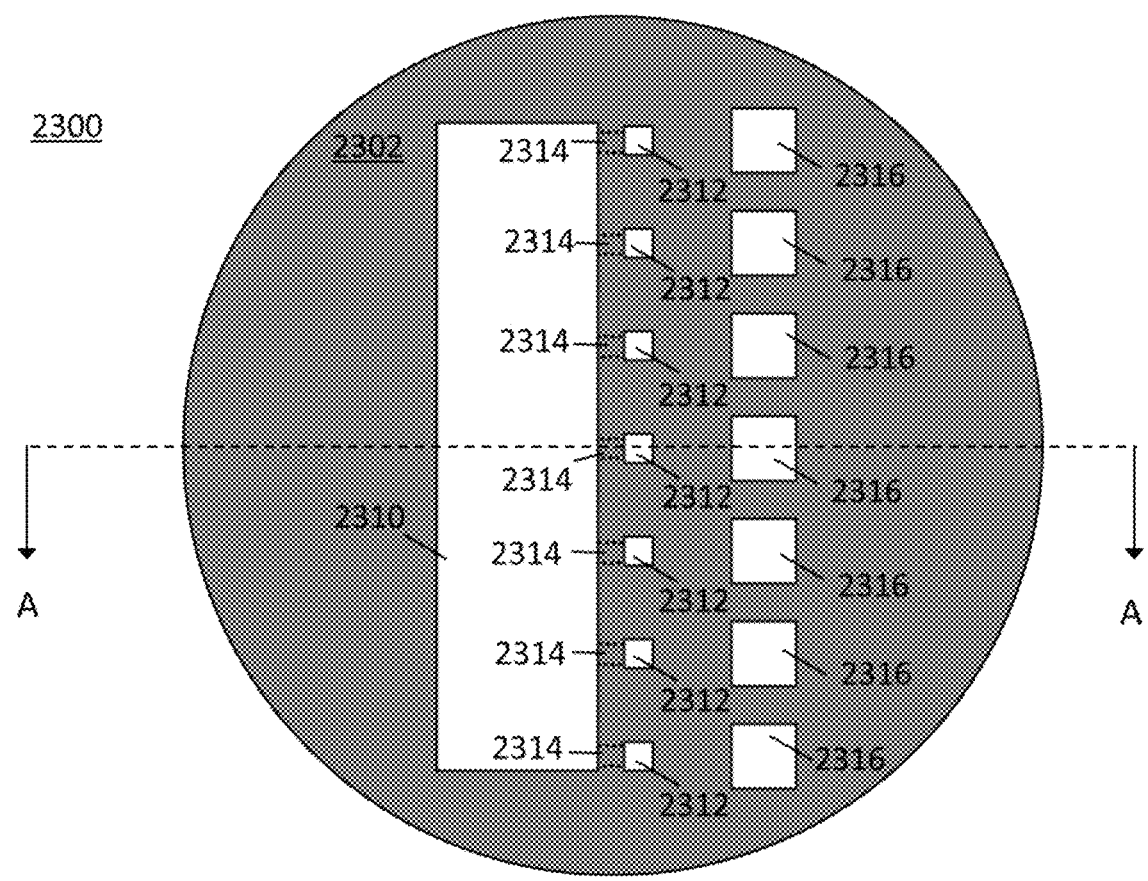
FIG. 38 is a schematic plan view of an example second layer as disclosed herein according to one implementation.
Figure 39:
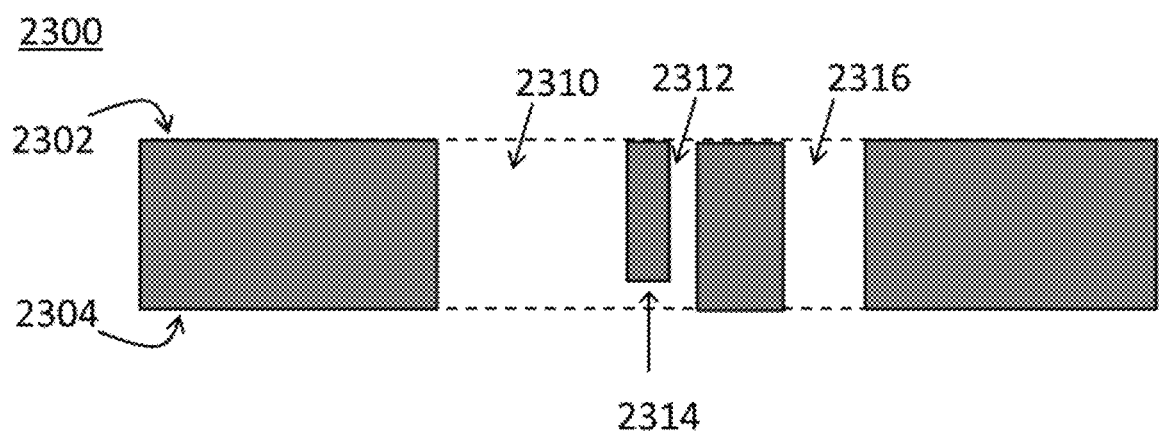
FIG. 39 is a cross-sectional plan view along line A-A in FIG. 38 of the example second layer.

Referring now to FIG. 38-FIG. 39, the second layer 2300 comprises a first cavity 2310, a set of second cavities 2312, a set of third cavities 2316, and a set of grooves 2314; wherein the first cavity 2310 perforates the second layer 2300 from the top surface 2302 to the bottom surface 2304; wherein each of the second cavities 2312 perforates the second layer 2300 from the top surface 2302 to the bottom surface 2304; wherein each of the third cavities 2316 perforates the second layer 2300 from the top surface 2302 to the bottom surface 2304; wherein each of the grooves 2314 extends from the first cavity 2310 to one of the second cavities 2312 on the bottom surface 2304; wherein each of the third cavities 2316 is fluidly isolated from the first cavity 2310, the set of second cavities 2312, and the set of grooves 2314; and wherein each of the third cavities 2316 is located adjacent to one of the second cavities 2312.

As used herein, "a first cavity 2310" and "the first cavity 2310" are meant to include any number of first cavities 2310 in any arrangement. Thus, for example, "a first cavity 310" includes one or more first cavities 2310 (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the first cavity 2310 can comprise a plurality of first cavities 2310.

The first cavity 2310 has a central longitudinal axis and a cross-sectional shape in a plane perpendicular to the central longitudinal axis of said cavity 2310, wherein the cross-sectional shape can be any shape, such as a regular shape, an irregular shape, an isotropic shape, or an anisotropic shape. In some examples, the cross-sectional shape of the first cavity 2310 can be substantially circular, ovate, ovoid, elliptic, triangular, rectangular, polygonal, etc. In some examples, the cross-sectional shape of the first cavity 2310 can be substantially circular. In some examples, the cross-sectional shape of the first cavity 2310 can be substantially rectangular, as shown in FIG. 38. In some examples, the central longitudinal axis of the first cavity 2310 is substantially perpendicular to the bottom surface 2304 of the second layer 2300 (e.g., such that the cross-sectional shape is in a plane substantially parallel to the bottom surface 2304 of the second layer 2300).

The first cavity 2310 can have an average characteristic dimension. The term "characteristic dimension," as used herein refers to the largest straight line distance between two points in the plane of the cross-sectional shape of the first cavity 2310 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension. For example, for a cylindrical first cavity 2310, the cross-sectional shape can be substantially circular and the average characteristic dimension can refer to the diameter. In some examples, the average characteristic dimension of the first cavity 2310 can be substantially the same for the entire thickness. In some examples, the average characteristic dimension of the first cavity 2310 can vary with the thickness (e.g., tapered or stepped).

The first cavity 2310 can have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the first cavity 2310 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the first cavity 2310 can range from any of the minimum values described above to any of the maximum values described above. For example, the average characteristic dimension of the first cavity 2310 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

As used herein, "a set of second cavities 2312" and "the set of second cavities 2312" are meant to include any number of second cavities 2312 in any arrangement. Thus, for example, "a set of second cavities 2312" includes one or more second cavities 2312 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more;

7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of second cavities 2312 can comprise a plurality of second cavities 2312, wherein each of the second cavities 2312 is located adjacent the first cavity 2310. In some examples, the set of second cavities 2312 comprises a plurality of second cavities 2312, wherein each of the second cavities 2312 is located adjacent the first cavity 2310 in an ordered array.

Each of the set of second cavities 2312 has a central longitudinal axis and a cross-sectional shape in a plane perpendicular to the central longitudinal axis of said cavity 2312, wherein the cross-sectional shape can be any shape, such as a regular shape, an irregular shape, an isotropic shape, or an anisotropic shape. In some examples, the cross-sectional shape of each of the set of second cavities 2312 can be substantially circular, ovate, ovoid, elliptic, triangular, rectangular, polygonal, etc. In some examples, the cross-sectional shape of each of the set of second cavities 2312 is substantially the same. In some examples, the cross-sectional shape of the set of second cavities 2312 can be substantially circular. In some examples, the cross-sectional shape of the set of second cavities 2312 can be substantially rectangular, as shown in FIG. 38. In some examples, the cross-sectional shape of each of the second cavities 2312 is the same. In some examples, the cross-sectional shape of the set of second cavities 2312 can be the same as the cross-sectional shape of the first cavity 2310. In some examples, the cross-sectional shape of the set of second cavities 2316 can be different than the cross-sectional shape of the first cavity 2310.

In some examples, the central longitudinal axis of each of the set of second cavities 2312 are substantially parallel to each other. In some examples, the central longitudinal axis of each of the set of second cavities 2312 are substantially parallel to the central longitudinal axis of the first cavity 2310. In some examples, the central longitudinal axis of each of the set of second cavities 2312 is substantially perpendicular to the bottom surface 2304 of the second layer 2300 (e.g., such that the cross-sectional shape is in a plane substantially parallel to the bottom surface 2304 of the second layer 2300).

The set of second cavities 2312 can have an average characteristic dimension. The term "characteristic dimension," as used herein refers to the largest straight line distance between two points in the plane of the cross-sectional shape of each of the second cavities 2312 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of second cavities 2312, the cross-sectional shape can be substantially circular and the average characteristic dimension can refer to the average diameter. In some examples, the average characteristic dimension of the set of second cavities 2312 can be substantially the same for the entire thickness. In some examples, the average characteristic dimension of the set of second cavities 2312 can vary with the thickness (e.g., tapered or stepped).

The set of second cavities 2312 can have an average characteristic dimension of 1 micrometer (micron, $\mu m$) or more (e.g., 5 $\mu m$ or more, 10 $\mu m$ or more, 15 $\mu m$ or more, 20 $\mu m$ or more, 25 $\mu m$ or more, 30 $\mu m$ or more, 40 $\mu m$ or more, 50 $\mu m$ or more, 75 $\mu m$ or more, 100 $\mu m$ or more, 125 $\mu m$ or more, 150 $\mu m$ or more, 200 $\mu m$ or more, 250 $\mu m$ or more, 300 $\mu m$ or more, 400 $\mu m$ or more, 500 $\mu m$ or more, 750 $\mu m$ or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the set of second cavities 2312 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer ($\mu m$) or less, 500 $\mu m$ or less, 400 $\mu m$ or less, 300 $\mu m$ or less, 250 $\mu m$ or less, 200 $\mu m$ or less, 150 $\mu m$ or less, 125 $\mu m$ or less, 100 $\mu m$ or less, 75 $\mu m$ or less, 50 $\mu m$ or less, 40 $\mu m$ or less, 30 $\mu m$ or less, 25 $\mu m$ or less, 20 $\mu m$ or less, 15 $\mu m$ or less, 10 $\mu m$ or less, or 5 $\mu m$ or less). The average characteristic dimension of the set of second cavities 2312 can range from any of the minimum values described above to any of the maximum values described above. For example, the average characteristic dimension of the set of second cavities 2312 can be from 1 micrometer ($\mu m$) to 10 millimeters (mm) (e.g., from 1 $\mu m$ to 100 $\mu m$, from 100 $\mu m$ to 10 mm, from 1 $\mu m$ to 10 $\mu m$, from 10 $\mu m$ to 100 $\mu m$, from 100 $\mu m$ to 1 mm, from 1 mm to 10 mm, from 1 $\mu m$ to 1 mm, from 10 $\mu m$ to 10 mm, from 10 $\mu m$ to 1 mm, from 100 $\mu m$ to 10 mm, from or 100 $\mu m$ to 1 mm).

In some examples, the average characteristic dimension of each of the set of second cavities 2312 is substantially the same (e.g., the average characteristic dimension of each of the set of second cavities 2312 is substantially the same as the average characteristic dimension of the set of second cavities 2312). In some examples, the average characteristic dimension of the set of second cavities 2312 is less than or equal to the average characteristic dimension of the first cavity 2310.

As used herein, "a set of third cavities 2316" and "the set of third cavities 2316" are meant to include any number of third cavities 2316 in any arrangement. Thus, for example, "a set of third cavities 2316" includes one or more third cavities 2316 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of third cavities 2316 can comprise a plurality of third cavities 2316, wherein each of the third cavities 2316 is located adjacent one of the second cavities 2312. In some examples, the set of third cavities 2316 comprises a plurality of third cavities 2316, wherein each of the third cavities 2316 is located adjacent one of the second cavities 2312 in an ordered array. In some examples, the number of third cavities 2316 and the number of second cavities 2312 is the same.

Each of the set of third cavities 2316 has a central longitudinal axis and a cross-sectional shape in a plane perpendicular to the central longitudinal axis of said cavity 2316, wherein the cross-sectional shape can be any shape, such as a regular shape, an irregular shape, an isotropic shape, or an anisotropic shape. In some examples, the cross-sectional shape of each of the set of third cavities 2316 can be substantially circular, ovate, ovoid, elliptic, triangular, rectangular, polygonal, etc. In some examples, the cross-sectional shape of each of the set of third cavities 2316 is substantially the same. In some examples, the cross-sectional shape of the set of third cavities 2316 can be substantially circular. In some examples, the cross-sectional shape of the set of third cavities 2316 can be substantially rectangular, as shown in FIG. 38. In some examples, the cross-sectional shape of each of the third cavities 2316 is the same. In some examples, the cross-sectional shape of the set of third cavities 2316 can be the same as the cross-sectional shape of the set of second cavities 2312. In some examples, the cross-sectional shape of the set of third cavities 2316 can be different than the cross-sectional shape of the set of second cavities 2312.

In some examples, the central longitudinal axis of each of the set of third cavities 2316 are substantially parallel to each other. In some examples, the central longitudinal axis of each of the set of third cavities 2316 are substantially parallel to the central longitudinal axis of the first cavity 2310. In some examples, the central longitudinal axis of each of the set of third cavities 2316 are substantially parallel to the central longitudinal axis of each of the set of second cavities 2312. In some examples, the central longitudinal axis of each of the set of third cavities 2316, the central longitudinal axis of the first cavity 2310, and the central longitudinal axis of each of the set of second cavities 2312 are all substantially parallel to each other. In some examples, the central longitudinal axis of each of the set of third cavities 2316 is substantially perpendicular to the bottom surface 2304 of the second layer 2300 (e.g., such that the cross-sectional shape is in a plane substantially parallel to the bottom surface 2304 of the second layer 2300).

The set of third cavities 2316 can have an average characteristic dimension. The term "characteristic dimension," as used herein refers to the largest straight line distance between two points in the plane of the cross-sectional shape of each of the third cavities 2316 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of third cavities 2316, the cross-sectional shape can be substantially circular and the average characteristic dimension can refer to the average diameter. In some examples, the average characteristic dimension of the set of third cavities 2316 can be substantially the same for the entire thickness. In some examples, the average characteristic dimension of the set of third cavities 2316 can vary with the thickness (e.g., tapered or stepped).

The set of third cavities 2316 can have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the set of third cavities 2316 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the set of third cavities 2316 can range from any of the minimum values described above to any of the maximum values described above. For example, the average characteristic dimension of the set of third cavities 2316 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

In some examples, the average characteristic dimension of each of the set of third cavities 2316 is substantially the same (e.g., the average characteristic dimension of each of the set of third cavities 2316 is substantially the same as the average characteristic dimension of the set of third cavities 2316). In some examples, the average characteristic dimension of the set of third cavities 2316 is greater than the average characteristic dimension of the set of second cavities 2312.

As used herein, "a set of grooves 2314" and "the set of grooves 2314" are meant to include any number of grooves 2314 in any arrangement. Thus, for example, "a set of grooves 2314" includes one or more grooves 2314 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of grooves 2314 can comprise a plurality of grooves 2314. In some examples, the number of grooves 2314 in the set of grooves 2314 is equal to the number of second cavities 2312 in the set of second cavities 2312.

Figure 40:
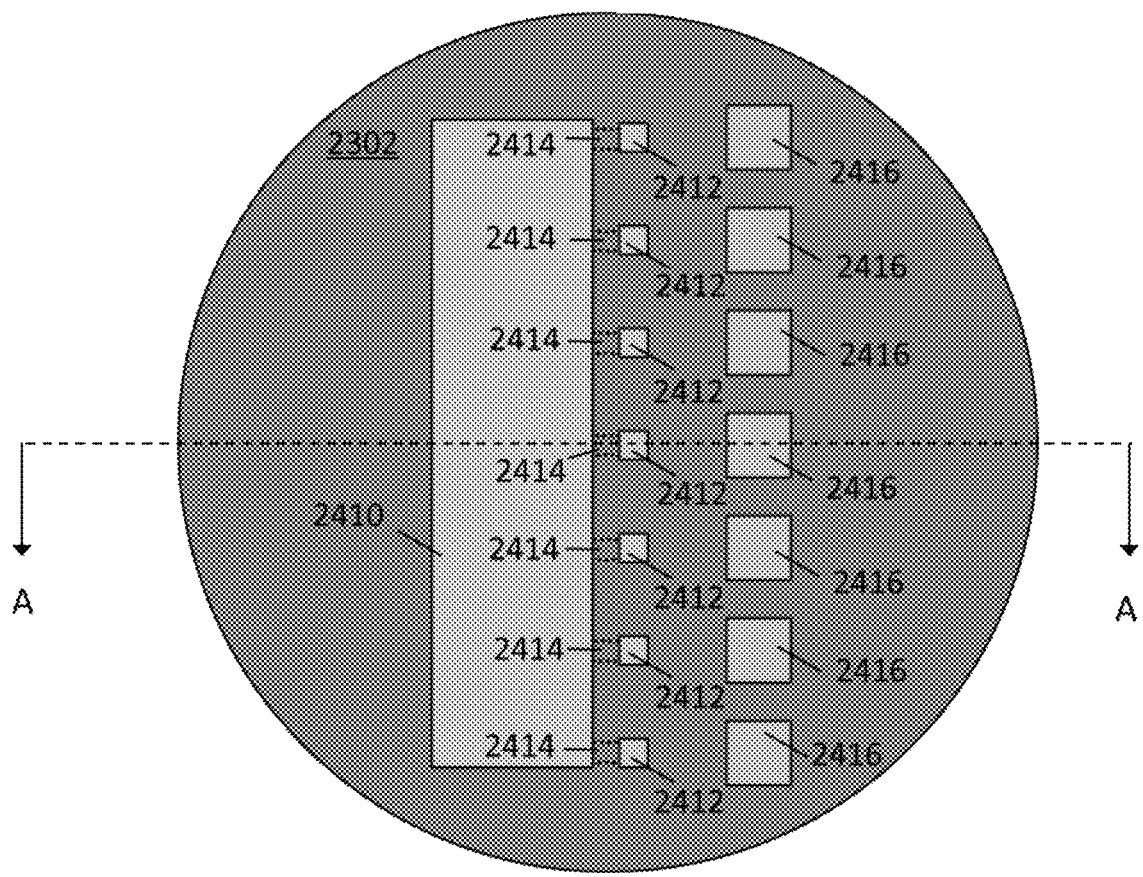
FIG. 40 is a schematic plan view of an example device as disclosed herein according to one implementation.
Figure 41:
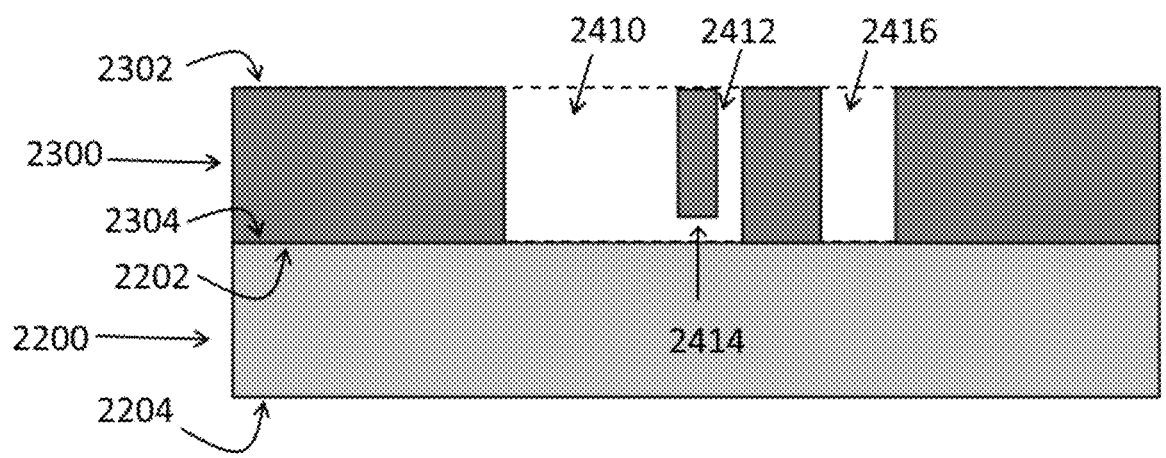
FIG. 41 is a cross-sectional plan view along line A-A in FIG. 40 of the example device.
Figure 42:
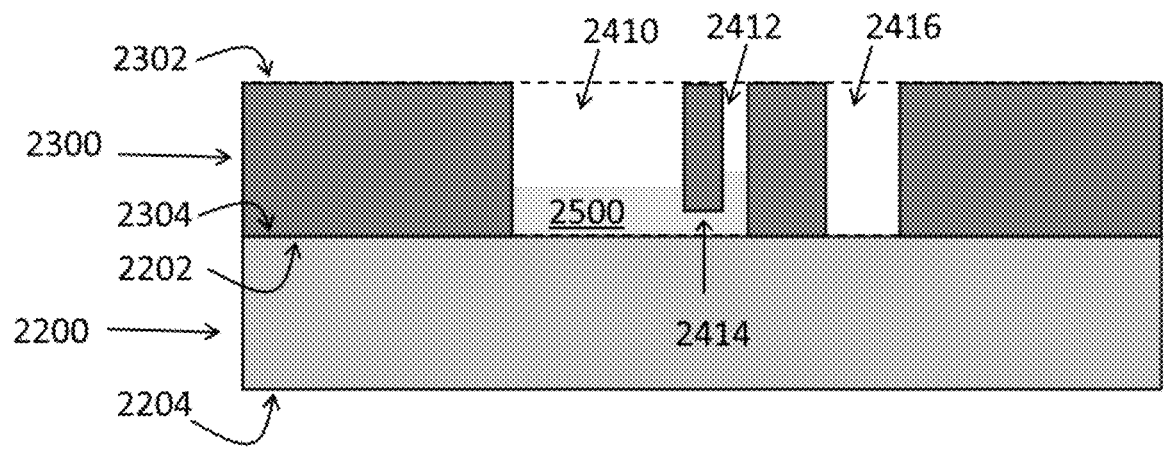
FIG. 42 is a cross-sectional plan view of the example device along line A-A in FIG. 40 wherein the example device includes a fluid according to one example implementation.
Figure 43:
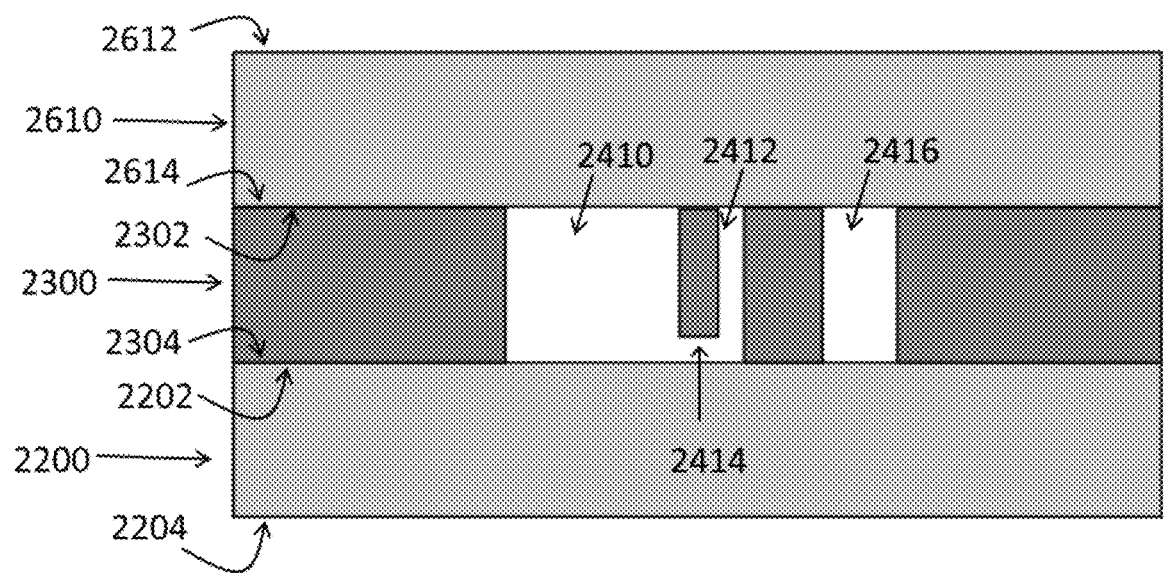
FIG. 43 is a schematic cross-sectional plan view of an example system as disclosed herein according to one implementation.
Figure 44:
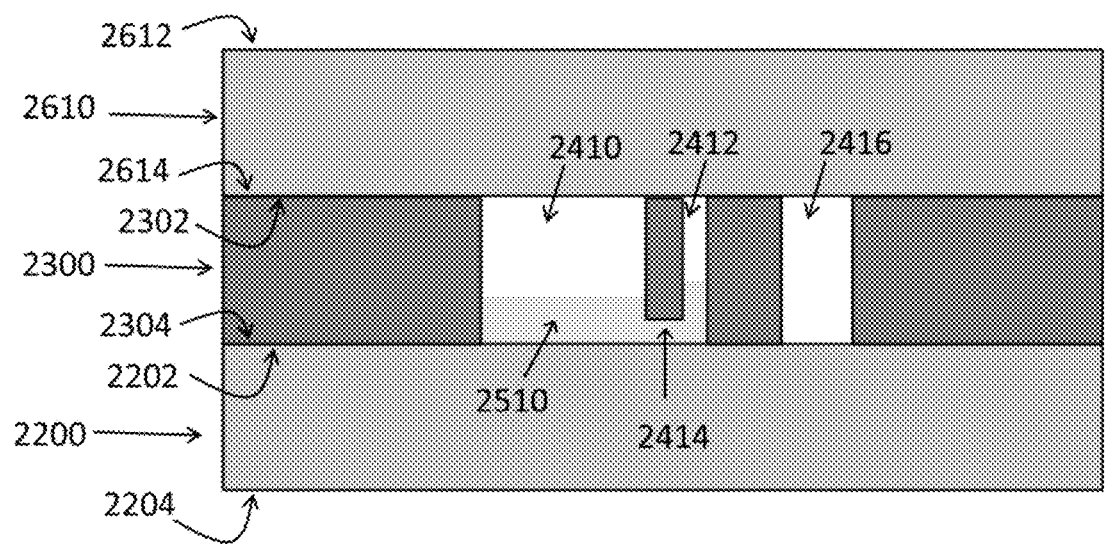
FIG. 44 is a cross-sectional plan view of the example system in FIG. 43 wherein the example system further includes a residue.
Figure 45:
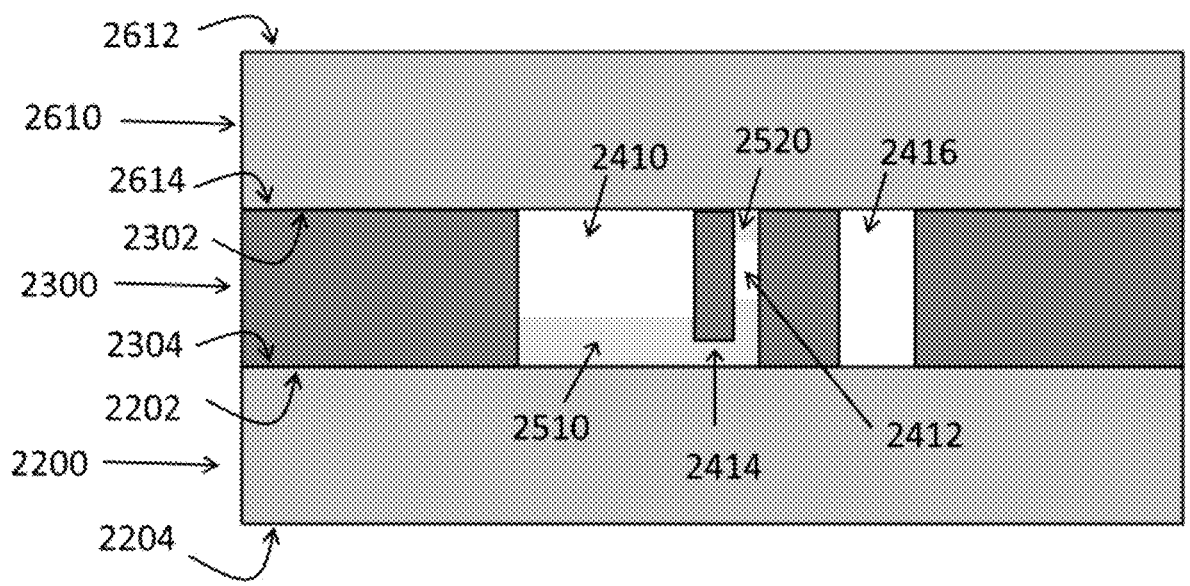
FIG. 45 is a cross-sectional plan view of the example system in FIG. 44 wherein the example system includes a condensate.
Figure 46:
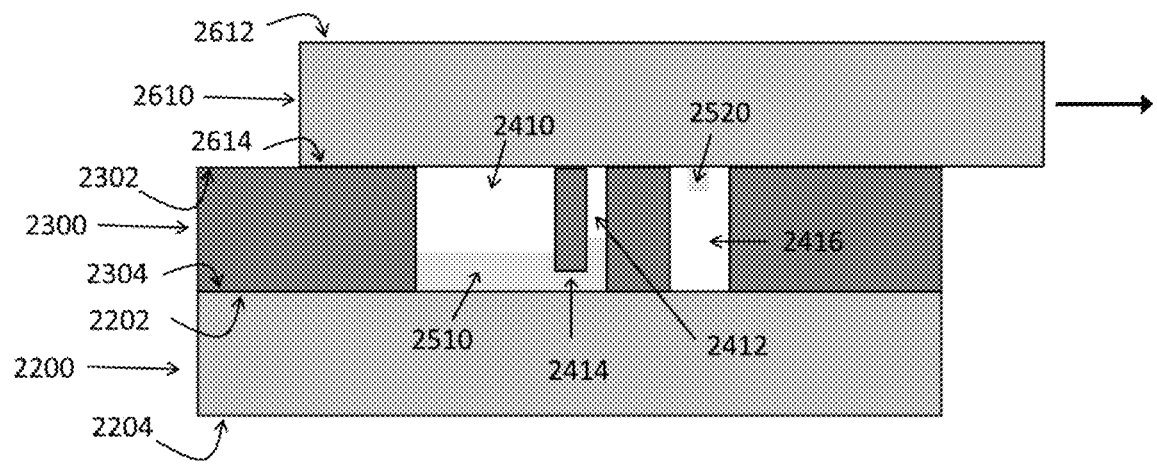
FIG. 46 is a cross-sectional plan view of the example system in FIG. 44 after lateral movement of the third layer according to one example implementation.

Referring now to FIG. 40-FIG. 42, the second layer 2300 is disposed on the first layer 2200 in the devices 2100, such that the bottom surface 2304 of the second layer 2300 is disposed on the top surface 2202 of the first layer 2200, such that: the first cavity 2310 together with the top surface 2202 of the first layer 2200 defines a reservoir 2410; the set of second cavities 2312 together with the top surface 2202 of the first layer 2200 defines a set of receptacles 2412; the set of third cavities 2316 together with the top surface 2202 of the first layer 2200 defines a set of containers 2416; and the set of grooves 2314 together with the top surface 2202 of the first layer 2200 define a set of conduits 2314 fluidly connecting each of the receptacles 2412 to the reservoir 2410; such that, when a fluid 2500 is placed in the reservoir 2410, the fluid flows to each of the receptacles 2412 via capillary action, such that the fluid at least partially fills each of the receptacles 2412. The reservoir 2410, the set of receptacles 2412, and the set of containers 2416 each have an open top (e.g., open at the top surface 2302 of the second layer 2300). In some examples, the top surface 2202 and the bottom surface 2204 of the first layer 2200 and the top surface 2302 and the bottom surface 2304 of the second layer 2300 are all substantially parallel to each other in the device 2100. In some examples, the second layer 2300 is disposed on the first layer 2200 in the devices 2100, such that the bottom surface 2304 of the second layer 2300 is disposed on and in physical contact with the top surface 2202 of the first layer 2200. In some examples, the first layer 2200 is bonded to the second layer 2300. For example, the first layer 2200 can be bonded to the second layer 2300 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein comprise, for example, depositing the fluid 2500 into the reservoir 2410, such that the fluid flows to each of the receptacles 2412 via capillary action and the fluid at least partially fills each of the receptacles 2412. The fluid can, for example, comprise an alkali metal precursor and a solvent. The alkali metal precursor can, for example, comprise any compound or composition capable of reacting to form a free alkali metal. The alkali metal precursor can, for example, comprise an alkali metal compound, wherein the alkali metal can include an alkali atom, an alkaline earth atom, a lanthanide, an actinide, or combinations thereof. In some examples, the alkali metal precursor can, for example, comprise an alkali metal compound, wherein the alkali metal can include potassium (K), rubidium (Rb), cesium (Cs), or a combination thereof. The alkali metal precursor can, for example, comprise an alkali halide (e.g., an alkali chloride), an azide, a chromate, a molibdate, or a combination thereof. Exemplary alkali halides include RbCl, CsCl, KCl, RbBr, CsBr, KBr, and the like. Exemplary alkali azides include $RbN_3$, $CsN_3$, $KN_3$, and the like. In some examples, the alkali metal precursor can include $RbN_3$, $CsN_3$, $KN_3$ that can produce alkali metal in response to being subjected to ultraviolet light. Alkali halides can, for example, be reacted with $BaN_6$ or Ca to produce alkali metal. In some examples, alkali metal precursor includes $BaN_6$ and an alkali chloride, which can react to form BaCl, $N_2$, and alkali metal in response to heating. In some examples, the fluid can further comprise a reducing agent such as barium azide, calcium, zirconium, or aluminum. Examples of suitable solvents include, but are not limited to, tetrahydrofuran (THF), N-methyl-2-pyrrolidone (NMP), dimethylformamide (DMF), N-methylformamide, formamide, dimethyl sulfoxide (DMSO), dimethylacetamide, dichloromethane ($CH_2Cl_2$), ethylene glycol, polyethylene glycol, glycerol, alkane diol, tetraglyme, propylene carbonate, diglyme, dimethoxyethane, ethanol, methanol, propanol, isopropanol, water, acetonitrile, chloroform, acetone, hexane, heptane, toluene, xylene, methyl acetate, ethyl acetate, and combinations thereof. In some examples, the solvent comprises water such that the fluid comprises an aqueous solution comprising the alkali metal precursor.

The methods can, for example, comprise drying the fluid 2500, for example by evaporating the solvent, thereby forming a residue 2520 comprising the alkali metal precursor as a solid. Wherein, upon drying the liquid 2500, the residue 2520 comprising the alkali metal precursor as a solid is stable (e.g., stable at room temperature).

In some examples, the methods can further comprise making the first cavity 2310, the set of second cavities 2312, the set of third cavities 2316, and the set of grooves 2314 in second layer 2300. The first cavity 2310, the set of second cavities 2312, the set of third cavities 2316, and the set of grooves 2314 can be patterned in the second layer 2300 using standard techniques known in the art, such as lithographic patterning, etching, micromachining, deep reactive ion etching, direct laser ablation, and the like. In some examples, the methods can further comprise disposing the second layer 2300 on the first layer 2200. In some examples, the methods can further comprise bonding the first layer 2200 and the second layer 2300. For example, the first layer 2200 can be bonded to the second layer 2300 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

In some examples, the devices 2100 further comprise a third layer 2610 having a top surface 2612 and a bottom surface 2614 opposite and spaced apart from the top surface 2612. In some examples, the top surface 2612 and the bottom surface 2614 of the third layer 2610 are substantially parallel to each other.

The third layer 2610 can comprise any material consistent with the methods, devices, and systems disclosed herein. In some examples, the third layer 2610 can comprise a dielectric, a semiconductor, a ceramic, a transparent conducing oxide, a polymer, a metal, or a combination thereof. Examples of third layers 2610 include, but are not limited to, glass, quartz, Pyrex, fused silica, silicon dioxide, silicon nitride, sapphire, a polymer (e.g., polycarbonate), and combinations thereof. In some examples, the third layer 2610 can be transparent. As used herein, a "transparent layer" is meant to include any layer that is transparent at the wavelength or wavelength region of interest. In some examples, the third layer 2610 comprises glass (e.g., aluminosilicate glass, borosilicate glass, etc.).

The third layer 2610 has an average thickness, the average thickness being the average dimension from the top surface 2612 to the bottom surface 2614. The average thickness of the third layer 2610 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the third layer 2610 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the third layer 2610 can range from any of the minimum values described above to any of the maximum values described above. For example, the average thickness of the third layer 2610 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 2612 and the bottom surface 2614 of the third layer 2610 can, independently, be any shape. In some examples, the top surface 2612 and the bottom surface 2614 of the third layer 2610 can, independently, be substantially circular, ovate, ovoid, elliptic, triangular, rectangular, polygonal, etc. In some examples, the top surface 2612 and the bottom surface 2614 of the third layer 2610 can be substantially the same shape. In some examples, the top surface 2612 and the bottom surface 2614 of the third layer 2610 can be substantially circular.

The third layer 2610 has an average lateral dimension (e.g., diameter when the third layer 2610 is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the third layer 2610 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the third layer 2610 can range from any of the minimum values described above to any of the maximum values described above. For example, the average lateral dimension of the third layer 2610 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

The methods disclosed herein can, for example, further comprise, disposing the third layer 2610 on the second layer 2300 after the fluid 2500 has dried to form the residue 2510.

Referring now to FIG. 43-FIG. 46, the third layer 2610 is disposed on the second layer 2300, such that the bottom surface 2614 of the third layer 2610 is disposed on the top surface 2302 of the second layer 2300, such that the bottom surface 2614 of the third layer 2610 encloses the open top of the reservoir 2410, the set of receptacles 2412, and the set of containers 2416. In some examples, the third layer 2610 is disposed on the second layer 2300, such that the bottom surface 2614 of the third layer 2610 is disposed on and in physical contact with the top surface 2302 of the second layer 2300. In some examples, the top surface 2612 and the bottom surface 2614 of the third layer 2610, the top surface 2302 and the bottom surface 2304 of the second layer 2300, and the top surface 2202 and the bottom surface 2204 of the first layer 2200 are all substantially parallel to each other in the device.

The methods disclosed herein comprise, for example, comprise subjecting the residue 2510 to a reaction stimulus, thereby forming an alkali metal vapor, which forms a condensate 2520 on the portion of the bottom surface of the third layer 2610 above the set of receptacles 2412. The alkali metal vapor can comprise, for example, potassium, rubidium, cesium, or a combination thereof. The reaction stimulus can, for example, comprise heating the residue 2510 at an elevated temperature, irradiating the residue 2510 with ultraviolet radiation, electrolyzing the residue 2510, a diffusive stimulus, or a combination thereof. The methods can further comprise laterally shifting the third layer 2610 relative to the first layer 2200 and second layer 2300, such that the condensate 2520 is aligned within the set of containers 2416.

In some examples, the methods described herein can be used to form a plurality of alkali metal vapor cells on a single wafer simultaneously in parallel (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more).

In some examples, the methods can further comprise separating one or more of the sealed containers (e.g., one or more of the alkali metal vapor cells) from the others without disrupting the seal. In some examples, the methods can further comprise separating each of the sealed containers (e.g., each of the alkali metal vapor cells) from one another without disrupting the seal. The sealed containers can be separated using methods known in the art, such as, for example, dicing, laser cutting, abrasive machining, chemical etching, micromachining, etc.

One or more of the method steps can, for example, be carried out either under vacuum or in a buffer-gas (e.g., anaerobic) environment, consistent with the requirements for application of the sealed containers in an atomic clock or magnetometer.

Figure 47:
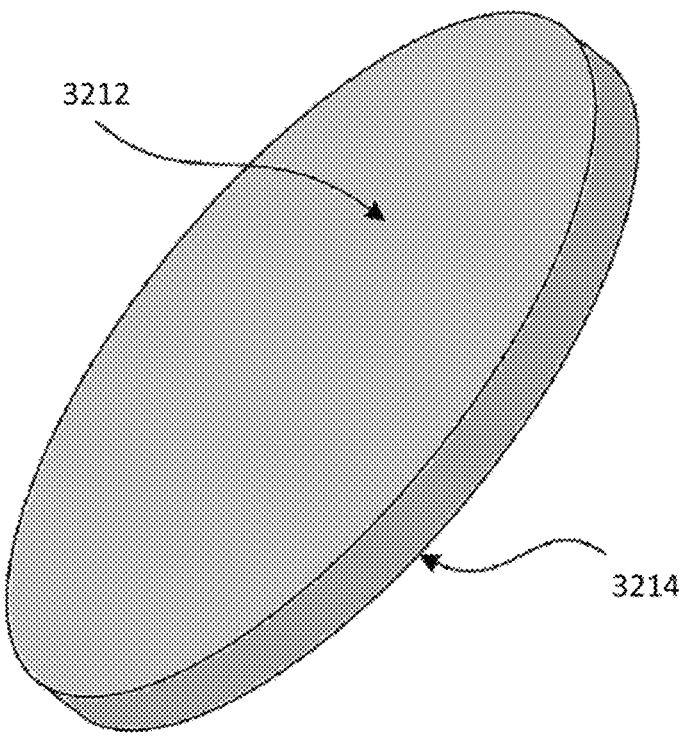
FIG. 47 is a schematic illustration of an example first layer as disclosed herein according to one implementation.
Figure 48:
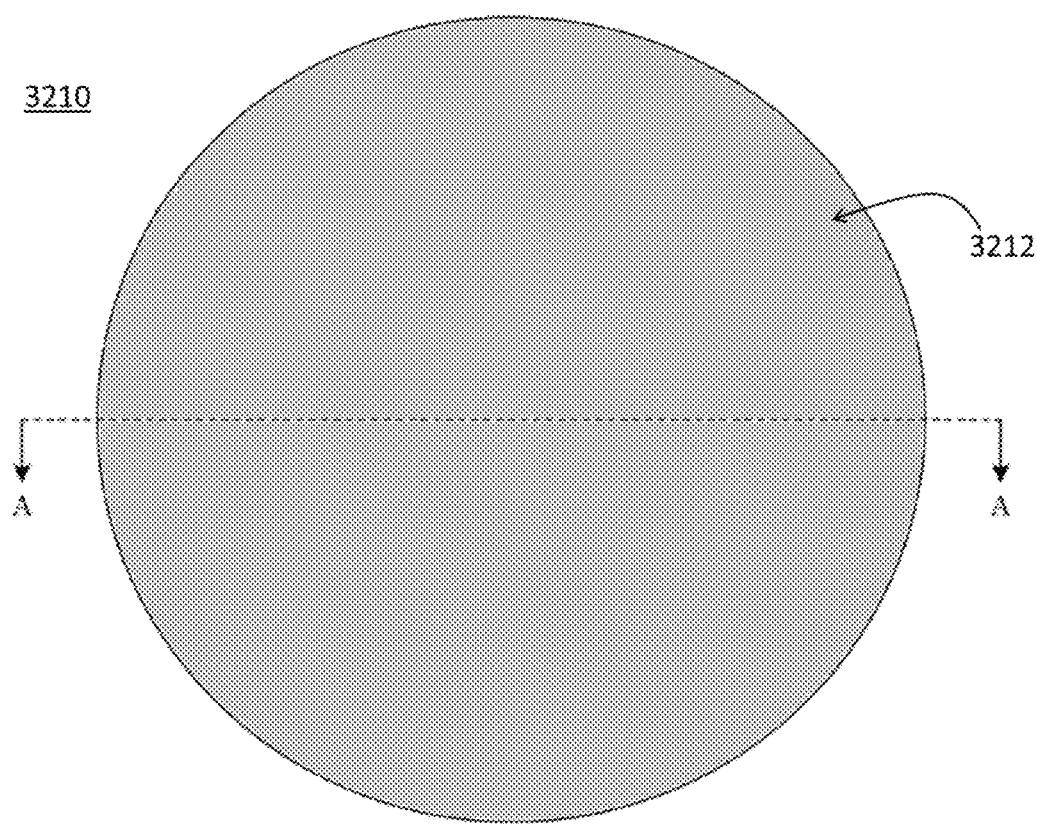
FIG. 48 is a is a schematic plan view of the example first layer shown in FIG. 47.
Figure 49:
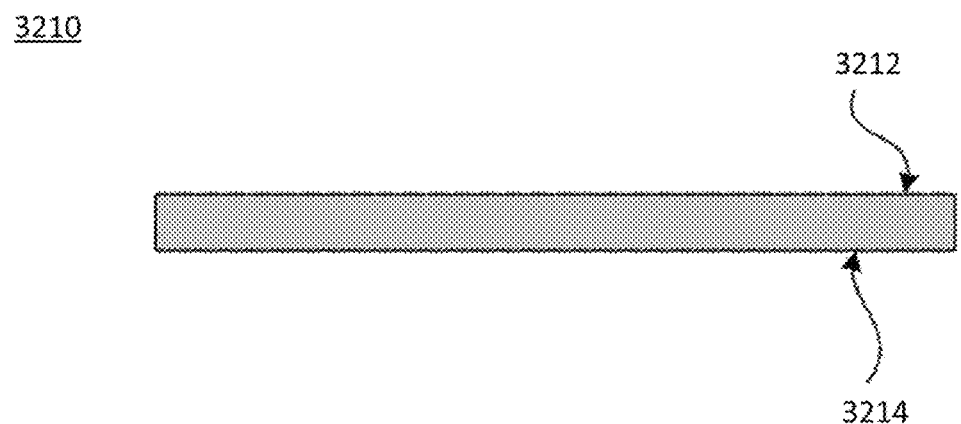
FIG. 49 is a cross-sectional plan view along line A-A in FIG. 48 of the example first layer shown in FIG. 47 and FIG. 48.

Referring now to FIG. 47-FIG. 49, also disclosed herein are devices comprising a first layer 3210 having a top surface 3212 and a bottom surface 3214 opposite and spaced apart from the top surface 3212. In some examples, the top surface 3212 and the bottom surface 3214 of the first layer 3210 are substantially parallel to each other.

The first layer 3210 can comprise any material consistent with the methods, devices, and systems disclosed herein. In some examples, the first layer 3210 can comprise a dielectric, a semiconductor, a ceramic, a transparent conducing oxide, a polymer, a metal, or a combination thereof. Examples of first layers 3210 include, but are not limited to, glass, quartz, Pyrex, fused silica, silicon dioxide, silicon nitride, sapphire, a polymer (e.g., polycarbonate), and combinations thereof. In some examples, the first layer 3210 can be transparent. As used herein, a "transparent layer" is meant to include any layer that is transparent at the wavelength or wavelength region of interest. In some examples, the first layer 3210 comprises glass (e.g., aluminosilicate glass, borosilicate glass, etc.).

The first layer 3210 has an average thickness, the average thickness being the average dimension from the top surface 3212 to the bottom surface 3214. The average thickness of the first layer 3210 can, for example be 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the first layer 3210 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average thickness of the first layer 3210 can range from any of the minimum values described above to any of the maximum values described above. For example, the average thickness of the first layer 3210 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 3212 and the bottom surface 3214 of the first layer 3210 can, independently, be any shape. In some examples, the top surface 3212 and the bottom surface 3214 of the first layer 3210 can, independently, be substantially circular, ovate, ovoid, elliptic, triangular, rectangular, polygonal, etc. In some examples, the top surface 3212 and the bottom surface 3214 of the first layer 3210 can be substantially the same shape. In some examples, the top surface 3212 and the bottom surface 3214 of the first layer 3210 can be substantially circular.

The first layer 3210 has an average lateral dimension (e.g., diameter when the first layer 3210 is a circular wafer) of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the first layer 3210 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average lateral dimension of the first layer 3210 can range from any of the minimum values described above to any of the maximum values described above. For example, the average lateral dimension of the first layer 3210 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

The devices further comprise a second layer 3320 having a top surface 3322 and a bottom surface 3324 opposite and spaced apart from the top surface. In some examples, the top surface 3322 and the bottom surface 3324 of the second layer 3320 are substantially parallel to each other.

The second layer 3320 can comprise any material consistent with the methods, devices, and systems disclosed herein. In some examples, the second layer 3320 can comprise a dielectric, a semiconductor, a ceramic, a transparent conducting oxide, a polymer, a metal, or a combination thereof. Examples of second layers 3320 include, but are not limited to, silicon, glass (e.g. aluminum coated glass), sapphire, a ceramic, and combinations thereof. In some examples, the second layer 3320 comprises silicon. In some examples, the second layer 3320 is hydrophilic.

The second layer 3320 has an average thickness, the average thickness being the average dimension from the top surface 3322 to the bottom surface 3324. The average thickness of the second layer 3320 can, for example be 1 micrometer (micron, μm) or more (e.g., 2 μm or more, 3 μm or more, 4 μm or more, 5 μm or more, 6 μm or more, 7 μm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the second layer 3320 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (µm) or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average thickness of the second layer 3320 can range from any of the minimum values described above to any of the maximum values described above. For example, the average thickness of the second layer 3320 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 3322 and the bottom surface 3324 of the second layer 3320 can, independently, be any shape. In some examples, the top surface 3322 and the bottom surface 3324 of the second layer 3320 can, independently, be substantially circular, ovate, ovoid, elliptic, triangular, rectangular, polygonal, etc. In some examples, the top surface 3322 and the bottom surface 3324 of the second layer 3320 can be substantially the same shape. In some examples, the top surface 3322 and the bottom surface 3324 of the second layer 3320 can be substantially circular.

In some examples, the top surface 3212 and the bottom surface 3214 of the first layer 3210 and the top surface 3322 and the bottom surface 3324 of the second layer 3320 are all substantially circular.

The second layer 3320 has an average lateral dimension (e.g., diameter when the second layer 3320 is a circular wafer) 1 micrometer (micron, µm) or more (e.g., 2 µm or more, 3 µm or more, 4 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the second layer 3320 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (µm) or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less).

The average lateral dimension of the second layer 3320 can range from any of the minimum values described above to any of the maximum values described above. For example, the average lateral dimension of the second layer 3320 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm). In some examples, the average lateral dimension of the second layer 3320 and the average lateral dimension of the first layer 3210 are substantially equal.

Figure 50:
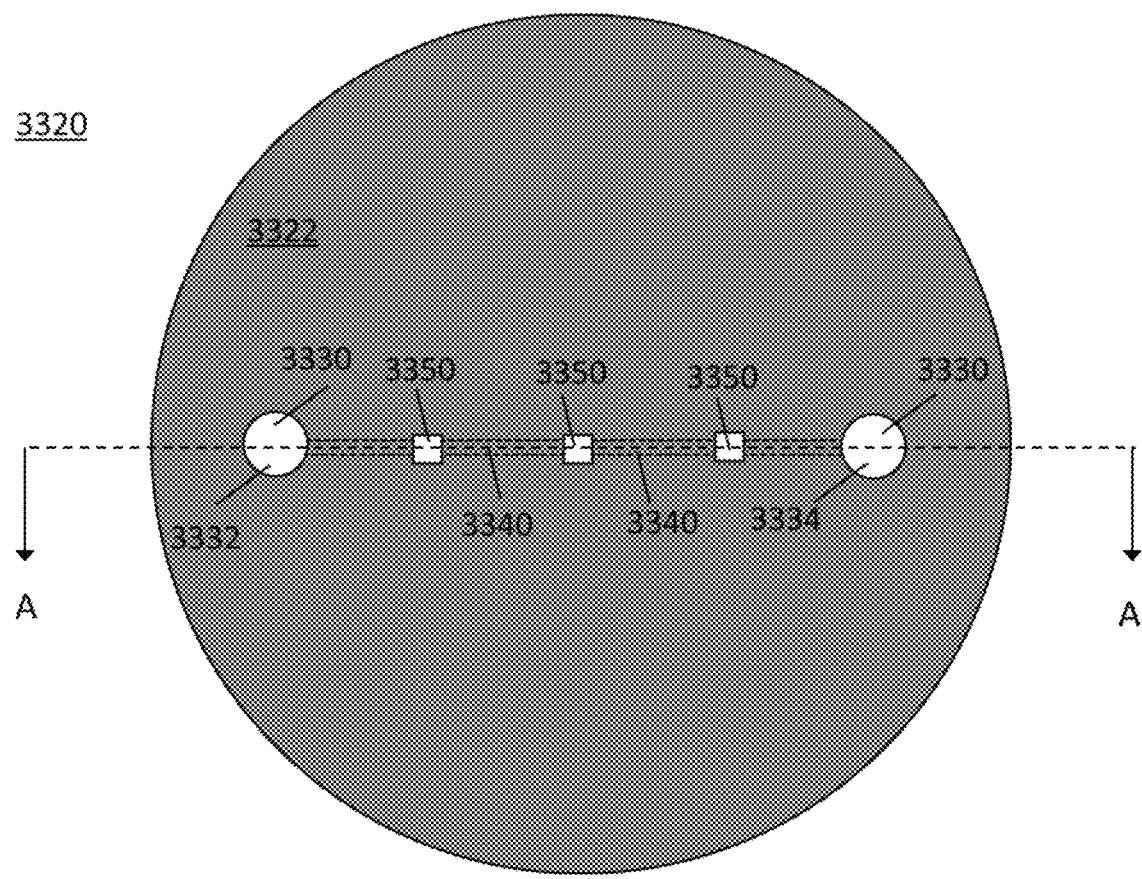
FIG. 50 is a schematic plan view of an example second layer as disclosed herein according to one implementation.
Figure 51:
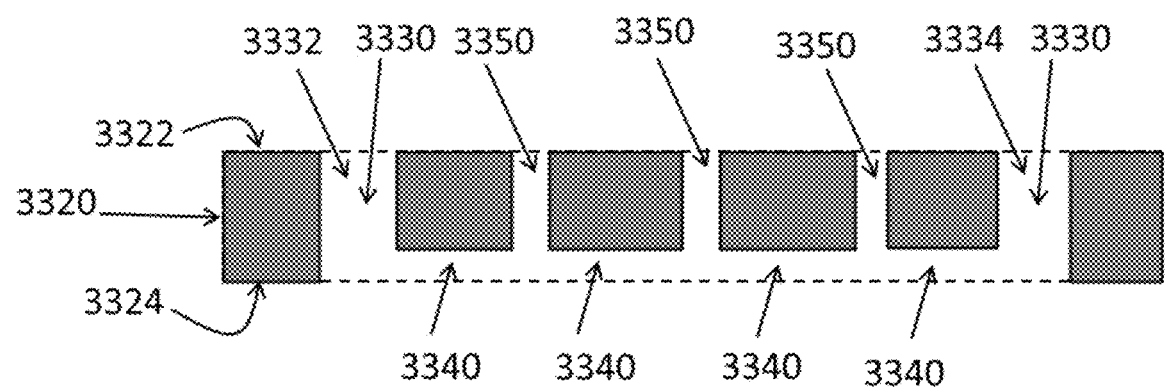
FIG. 51 is a cross-sectional plan view along line A-A in FIG. 50 of the example second layer.

Referring now to FIG. 50-FIG. 51, the second layer 3320 comprises a set of first cavities 3330, a groove 3340, and a set of second cavities 3350; wherein the set of first cavities 3330 comprise an inlet shaft 3332 and an outlet shaft 3334, wherein the inlet shaft 3332 and the outlet shaft 3334 each perforates the second layer 3320 from the top surface 3322 to the bottom surface 3324; wherein each of the second cavities 3350 perforates the second layer 3320 from the top surface 3322 to the bottom surface 3324; wherein the groove 3340 extends from the inlet shaft 3332 to the outlet shaft 3334 along the bottom surface 3324 of the second layer 3320; and wherein the inlet shaft 3332, the outlet shaft 3334, and each of the second cavities 3350 are in fluid communication with the groove 3340.

The inlet shaft 3332 has a central longitudinal axis and a cross-sectional shape in a plane perpendicular to the central longitudinal axis of said shaft 3332, wherein the cross-sectional shape can be any shape, such as a regular shape, an irregular shape, an isotropic shape, or an anisotropic shape. In some examples, the cross-sectional shape of the inlet shaft 3332 can be substantially circular, ovate, ovoid, elliptic, triangular, rectangular, polygonal, etc. In some examples, the cross-sectional shape of the inlet shaft 3332 can be substantially circular, as shown in FIG. 50. In some examples, the central longitudinal axis of the inlet shaft 3332 is substantially perpendicular to the bottom surface 3324 of the second layer 3320 (e.g., such that the cross-sectional shape is in a plane substantially parallel to the bottom surface 3324 of the second layer 3320).

The inlet shaft 3332 can have an average characteristic dimension. The term "characteristic dimension," as used herein refers to the largest straight line distance between two points in the plane of the cross-sectional shape of the inlet shaft 3332 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension. For example, for a cylindrical inlet shaft 3332, the cross-sectional shape can be substantially circular and the average characteristic dimension can refer to the diameter. In some examples, the average characteristic dimension of the inlet shaft 3332 can be substantially the same for the entire thickness. In some examples, the average characteristic dimension of the inlet shaft 3332 can vary with the thickness (e.g., tapered or stepped).

The inlet shaft 3332 can have an average characteristic dimension of 1 micrometer (micron, µm) or more (e.g., 2 µm or more, 3 µm or more, 4 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the inlet shaft 3332 can have an average characteristic dimension of 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (µm) or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average characteristic dimension of the inlet shaft 3332 can range from any of the minimum values described above to any of the maximum values described above. For example, the average characteristic dimension of the inlet shaft 3332 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, from 10 µm to 1 mm, from 100 µm to 10 mm, from or 100 µm to 1 mm).

The outlet shaft 3334 has a central longitudinal axis and a cross-sectional shape in a plane perpendicular to the central longitudinal axis of said shaft 3334, wherein the cross-sectional shape can be any shape, such as a regular shape, an irregular shape, an isotropic shape, or an anisotropic shape. In some examples, the cross-sectional shape of the outlet shaft 3334 can be substantially circular, ovate, ovoid, elliptic, triangular, rectangular, polygonal, etc. In some examples, the cross-sectional shape of the outlet shaft 3334 can be substantially circular, as shown in FIG. 50. In some examples, the cross-sectional shape of each of the first cavities 3330 is the same. In some examples, the cross-sectional shape of the inlet shaft 3332 can be the same as the cross-sectional shape of the outlet shaft 3334. In some examples, the cross-sectional shape of the inlet shaft 3332 can be different than the cross-sectional shape of the outlet shaft 3334.

In some examples, the central longitudinal axis of the outlet shaft 3334 is substantially perpendicular to the bottom surface 3324 of the second layer 3320 (e.g., such that the cross-sectional shape is in a plane substantially parallel to the bottom surface 3324 of the second layer 3320). In some examples, the central longitudinal axis of the inlet shaft 3332 and the central longitudinal axis of the outlet shaft 3334 are substantially parallel.

The outlet shaft 3334 can have an average characteristic dimension. The term "characteristic dimension," as used herein refers to the largest straight line distance between two points in the plane of the cross-sectional shape of the outlet shaft 3334 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension. For example, for a cylindrical outlet shaft 3334, the cross-sectional shape can be substantially circular and the average characteristic dimension can refer to the diameter. In some examples, the average characteristic dimension of the outlet shaft 3334 can be substantially the same for the entire thickness. In some examples, the average characteristic dimension of the outlet shaft 3334 can vary with the thickness (e.g., tapered or stepped).

The outlet shaft 3334 can have an average characteristic dimension of 1 micrometer (micron, µm) or more (e.g., 2 µm or more, 3 µm or more, 4 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the outlet shaft 3334 can have an average characteristic dimension of 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average characteristic dimension of the outlet shaft 3334 can range from any of the minimum values described above to any of the maximum values described above. For example, the average characteristic dimension of the outlet shaft 3334 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm). In some examples, the average characteristic dimension of the inlet shaft 3332 and the average characteristic dimension of the outlet shaft 3334 are substantially equal.

As used herein, "a set of second cavities 3350" and "the set of second cavities 3350" are meant to include any number of second cavities 3350 in any arrangement. Thus, for example, "a set of second cavities 3350" includes one or more second cavities 3350 (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of second cavities 3350 can comprise a plurality of second cavities 3350. In some examples, the set of second cavities 3350 comprises a plurality of second cavities 3350 in an ordered array.

Each of the set of second cavities 3350 has a central longitudinal axis and a cross-sectional shape in a plane perpendicular to the central longitudinal axis of said cavity 3350, wherein the cross-sectional shape can be any shape, such as a regular shape, an irregular shape, an isotropic shape, or an anisotropic shape. In some examples, the cross-sectional shape of each of the set of second cavities 3350 can be substantially circular, ovate, ovoid, elliptic, triangular, rectangular, polygonal, etc. In some examples, the cross-sectional shape of each of the set of second cavities 3350 is substantially the same. In some examples, the cross-sectional shape of the set of second cavities can be substantially circular. In some examples, the cross-sectional shape of the set of second cavities 3350 can be substantially rectangular, as shown in FIG. 50. In some examples, the cross-sectional shape of each of the set of second cavities 3350 is the same. In some examples, the cross-sectional shape of the set of second cavities 3350 can be the same as the cross-sectional shape of the set of first cavities 3330. In some examples, the cross-sectional shape of the set of second cavities 3350 can be different than the cross-sectional shape of the set of first cavities 3330.

In some examples, the central longitudinal axis of each of the set of second cavities 3350 are substantially parallel to each other. In some examples, the central longitudinal axis of each of the set of second cavities 3350 are substantially parallel to the central longitudinal axis of the inlet shaft 3332. In some examples, the central longitudinal axis of each of the set of second cavities 3350 are substantially parallel to the central longitudinal axis of the outlet shaft 3334. In some examples, the central longitudinal axis of each of the set of second cavities 3350, the central longitudinal axis of the inlet shaft 3332, and the central longitudinal axis of the outlet shaft 3334 are all substantially parallel to one another. In some examples, the central longitudinal axis of each of the set of second cavities 3350 is substantially perpendicular to the bottom surface 3324 of the second layer 3320 (e.g., such that the cross-sectional shape is in a plane substantially parallel to the bottom surface 3324 of the second layer 3320).

The set of second cavities 3350 can have an average characteristic dimension. The term "characteristic dimension," as used herein refers to the largest straight line distance between two points in the plane of the cross-sectional shape of each of the second cavities 3350 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of second cavities 3350, the cross-sectional shape can be substantially circular and the average characteristic dimension can refer to the average diameter. In some examples, the average characteristic dimension of the set of second cavities 3350 can be substantially the same for the entire thickness. In some examples, the average characteristic dimension of the set of second cavities 3350 can vary with the thickness (e.g., tapered or stepped).

The set of second cavities 3350 can have an average characteristic dimension of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the set of second cavities 3350 can have an average characteristic dimension of 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average characteristic dimension of the set of second cavities 3350 can range from any of the minimum values described above to any of the maximum values described above. For example, the average characteristic dimension of the set of second cavities 3350 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, from 10 µm to 1 mm, from 100 µm to 10 mm, from or 100 µm to 1 mm).

In some examples, the average characteristic dimension of each of the set of second cavities 3350 is substantially the same (e.g., the average characteristic dimension of each of the set of second cavities 3350 is substantially the same as the average characteristic dimension of the set of second cavities 3350). In some examples, the average characteristic dimension of the set of second cavities 3350 is less than or equal to the average characteristic dimension of the inlet shaft 3332 and/or the outlet shaft 3334.

The groove 3340 traverses the bottom surface 3324 of the second layer 3320 from the inlet shaft 3332 to the outlet shaft 3334, intersecting with each of the second cavities 3350 therebetween. In some examples, the groove 3340 traverses the bottom surface 3324 of the second layer 3320 from the inlet shaft 3332 to the outlet shaft 3334, intersecting with each of the second cavities 3350 sequentially therebetween.

Figure 52:
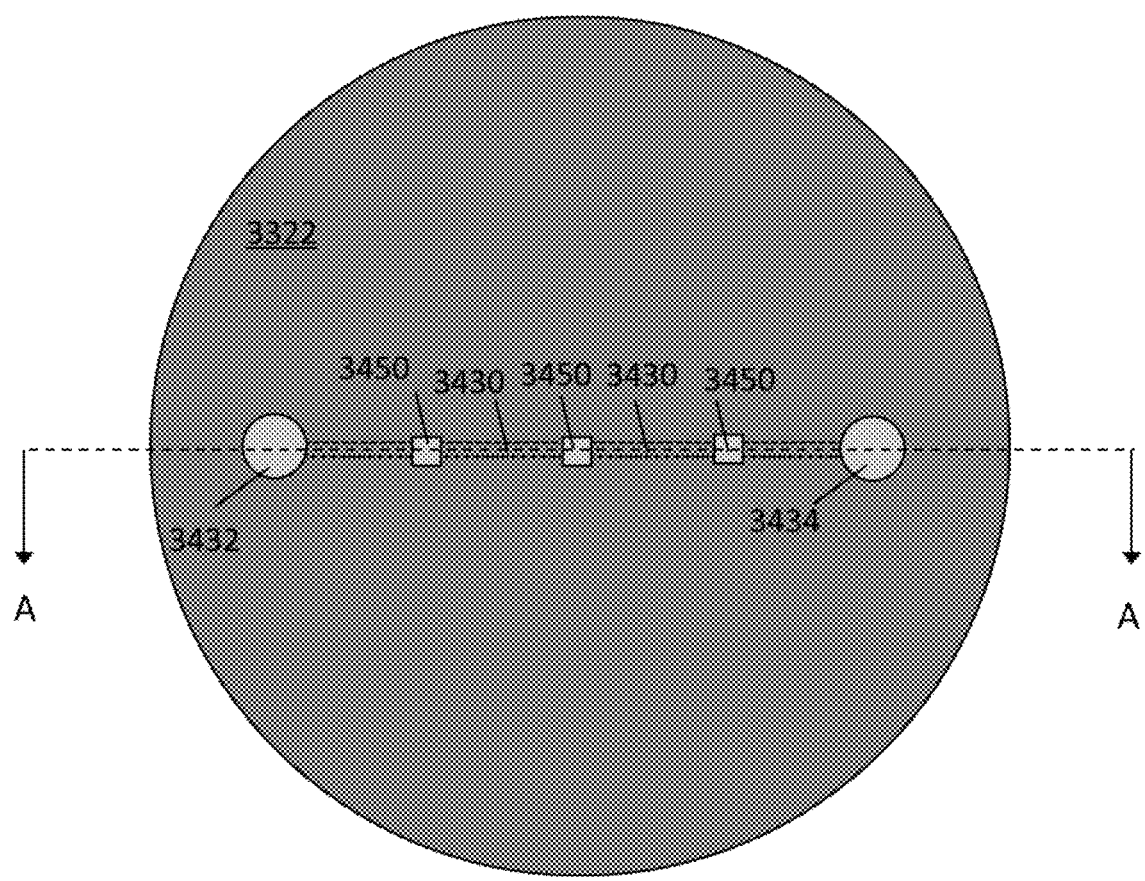
FIG. 52 is a schematic plan view of an example device as disclosed herein according to one implementation.
Figure 53:
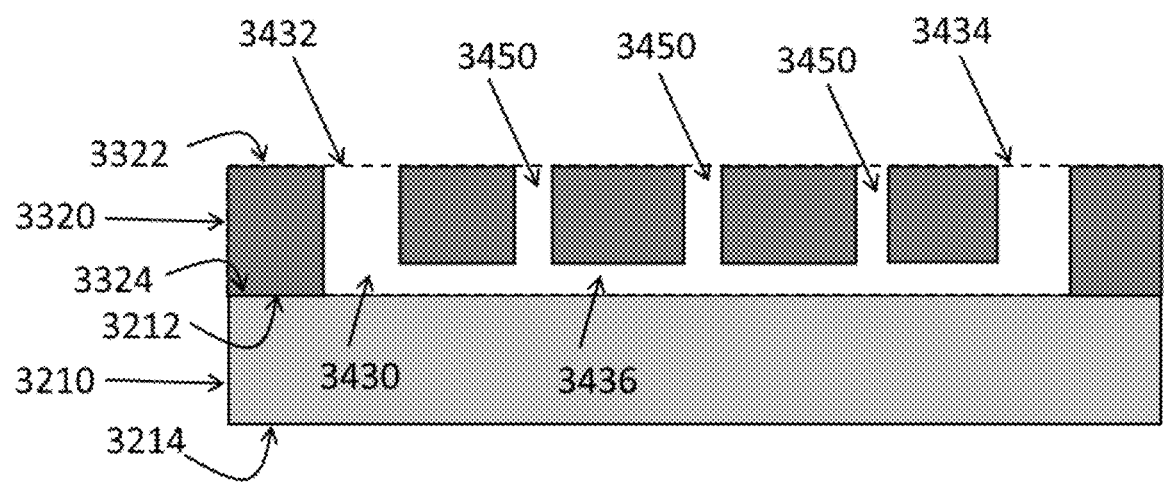
FIG. 53 is a cross-sectional plan view along line A-A in FIG. 52 of the example device.
Figure 54:
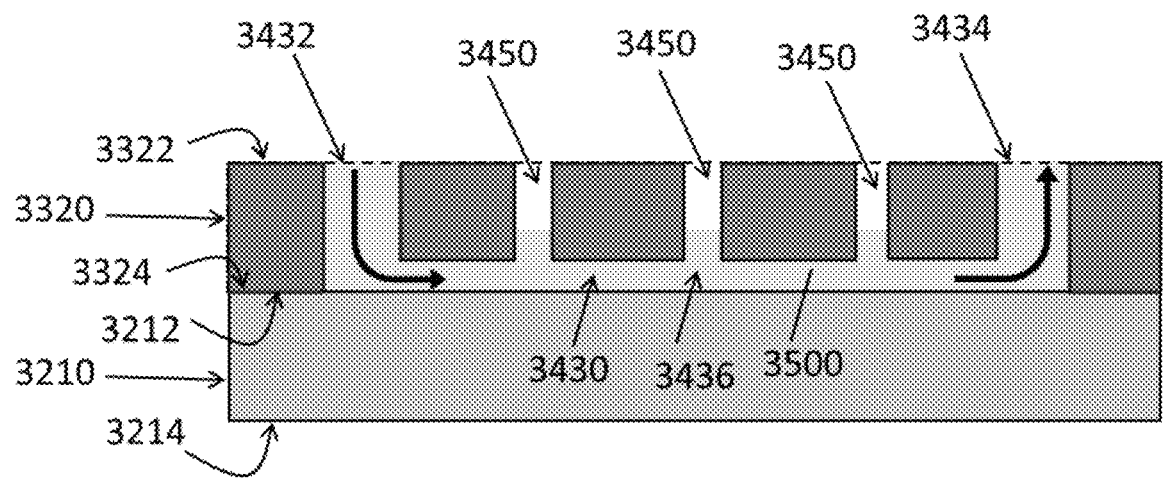
FIG. 54 is a cross-sectional plan view of the example device along line A-A in FIG. 52 wherein the example device includes a fluid according to one example implementation.

Referring now to FIG. 52-FIG. 54, the second layer 3320 is disposed on the first layer 3210 in the device 3120, such that the bottom surface 3324 of the second layer 3320 is disposed on the top surface 3212 of the first layer 3210; wherein the inlet shaft 3332, the outlet shaft 3334, and the groove 3340 together with the top surface 3212 of the first layer 3210 defines a main conduit 3430 having a longitudinal axis, an inlet 3432, an outlet 3434 axially spaced apart from the inlet 3432, and a lumen 3436 for fluid flow extending from the inlet 3432 to the outlet 3434; wherein the set of second cavities 3350 together with the top surface 3212 of the first layer 3210 defines a set of receptacles 3450; and wherein each of the receptacles 3450 is in fluid communication with the lumen 3436 of the main conduit 3430; such that, when a fluid 3500 flows from the inlet 3432 to the outlet 3434 through the lumen 3436 of the main conduit 3430, the fluid 3500 further flows into each of the receptacles 3450 via capillary action, such that the fluid 3500 at least partially fills each of the receptacles 3450.

The inlet 3432, the outlet 3434, and the set of receptacles 3450 each have an open top (e.g., open at the top surface 3322 of the second layer 3320). In some examples, the top surface 3212 and the bottom surface 3214 of the first layer 3210 and the top surface 3322 and the bottom surface 3324 of the second layer 3320 are all substantially parallel to each other. In some examples, the second layer 3320 is disposed on the first layer 3210, such that the bottom surface 3324 of the second layer 3320 is disposed on and in physical contact with the top surface 3212 of the first layer 3210. In some examples, the first layer 3210 is bonded to the second layer 3320. For example, the first layer 3210 can be bonded to the second layer 3320 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein comprise, for example, flowing a fluid 3500 from the inlet 3432 to the outlet 3434 through the lumen 3436 of the main conduit 3430, such that the fluid 3500 further flows into each of the receptacles 3450 via capillary action and the fluid 3500 at least partially fills each of the receptacles 3450.

The fluid 3500 can, for example, comprise an alkali metal precursor and a solvent. The alkali metal precursor can, for example, comprise any compound or composition capable of reacting to form a free alkali metal. The alkali metal precursor can, for example, comprise an alkali metal compound, wherein the alkali metal can include an alkali atom, an alkaline earth atom, a lanthanide, an actinide, or combinations thereof. In some examples, the alkali metal precursor can, for example, comprise an alkali metal compound, wherein the alkali metal can include potassium (K), rubidium (Rb), cesium (Cs), or a combination thereof. The alkali metal precursor can, for example, comprise an alkali halide (e.g., an alkali chloride), an azide, a chromate, a molibdate, or a combination thereof. Exemplary alkali halides include RbCl, CsCl, KCl, RbBr, CsBr, KBr, and the like. Exemplary alkali azides include $RbN_3$, $CsN_3$, $KN_3$, and the like. In some examples, the alkali metal precursor can include $RbN_3$, $CsN_3$, $KN_3$ that can produce alkali metal in response to being subjected to ultraviolet light. Alkali halides can, for example, be reacted with $BaN_6$ or Ca to produce alkali metal. In some examples, alkali metal precursor includes $BaN_6$ and an alkali chloride, which can react to form BaCl, $N_2$, and alkali metal in response to heating. In some examples, the fluid can further comprise a reducing agent such as barium azide, calcium, zirconium, or aluminum. Examples of suitable solvents include, but are not limited to, tetrahydrofuran (THF), N-methyl-2-pyrrolidone (NMP), dimethylformamide (DMF), N-methylformamide, formamide, dimethyl sulfoxide (DMSO), dimethylacetamide, dichloromethane ($CH_2Cl_2$), ethylene glycol, polyethylene glycol, glycerol, alkane diol, tetraglyme, propylene carbonate, diglyme, dimethoxyethane, ethanol, methanol, propanol, isopropanol, water, acetonitrile, chloroform, acetone, hexane, heptane, toluene, xylene, methyl acetate, ethyl acetate, and combinations thereof. In some examples, the solvent comprises water such that the fluid comprises an aqueous solution comprising the alkali metal precursor.

The methods can, for example, comprise drying the fluid 3500, for example by evaporating the solvent, thereby forming a residue 3520 comprising the alkali metal precursor as a solid. Wherein, upon drying the liquid 3500, the residue 3520 comprising the alkali metal precursor as a solid is stable (e.g., stable at room temperature).

In some examples, the methods can further comprise making the set of first cavities 3330, the groove 3340, and the set of second cavities 3350 in second layer 3320. The set of first cavities 3330, the groove 3340, and the set of second cavities 3350 can be patterned in the second layer using standard techniques known in the art, such as lithographic patterning, etching, micromachining, deep reactive ion etching, direct laser ablation, and the like. In some examples, the methods can further comprise disposing the second layer 3320 on the first layer 3210. In some examples, the methods can further comprise bonding the first layer 3210 and the second layer 3320. For example, the first layer 3210 can be bonded to the second layer 3320 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

Figure 55:
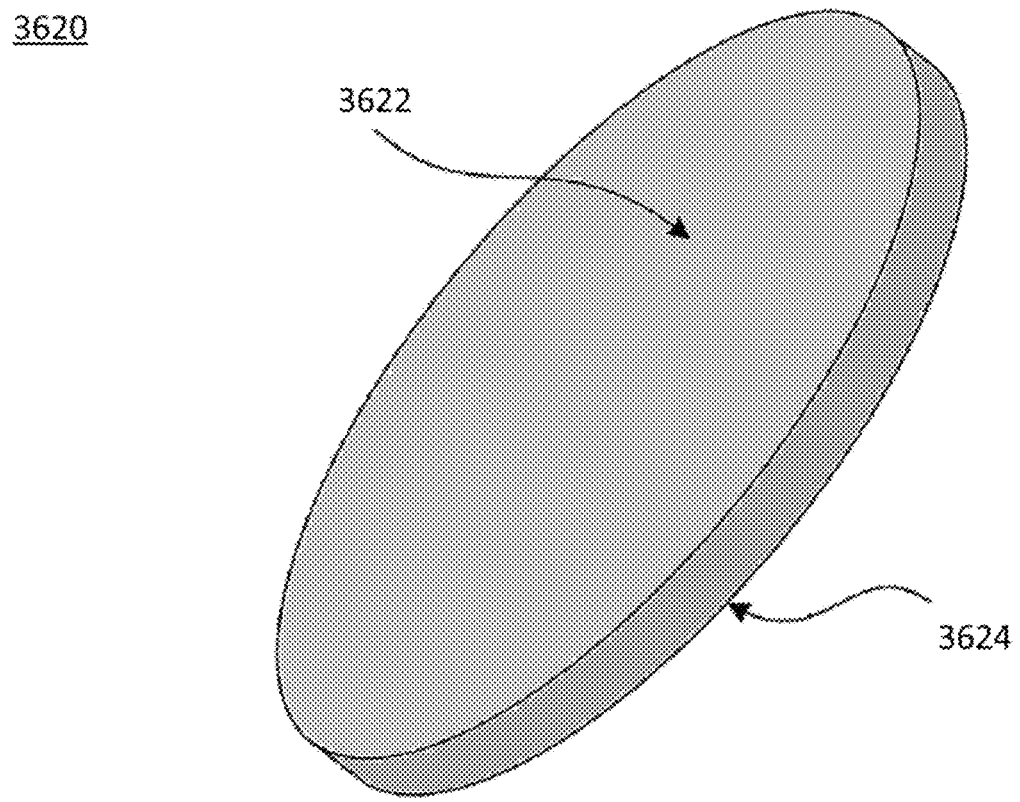
FIG. 55 is a schematic illustration of an example third layer as disclosed herein according to one implementation.
Figure 56:
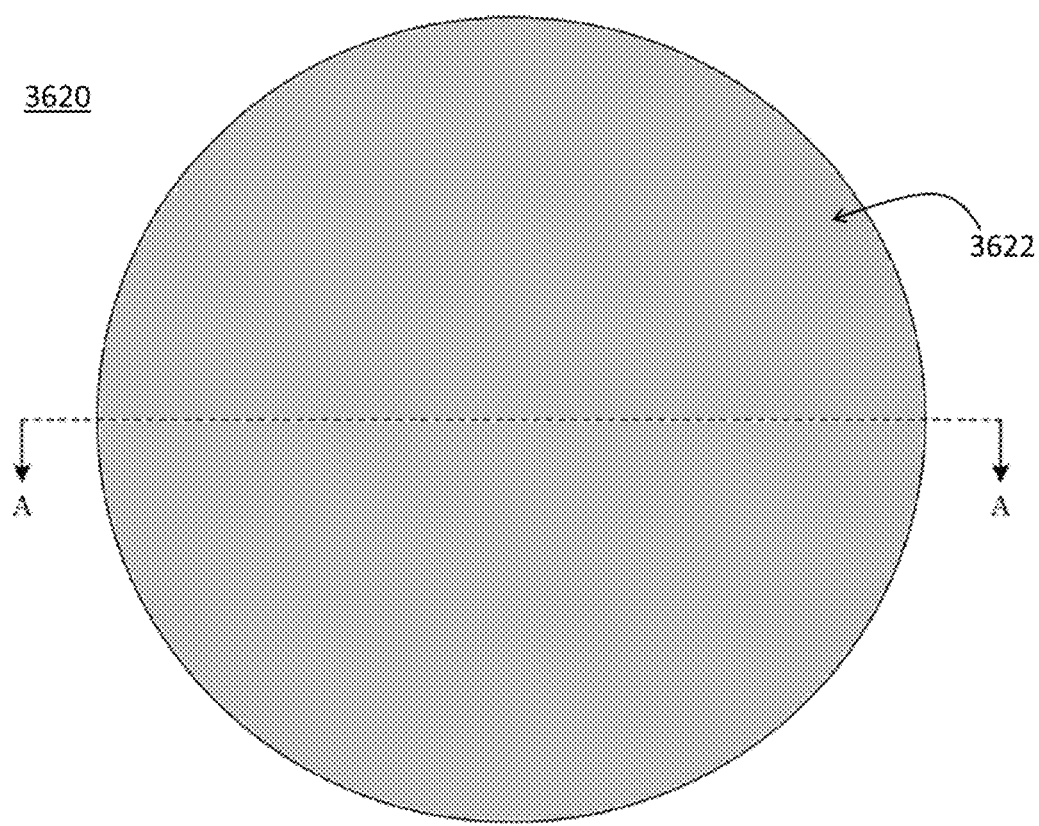
FIG. 56 is a is a schematic plan view of the example third layer shown in FIG. 55.
Figure 57:
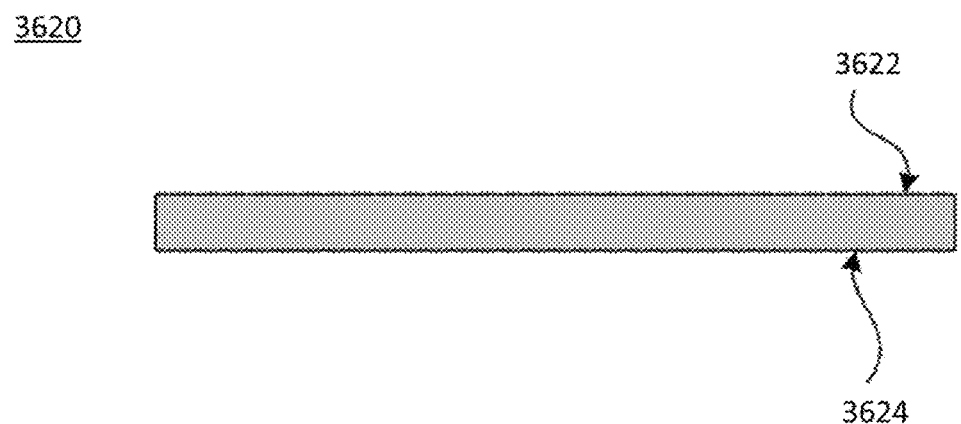
FIG. 57 is a cross-sectional plan view along line A-A in FIG. 56 of the example third layer shown in FIG. 55 and FIG. 56.

Also disclosed herein are vapor cell preforms. Referring now to FIG. 55-FIG. 57, the vapor cell preforms can comprise a third layer 3620 having a top surface 3622 and a bottom surface 3624 opposite and spaced apart from the top surface 3622. In some examples, the top surface 3622 and the bottom surface 3624 of the third layer 3620 are substantially parallel to each other.

The third layer 3620 can comprise any material consistent with the methods, devices, and systems disclosed herein. In some examples, the third layer 3620 can comprise a dielectric, a semiconductor, a ceramic, a transparent conducing oxide, a polymer, a metal, or a combination thereof. Examples of third layers 3620 include, but are not limited to, glass, quartz, Pyrex, fused silica, silicon dioxide, silicon nitride, sapphire, a polymer (e.g., polycarbonate), and combinations thereof. In some examples, the third layer 3620 can be transparent. As used herein, a "transparent layer" is meant to include any layer that is transparent at the wavelength or wavelength region of interest. In some examples, the third layer 3620 comprises glass (e.g., aluminosilicate glass, borosilicate glass, etc.).

The third layer 3620 has an average thickness, the average thickness being the average dimension from the top surface 3622 to the bottom surface 3624. The average thickness of the third layer 3620 can, for example be 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the third layer 3620 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average thickness of the third layer 3620 can range from any of the minimum values described above to any of the maximum values described above. For example, the average thickness of the third layer 3620 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 3622 and the bottom surface 3624 of the third layer 3620 can, independently, be any shape. In some examples, the top surface 3622 and the bottom surface 3624 of the third layer 3620 can, independently, be substantially circular, ovate, ovoid, elliptic, triangular, rectangular, polygonal, etc. In some examples, the top surface 3622 and the bottom surface 3624 of the third layer 3620 can be substantially the same shape. In some examples, the top surface 3622 and the bottom surface 3624 of the third layer 3620 can be substantially circular.

The third layer 3620 has an average lateral dimension (e.g., diameter when the third layer 3620 is a circular wafer) of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the third layer 3620 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average lateral dimension of the third layer 3620 can range from any of the minimum values described above to any of the maximum values described above. For example, the average lateral dimension of the third layer 3620 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

The vapor cell preforms further comprise a fourth layer 3720 having a top surface 3722 and a bottom surface 3724 opposite and spaced apart from the top surface 3722. In some examples, the top surface 3722 and the bottom surface 3724 are substantially parallel to each other.

The fourth layer 3720 can comprise any material consistent with the methods, devices, and systems disclosed herein. In some examples, the fourth layer 3720 can comprise a dielectric, a semiconductor, a ceramic, a transparent conducing oxide, a polymer, a metal, or a combination thereof. Examples of fourth layers 3720 include, but are not limited to, silicon, glass (e.g. aluminum coated glass), sapphire, a ceramic, and combinations thereof. In some examples, the fourth layer 3720 comprises silicon.

The fourth layer 3720 has an average thickness, the average thickness being the average dimension from the top surface 3722 to the bottom surface 3724. The average thickness of the fourth layer 3720 can, for example be 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the fourth layer 3720 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average thickness of the fourth layer 3720 can range from any of the minimum values described above to any of the maximum values described above. For example, the average thickness of the fourth layer 3720 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 3722 and the bottom surface 3724 of the fourth layer 3720 can, independently, be any shape. In some examples, the top surface 3722 and the bottom surface 3724 of the fourth layer 3720 can, independently, be substantially circular, ovate, ovoid, elliptic, triangular, rectangular, polygonal, etc. In some examples, the top surface 3722 and the bottom surface 3724 of the fourth layer 3720 can be substantially the same shape. In some examples, the top surface 3722 and the bottom surface 3724 of the fourth layer 3720 can be substantially circular.

In some examples, the top surface 3622 and the bottom surface 3624 of the third layer 3620 and the top surface 3722 and the bottom surface 3724 of the fourth layer 3720 are all substantially circular. In some examples, the top surface 3212 and the bottom surface 3214 of the first layer 3210; the top surface 3322 and the bottom surface 3324 of the second layer 3320; the top surface 3622 and the bottom surface 3624 of the third layer 3620; and the top surface 3722 and the bottom surface 3724 of the fourth layer 3720 are all substantially circular.

The fourth layer 3720 has an average lateral dimension (e.g., diameter when the fourth layer 3720 is a circular wafer) of 1 micrometer (micron, μm) or more (e.g., 2 μm or more, 3 μm or more, 4 μm or more, 5 μm or more, 6 μm or more, 7 μm or more, 8 μm or more, 9 μm or more, 10 μm or more, 15 μm or more, 20 μm or more, 25 μm or more, 30 μm or more, 35 μm or more, 40 μm or more, 45 μm or more, 50 μm or more, 60 μm or more, 70 μm or more, 80 μm or more, 90 μm or more, 100 μm or more, 125 μm or more, 150 μm or more, 175 μm or more, 200 μm or more, 225 μm or more, 250 μm or more, 300 μm or more, 350 μm or more, 400 μm or more, 450 μm or more, 500 μm or more, 600 μm or more, 700 μm or more, 800 μm or more, 900 μm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the fourth layer 3720 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (μm) or less, 800 μm or less, 700 μm or less, 600 μm or less, 500 μm or less, 450 μm or less, 400 μm or less, 350 μm or less, 300 μm or less, 250 μm or less, 225 μm or less, 200 μm or less, 175 μm or less, 150 μm or less, 125 μm or less, 100 μm or less, 90 μm or less, 80 μm or less, 70 μm or less, 60 μm or less, 50 μm or less, 45 μm or less, 40 μm or less, 35 μm or less, 30 μm or less, 25 μm or less, 20 μm or less, 15 μm or less, 10 μm or less, 9 μm or less, 8 μm or less, 7 μm or less, 6 μm or less, 5 μm or less, 4 μm or less, 3 μm or less, or 2 μm or less). The average lateral dimension of the fourth layer 3720 can range from any of the minimum values described above to any of the maximum values described above. For example, the average lateral dimension of the fourth layer 3720 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 μm, from 1 μm to 50 mm, from 1 μm to 10 mm, from 10 μm to 300 mm, from 100 µm to 300 mm, from 1 mm to 300 mm, from 25 mm to 300 mm, or from 10 µm to 100 mm).

In some examples, the average lateral dimension of the third layer 3620 and the average lateral dimension of the fourth layer 3720 are substantially equal. In some examples, the average lateral dimension of the first layer 3210, the average lateral dimension of the second layer 3320, the average lateral dimension of the third layer 3620, and the average lateral dimension of the fourth layer 3720 are substantially equal.

Figure 58:
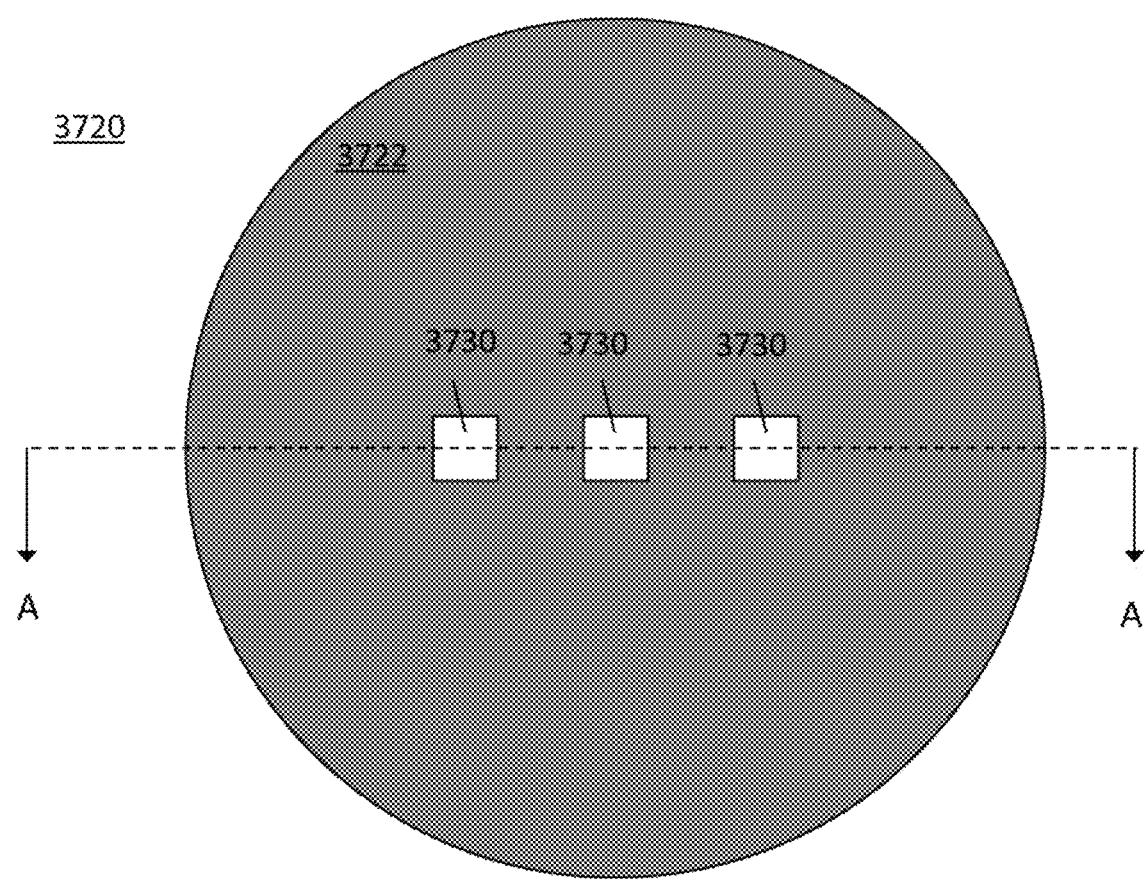
FIG. 58 is a schematic plan view of an example fourth layer as disclosed herein according to one implementation.
Figure 59:
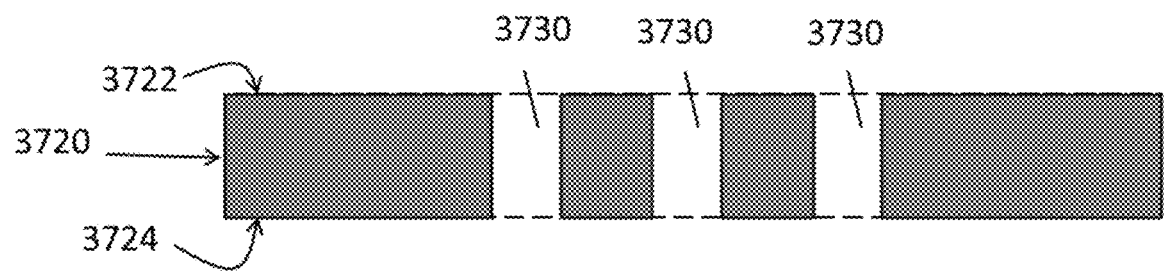
FIG. 59 is a cross-sectional plan view along line A-A in FIG. 58 of the example fourth layer.

Referring now to FIG. 58-FIG. 59, the fourth layer 3720 comprises a set of third cavities 3730, wherein each of the third cavities 3730 perforates the fourth layer 3720 from the top surface 3722 to the bottom surface 3724.

As used herein, "a set of third cavities 3730" and "the set of third cavities 3730" are meant to include any number of third cavities 3730 in any arrangement. Thus, for example, "a set of third cavities 3730" includes one or more third cavities 3730 (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of third cavities 3730 can comprise a plurality of third cavities 3730. In some examples, the set of third cavities 3730 comprises a plurality of third cavities 3730 arranged in an ordered array. In some examples, the number of third cavities 3730 is equal to the number of second cavities 3350.

Each of the set of third cavities 3730 has a central longitudinal axis and a cross-sectional shape in a plane perpendicular to the central longitudinal axis of said cavity 3730, wherein the cross-sectional shape can be any shape, such as a regular shape, an irregular shape, an isotropic shape, or an anisotropic shape. In some examples, the cross-sectional shape of each of the set of third cavities 3730 can be substantially circular, ovate, ovoid, elliptic, triangular, rectangular, polygonal, etc. In some examples, the cross-sectional shape of each of the set of third cavities 3730 is substantially the same. In some examples, the cross-sectional shape of the set of third cavities 3730 can be substantially circular. In some examples, the cross-sectional shape of the set of third cavities 3730 can be substantially rectangular, as shown in FIG. 58. In some examples, the cross-sectional shape of each of the third cavities 3730 is the same. In some examples, the cross-sectional shape of the set of third cavities 3730 can be the same as the cross-sectional shape of the set of second cavities 3350. In some examples, the cross-sectional shape of the set of third cavities 3730 can be different than the cross-sectional shape of the set of second cavities 3350.

In some examples, the central longitudinal axis of each of the set of third cavities 3730 are substantially parallel to each other. In some examples, the central longitudinal axis of each of the set of third cavities 3730 is substantially perpendicular to the bottom surface 3724 of the fourth layer 3720 (e.g., such that the cross-sectional shape is in a plane substantially parallel to the bottom surface 3724 of the fourth layer 3720).

The set of third cavities 3730 can have an average characteristic dimension. The term "characteristic dimension," as used herein refers to the largest straight line distance between two points in the plane of the cross-sectional shape of each of the third cavities 3730 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of third cavities 3730, the cross-sectional shape can be substantially circular and the average characteristic dimension can refer to the average diameter. In some examples, the average characteristic dimension of the set of third cavities 3730 can be substantially the same for the entire thickness. In some examples, the average characteristic dimension of the set of third cavities 3730 can vary with the thickness (e.g., tapered or stepped).

The set of third cavities 3730 can have an average characteristic dimension of 1 micrometer (micron, µm) or more (e.g., 2 µm or more, 3 µm or more, 4 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the set of third cavities 3730 can have an average characteristic dimension of 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (µm) or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average characteristic dimension of the set of third cavities 3730 can range from any of the minimum values described above to any of the maximum values described above. For example, the average characteristic dimension of the set of third cavities 3730 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, from 10 µm to 1 mm, from 100 µm to 10 mm, from or 100 µm to 1 mm).

In some examples, the average characteristic dimension of each of the set of third cavities 3730 is substantially the same (e.g., the average characteristic dimension of each of the set of third cavities 3730 is substantially the same as the average characteristic dimension of the set of third cavities 3730). In some examples, the average characteristic dimension of the set of third cavities 3730 is greater than the average characteristic dimension of the set of second cavities 3350.

Figure 60:
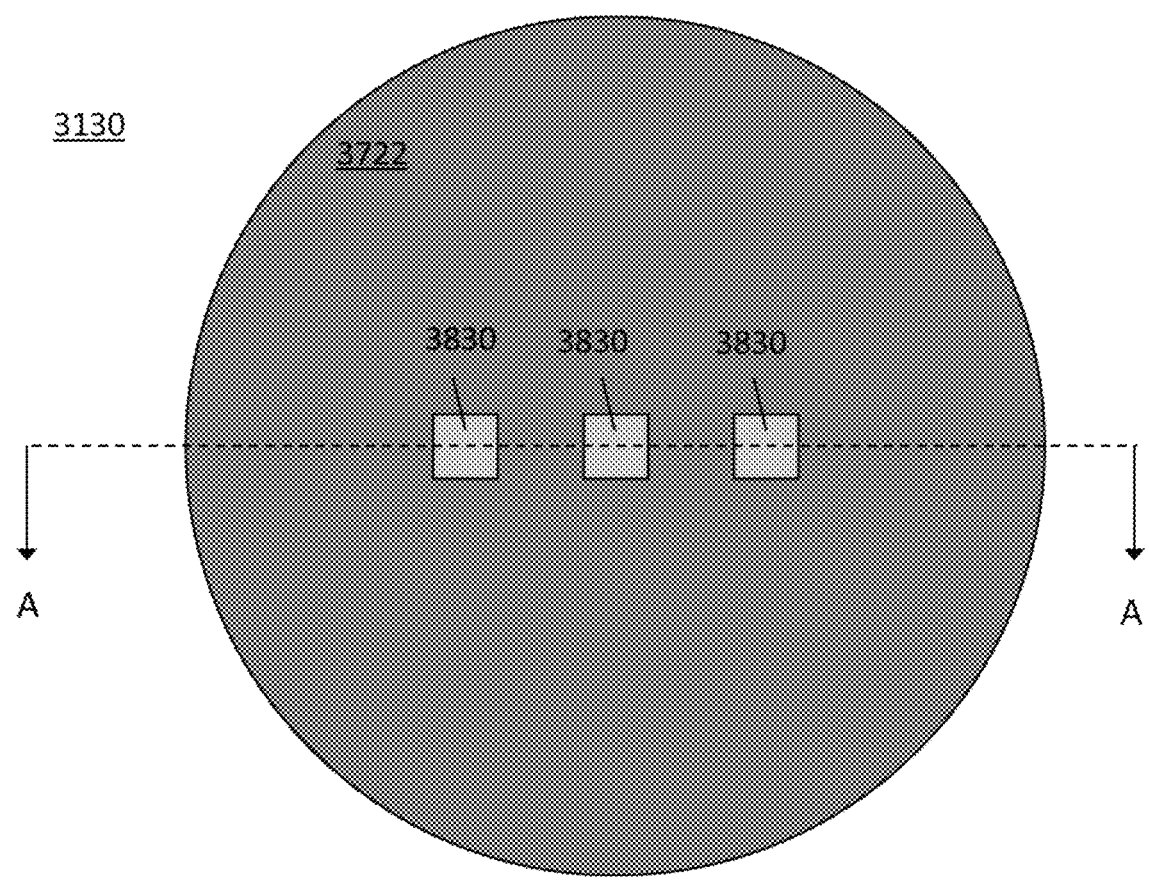
FIG. 60 is a schematic plan view of an example vapor cell preform as disclosed herein according to one implementation.
Figure 61:
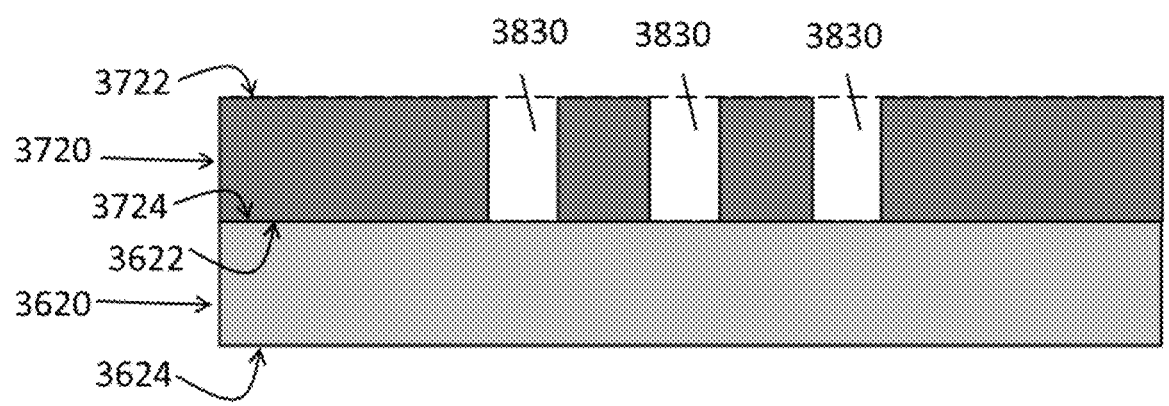
FIG. 61 is a cross-sectional plan view along line A-A in FIG. 60 of the example vapor cell preform.
Figure 62:
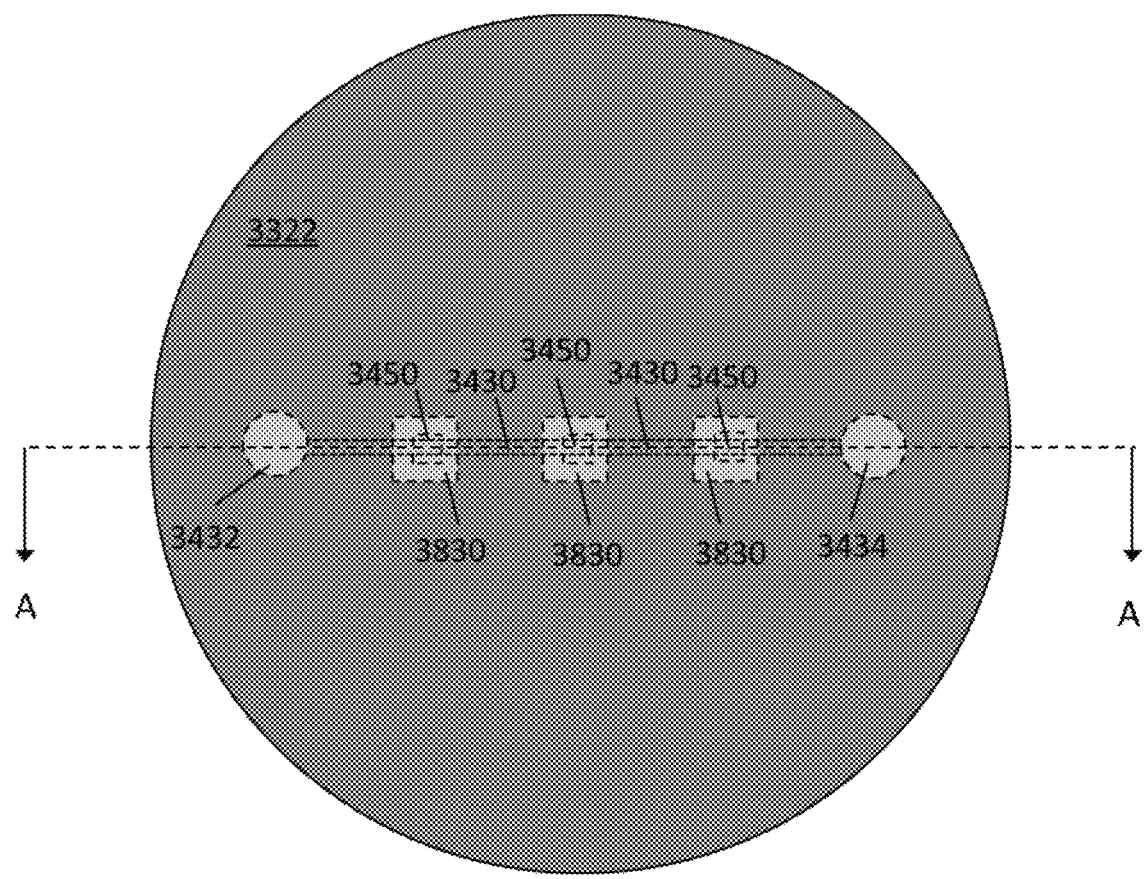
FIG. 62 is a schematic plan view of an example system comprising an example vapor cell preform and an example device as disclosed herein according to one implementation.
Figure 63:
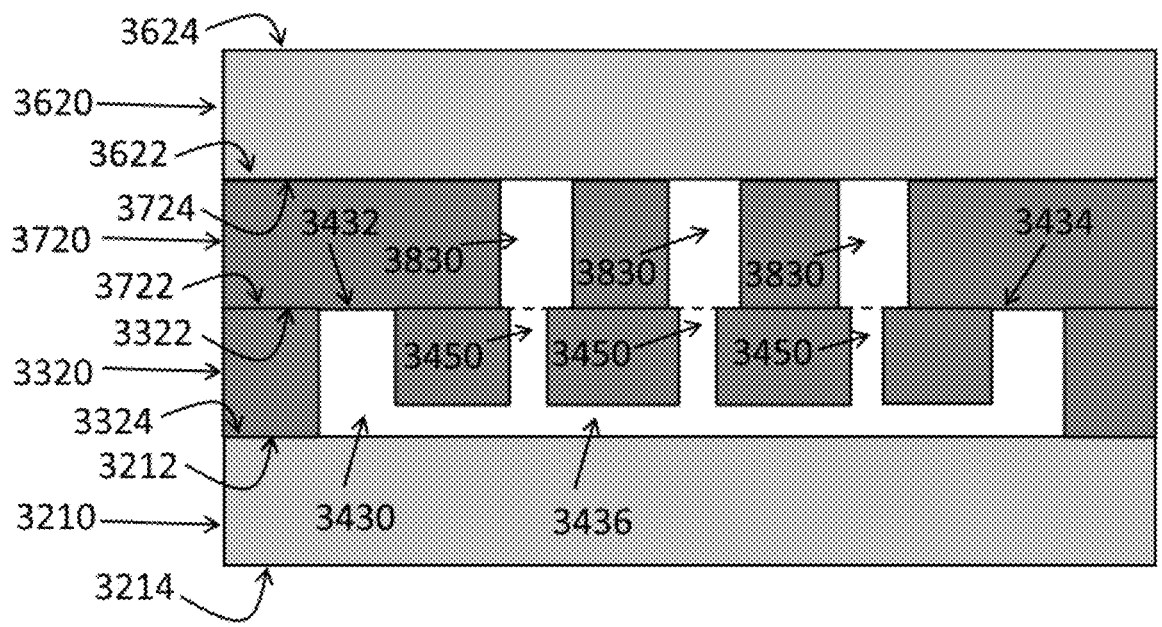
FIG. 63 is a cross-sectional plan view along line A-A in FIG. 62 of the example system.
Figure 64:
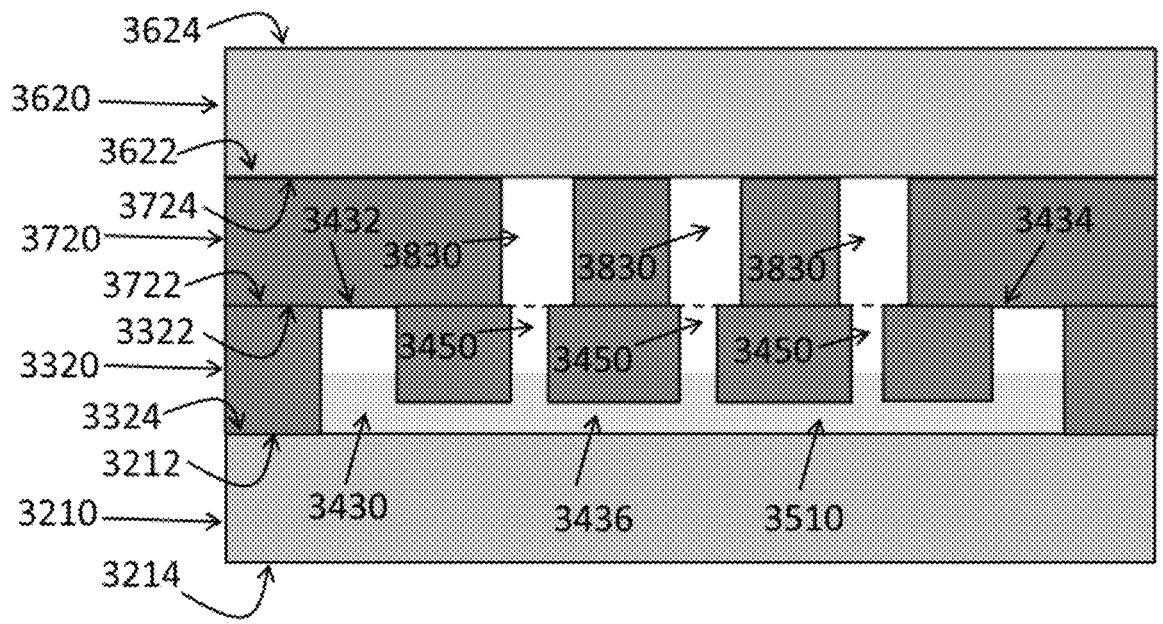
FIG. 64 is a cross-sectional plan view of the example system along line A-A in FIG. 62 wherein the example system includes a residue according to one example implementation.
Figure 65:
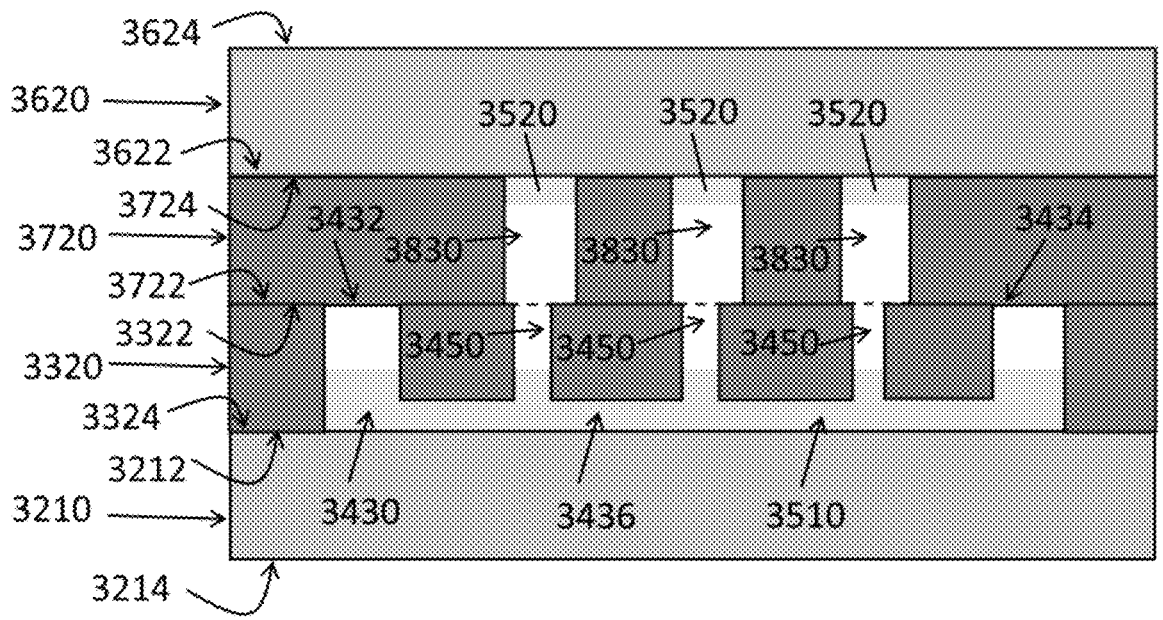
FIG. 65 is a cross-sectional plan view of the example system along line A-A in FIG. 62 wherein the example system includes an alkali metal deposited in the containers according to one example implementation.

Referring now to FIG. 60-FIG. 61, the fourth layer 3720 is disposed on the third layer 3620 in the vapor cell preform 3130, such that the bottom surface 3724 of the fourth layer 3720 is disposed on the top surface 3622 of the third layer 3620; wherein the set of third cavities 3730 together with the top surface 3622 of the third layer 3620 defines a set of containers 3830. The set of containers 3830 each have an open top (e.g., open at the top surface 3722 of the fourth layer 3720).

In some examples, the top surface 3622 and the bottom surface 3624 of the third layer 3620 and the top surface 3722 and the bottom surface 3724 of the fourth layer 3720 are all substantially parallel to each other in the vapor cell preform 3130. In some examples, the fourth layer 3720 is disposed on the third layer 3620 in the vapor cell preform 3130, such that the bottom surface 3724 of the fourth layer 3720 is disposed on and in physical contact with the top surface 3622 of the third layer 3620. In some examples, the third layer 3620 is bonded to the fourth layer 3720. For example, the third layer 3620 can be bonded to the fourth layer 3720 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

In some examples, the methods can further comprise making the set of third cavities 3730 in fourth layer 3720. The set of third cavities 3730 can be patterned in the fourth layer 3720 using standard techniques known in the art, such as lithographic patterning, etching, micromachining, deep reactive ion etching, direct laser ablation, and the like. In some examples, the methods can further comprise disposing the fourth layer 3720 on the third layer 3620. In some examples, the methods can further comprise bonding the fourth layer 3720 and the third layer 3620. For example, the fourth layer 3720 can be bonded to the third layer 3620 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein can, for example, further comprise, disposing the vapor cell preform 3130 on the device 3120 after the fluid 3500 has dried to form the residue 3510.

Referring now to FIG. 62-FIG. 65, also disclosed herein are systems wherein the vapor cell preform 3130 is disposed on the device 3120 such that the top surface 3722 of the fourth layer 3720 is disposed on the top surface 3322 of the second layer 3320 and the set of containers 3830 are aligned over the set of receptacles 3450. In some examples, the central longitudinal axis of each of the set of receptacles 3450 are substantially parallel to the central longitudinal axis of each of the set of containers 3830.

The methods disclosed herein can, for example, further comprise, disposing the vapor cell preform 3130 on the device 3120 after the fluid 3500 has dried to form the residue 3510, subjecting the residue 3510 to a reaction stimulus, thereby forming an alkali metal vapor, which enters the set of containers 3830, thereby depositing the alkali metal 3520 into the containers 3830. The alkali metal vapor can comprise, for example, potassium, rubidium, cesium, or a combination thereof. The reaction stimulus can, for example, comprise heating the residue 3510 at an elevated temperature, irradiating the residue 3510 with ultraviolet radiation, electrolyzing the residue 3510, a diffusive stimulus, or a combination thereof. In some examples, the alkali metal in the containers condenses to form a condensate.

The methods can, in some examples, further comprise separating the vapor cell preform 3130 from the device 3120 after the alkali metal has been deposited into the containers 3830, optionally injecting a buffer gas (e.g., Na, Ne, Ar, Xe, He, Kr, $CH_4$, etc.) into the containers (the alkali metal and the buffer gas being inert to each other), and sealing the containers 3830. As used herein, "sealed" and variants thereof (e.g., seal, sealing, and the like) refer to a fluid impermeable barrier the prevents communication of fluids into or out of the sealed container.

Figure 66:
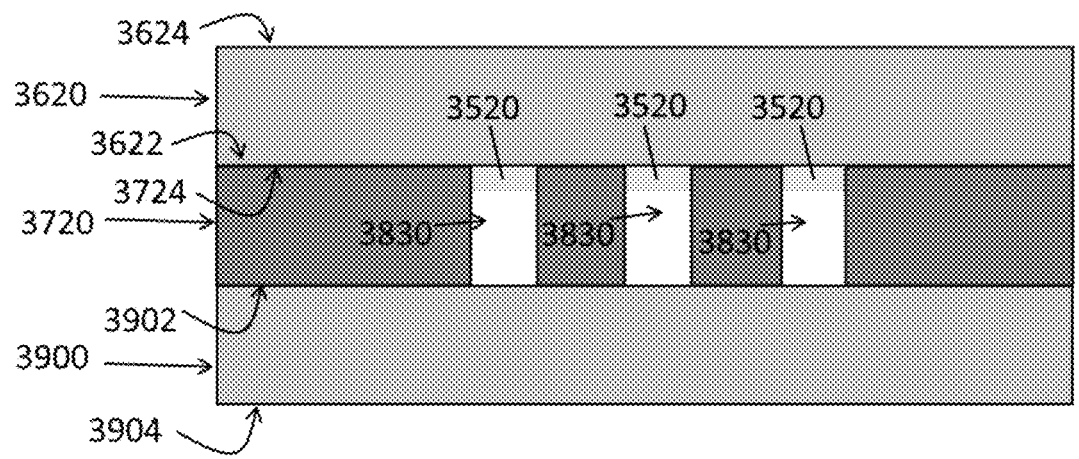
FIG. 66 is a cross-sectional plan view of the example system wherein the example system includes a substrate according to one example implementation.

Sealing the containers 3830 can, for example, comprise disposing the vapor cell preform on a substrate 3900 after the alkali metal has been deposited into the containers, and optionally after injecting a buffer gas into the containers, such that the top surface 3722 of the fourth layer 3720 is disposed on the substrate 3900, thereby closing the open tops of the set of containers 3830 (FIG. 66). In some examples, the methods can further comprise bonding the fourth layer 3720 to the substrate 3900, thereby sealing the alkali metal (and optional buffer gas) in the containers 3830. For example, the fourth layer 1700 can be bonded to the substrate 1900 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The substrate 3900 can have a top surface 3902 and a bottom surface 3904 opposite and spaced apart from the top surface 3902. In some examples, the top surface 3902 and the bottom surface 3904 of the substrate 3900 are substantially parallel to each other. The substrate 3900 can comprise any material consistent with the methods, devices, and systems disclosed herein. In some examples, the substrate 3900 can comprise a dielectric, a semiconductor, a ceramic, a transparent conducing oxide, a polymer, a metal, or a combination thereof. Examples of substrates 3900 include, but are not limited to, glass, quartz, Pyrex, fused silica, silicon dioxide, silicon nitride, sapphire, a polymer (e.g., polycarbonate), and combinations thereof. In some examples, the substrate 3900 can be transparent. As used herein, a "transparent substrate 3900" is meant to include any substrate 3900 that is transparent at the wavelength or wavelength region of interest. In some examples, the substrate 3900 comprises glass (e.g., aluminosilicate glass, borosilicate glass, etc.).

The substrate 3900 has an average thickness, the average thickness being the average dimension from the top surface 3902 to the bottom surface 3904. The average thickness of the substrate 3900 can, for example be 1 micrometer (micron, µm) or more (e.g., 2 µm or more, 3 µm or more, 4 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the substrate 3900 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (µm) or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average thickness of the substrate 3900 can range from any of the minimum values described above to any of the maximum values described above. For example, the average thickness of the substrate 3900 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 3902 and the bottom surface 3904 of the substrate 3900 can, independently, be any shape. In some examples, the top surface 3902 and the bottom surface 3904 of the substrate 3900 can, independently, be substantially circular, ovate, ovoid, elliptic, triangular, rectangular, polygonal, etc. In some examples, the top surface 3902 and the bottom surface 3904 of the substrate 3900 can be substantially the same shape. In some examples, the top surface 3902 and the bottom surface 3904 of the substrate 3900 can be substantially circular.

The substrate has 3900 an average lateral dimension (e.g., diameter when the substrate 3900 is a circular wafer) of 1 micrometer (micron, µm) or more (e.g., 2 µm or more, 3 µm or more, 4 µm or more, 5 µm or more, 6 µm or more, 7 µm or more, 8 µm or more, 9 µm or more, 10 µm or more, 15 µm or more, 20 µm or more, 25 µm or more, 30 µm or more, 35 µm or more, 40 µm or more, 45 µm or more, 50 µm or more, 60 µm or more, 70 µm or more, 80 µm or more, 90 µm or more, 100 µm or more, 125 µm or more, 150 µm or more, 175 µm or more, 200 µm or more, 225 µm or more, 250 µm or more, 300 µm or more, 350 µm or more, 400 µm or more, 450 µm or more, 500 µm or more, 600 µm or more, 700 µm or more, 800 µm or more, 900 µm or more, 1 millimeter (mm) or more, 1.25 mm or more, 1.5 mm or more, 1.75 mm or more, 2 mm or more, 2.25 mm or more, 2.5 mm or more, 3 mm or more, 3.5 mm or more, 4 mm or more, 4.5 mm or more, 5 mm or more, 6 mm or more, 7 mm or more, 8 mm or more, 9 mm or more, 10 mm or more, 15 mm or more, 20 mm or more, 25 mm or more, 30 mm or more, 35 mm or more, 40 mm or more, 45 mm or more, 50 mm or more, 60 mm or more, 70 mm or more, 80 mm or more, 90 mm or more, 100 mm or more, 125 mm or more, 150 mm or more, 175 mm or more, 200 mm or more, 225 mm or more, 250 mm or more, or 275 mm or more). In some examples, the average lateral dimension of the substrate 3900 can be 300 millimeters (mm) or less (e.g., 275 mm or less, 250 mm or less, 225 mm or less, 200 mm or less, 175 mm or less, 150 mm or less, 125 mm or less, 100 mm or less, 90 mm or less, 80 mm or less, 70 mm or less, 60 mm or less, 50 mm or less, 45 mm or less, 40 mm or less, 35 mm or less, 30 mm or less, 25 mm or less, 20 mm or less, 15 mm or less, 10 mm or less, 9 mm or less, 8 mm or less, 7 mm or less, 6 mm or less, 5 mm or less, 4.5 mm or less, 4 mm or less, 3.5 mm or less, 3 mm or less, 2.5 mm or less, 2.25 mm or less, 2 mm or less, 1.75 mm or less, 1.5 mm or less, 1.25 mm or less, 1 mm or less, 900 micrometer (µm) or less, 800 µm or less, 700 µm or less, 600 µm or less, 500 µm or less, 450 µm or less, 400 µm or less, 350 µm or less, 300 µm or less, 250 µm or less, 225 µm or less, 200 µm or less, 175 µm or less, 150 µm or less, 125 µm or less, 100 µm or less, 90 µm or less, 80 µm or less, 70 µm or less, 60 µm or less, 50 µm or less, 45 µm or less, 40 µm or less, 35 µm or less, 30 µm or less, 25 µm or less, 20 µm or less, 15 µm or less, 10 µm or less, 9 µm or less, 8 µm or less, 7 µm or less, 6 µm or less, 5 µm or less, 4 µm or less, 3 µm or less, or 2 µm or less). The average lateral dimension of the substrate 3900 can range from any of the minimum values described above to any of the maximum values described above. For example, the average lateral dimension of the substrate 3900 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm).

In some examples, the average lateral dimension of the substrate 3900 and the average lateral dimension of the fourth layer 3720 are substantially equal. In some examples, the top surface 3902 and the bottom surface 3904 of the substrate 3900 and the top surface 3722 and the bottom surface 3724 of the fourth layer 3720 are all substantially parallel to each other. In some examples, the fourth layer 3720 is disposed on the substrate 3900, such that the top surface 3722 of the fourth layer 3720 is disposed on and in physical contact with the top surface 3902 of the substrate 3900.

In some examples, the methods described herein can be used to form a plurality of alkali metal vapor cells on a single wafer simultaneously in parallel (e.g., 2 or more; 3 or more; 4 or more; 5 or more; 6 or more; 7 or more; 8 or more; 9 or more; 10 or more; 15 or more; 20 or more; 25 or more; 30 or more; 40 or more; 50 or more; 60 or more; 70 or more; 80 or more; 90 or more; 100 or more; 150 or more; 200 or more; 250 or more; 300 or more; 350 or more; 400 or more; 450 or more; 500 or more; 600 or more; 700 or more; 800 or more; 900 or more; 1000 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more).

In some examples, the methods can further comprise separating one or more of the sealed containers (e.g., one or more of the alkali metal vapor cells) from the others without disrupting the seal. In some examples, the methods can further comprise separating each of the sealed containers (e.g., each of the alkali metal vapor cells) from one another without disrupting the seal. The sealed containers can be separated using methods known in the art, such as, for example, dicing, laser cutting, abrasive machining, chemical etching, micromachining, etc.

One or more of the method steps can, for example, be carried out either under vacuum or in a buffer-gas (e.g., anaerobic) environment, consistent with the requirements for application of the sealed containers in an atomic clock or magnetometer.

Also disclosed herein are devices comprising a first layer 4210 having a top surface 4212 and a bottom surface 4214 opposite and spaced apart from the top surface 4212. In some examples, the top surface 4212 and the bottom surface 4214 of the first layer 4210 are substantially parallel to each other.

The first layer 4210 can comprise any material consistent with the methods, devices, and systems disclosed herein. In some examples, the first layer 4210 can comprise a dielectric, a semiconductor, a ceramic, a transparent conducing oxide, a polymer, a metal, or a combination thereof. Examples of first layers 4210 include, but are not limited to, glass, quartz, Pyrex, fused silica, silicon dioxide, silicon nitride, sapphire, a polymer (e.g., polycarbonate), and combinations thereof. In some examples, the first layer 4210 can be transparent. As used herein, a "transparent layer" is meant to include any layer that is transparent at the wavelength or wavelength region of interest. In some examples, the first layer 4210 comprises glass (e.g., aluminosilicate glass, borosilicate glass, etc.).

The first layer 4210 has an average thickness, the average thickness being the average dimension from the top surface 4212 to the bottom surface 4214. The average thickness of the first layer 4210 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the first layer 4210 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the first layer 4210 can range from any of the minimum values described above to any of the maximum values described above. For example, the average thickness of the first layer 4210 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 4212 and the bottom surface 4214 of the first layer 4210 can, independently, be any shape. In some examples, the top surface 4212 and the bottom surface 4214 of the first layer 4210 can, independently, be substantially circular, ovate, ovoid, elliptic, triangular, rectangular, polygonal, etc. In some examples, the top surface 4212 and the bottom surface 4214 of the first layer 4210 can be substantially the same shape. In some examples, the top surface 4212 and the bottom surface 4214 of the first layer 4210 can be substantially circular.

The first layer 4210 has an average lateral dimension (e.g., diameter when the first layer 4210 is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the first layer 4210 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the first layer 4210 can range from any of the minimum values described above to any of the maximum values described above. For example, the average lateral dimension of the first layer 4210 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 μm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

The devices further comprise a second layer 4320 having a top surface 4322 and a bottom surface 4324 opposite and spaced apart from the top surface. In some examples, the top surface 4322 and the bottom surface 4324 of the second layer 4320 are substantially parallel to each other.

The second layer 4320 can comprise any material consistent with the methods, devices, and systems disclosed herein. In some examples, the second layer 4320 can comprise a dielectric, a semiconductor, a ceramic, a transparent conducing oxide, a polymer, a metal, or a combination thereof. Examples of second layers 4320 include, but are not limited to, silicon, glass (e.g. aluminum coated glass), sapphire, a ceramic, and combinations thereof. In some examples, the second layer 4320 comprises silicon. In some examples, the second layer 4320 is hydrophilic.

The second layer 4320 has an average thickness, the average thickness being the average dimension from the top surface 4322 to the bottom surface 4324. The average thickness of the second layer 4320 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the second layer 4320 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average thickness of the second layer 4320 can range from any of the minimum values described above to any of the maximum values described above. For example, the average thickness of the second layer 4320 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 4322 and the bottom surface 4324 of the second layer 4320 can, independently, be any shape. In some examples, the top surface 4322 and the bottom surface 4324 of the second layer 4320 can, independently, be substantially circular, ovate, ovoid, elliptic, triangular, rectangular, polygonal, etc. In some examples, the top surface 4322 and the bottom surface 4324 of the second layer 4320 can be substantially the same shape. In some examples, the top surface 4322 and the bottom surface 4324 of the second layer 4320 can be substantially circular.

In some examples, the top surface 4212 and the bottom surface 4214 of the first layer 4210 and the top surface 4322 and the bottom surface 4324 of the second layer 4320 are all substantially circular.

The second layer 4320 has an average lateral dimension (e.g., diameter when the second layer 4320 is a circular wafer) of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the second layer 4320 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average lateral dimension of the second layer 4320 can range from any of the minimum values described above to any of the maximum values described above. For example, the average lateral dimension of the second layer 4320 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm). In some examples, the average lateral dimension of the second layer 4320 and the average lateral dimension of the first layer 4210 are substantially equal.

Figure 67:
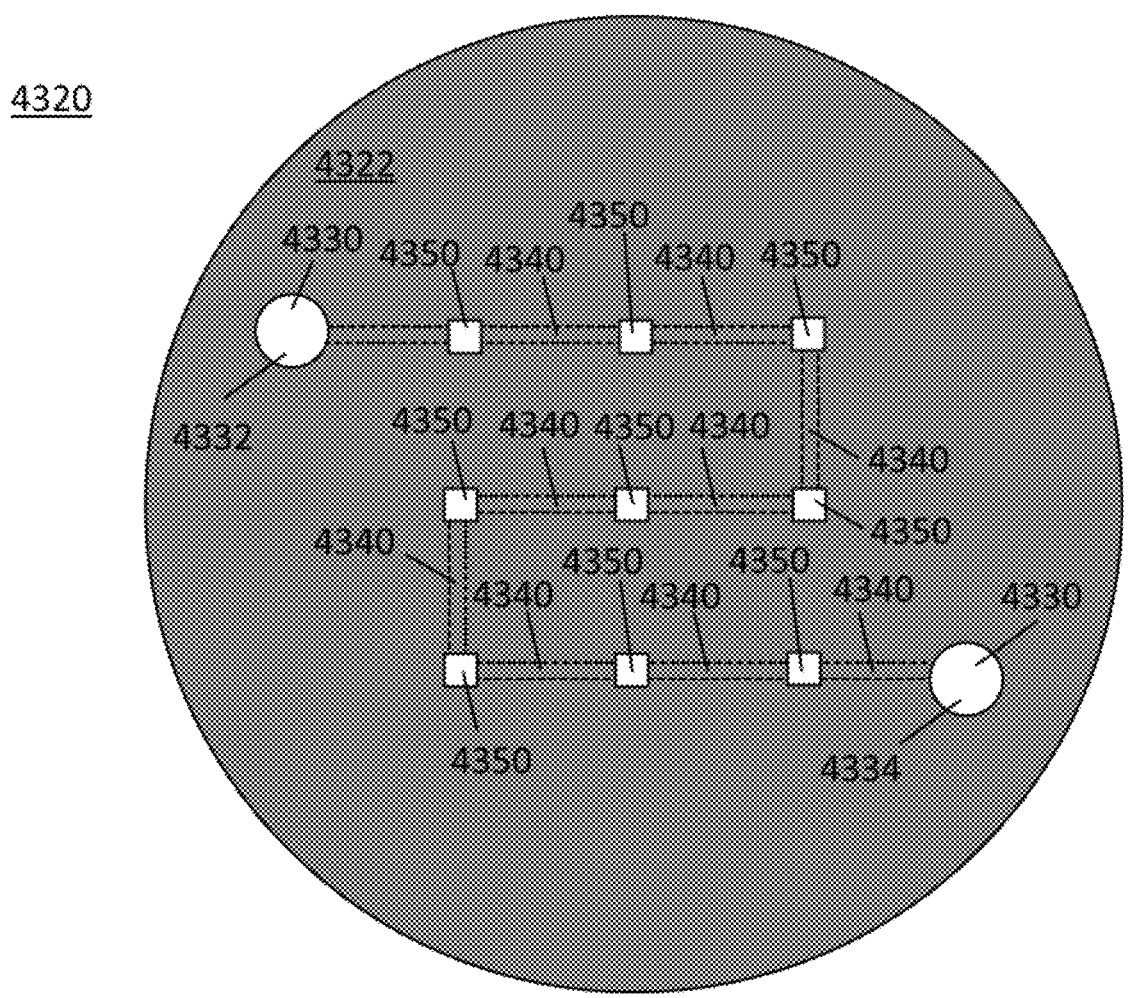
FIG. 67 is a schematic plan view of an example second layer as disclosed herein according to one implementation.

Referring now to FIG. 67, the second layer 4320 comprises a set of first cavities 4330, a groove 4340, and a set of second cavities 4350; wherein the set of first cavities 4330 comprise an inlet shaft 4332 and an outlet shaft 4334, wherein the inlet shaft 4332 and the outlet shaft 4334 each perforates the second layer 4320 from the top surface 4322 to the bottom surface 4324; wherein each of the second cavities 4350 perforates the second layer 4320 from the top surface 4322 to the bottom surface 4324; wherein the groove 4340 extends from the inlet shaft 4332 to the outlet shaft 4334 along the bottom surface 4324 of the second layer 4320; and wherein the inlet shaft 4332, the outlet shaft 4334, and each of the second cavities 4350 are in fluid communication with the groove 4340.

The inlet shaft 4332 and the outlet shaft 4334 each independently has a central longitudinal axis and a cross-sectional shape in a plane perpendicular to the central longitudinal axis of said shaft, wherein the cross-sectional shape can be any shape, such as a regular shape, an irregular shape, an isotropic shape, or an anisotropic shape. In some examples, the cross-sectional shape of the inlet shaft 4332 and/or the outlet shaft 4334 can be substantially circular, ovate, ovoid, elliptic, triangular, rectangular, polygonal, etc. In some examples, the cross-sectional shape of the inlet shaft 4332 and/or the outlet shaft 4334 can be substantially circular, as shown in FIG. 67. In some examples, the central longitudinal axis of the inlet shaft 4332 and/or the outlet shaft 4334 is/are substantially perpendicular to the bottom surface 4324 of the second layer 4320 (e.g., such that the cross-sectional shape is in a plane substantially parallel to the bottom surface 4324 of the second layer 4320). In some examples, the central longitudinal axis of the inlet shaft 4332 and the central longitudinal axis of the outlet shaft 4334 are substantially parallel. In some examples, the cross-sectional shape of each of the first cavities 4330 is the same. In some examples, the cross-sectional shape of the inlet shaft 4332 can be the same as the cross-sectional shape of the outlet shaft 4334. In some examples, the cross-sectional shape of the inlet shaft 4332 can be different than the cross-sectional shape of the outlet shaft 4334.

The inlet shaft 4332 and the outlet shaft 4334 can each independently have an average characteristic dimension. The term "characteristic dimension," as used herein refers to the largest straight line distance between two points in the plane of the cross-sectional shape (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension. For example, for a cylindrical inlet shaft 4332 and/or outlet shaft 4334, the cross-sectional shape can be substantially circular and the average characteristic dimension can refer to the diameter. In some examples, the average characteristic dimension of the inlet shaft 4332 and/or the outlet shaft 4334 can be substantially the same for the entire thickness. In some examples, the average characteristic dimension of the inlet shaft 4332 and/or the outlet shaft 4334 can vary with the thickness (e.g., tapered or stepped).

The inlet shaft 4332 and/or the outlet shaft 4334 can independently have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the inlet shaft 4332 and/or the outlet shaft 4334 can independently have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the inlet shaft 4332 and/or the outlet shaft 4334 can independently range from any of the minimum values described above to any of the maximum values described above. For example, the average characteristic dimension of the inlet shaft 4332 and/or the outlet shaft 4334 can independently be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm). In some examples, the average characteristic dimension of the inlet shaft 4332 and the average characteristic dimension of the outlet shaft 4334 are substantially equal.

As used herein, "a set of second cavities 4350" and "the set of second cavities 4350" are meant to include any number of second cavities 4350 in any arrangement. Thus, for example, "a set of second cavities 4350" includes one or more second cavities 4350 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of second cavities 4350 can comprise a plurality of second cavities 4350. In some examples, the set of second cavities 4350 comprises a plurality of second cavities 4350 in an ordered array.

Each of the set of second cavities 4350 has a central longitudinal axis and a cross-sectional shape in a plane perpendicular to the central longitudinal axis of said cavity 4350, wherein the cross-sectional shape can be any shape, such as a regular shape, an irregular shape, an isotropic shape, or an anisotropic shape. In some examples, the cross-sectional shape of each of the set of second cavities 4350 can be substantially circular, ovate, ovoid, elliptic, triangular, rectangular, polygonal, etc. In some examples, the cross-sectional shape of each of the set of second cavities 4350 is substantially the same. In some examples, the cross-sectional shape of the set of second cavities can be substantially circular. In some examples, the cross-sectional shape of the set of second cavities 4350 can be substantially rectangular, as shown in FIG. 67. In some examples, the cross-sectional shape of each of the second cavities 4350 is the same. In some examples, the cross-sectional shape of the set of second cavities 4350 can be the same as the cross-sectional shape of the set of first cavities 4330. In some examples, the cross-sectional shape of the set of second cavities 4350 can be different than the cross-sectional shape of the set of first cavities 4330.

In some examples, the central longitudinal axis of each of the set of second cavities 4350 are substantially parallel to each other. In some examples, the central longitudinal axis of each of the set of second cavities 4350 are substantially parallel to the central longitudinal axis of the inlet shaft 4332. In some examples, the central longitudinal axis of each of the set of second cavities 4350 are substantially parallel to the central longitudinal axis of the outlet shaft 4334. In some examples, the central longitudinal axis of each of the set of second cavities 4350, the central longitudinal axis of the inlet shaft 4332, and the central longitudinal axis of the outlet shaft 4334 are all substantially parallel to one another. In some examples, the central longitudinal axis of each of the set of second cavities 4350 is substantially perpendicular to the bottom surface 4324 of the second layer 4320 (e.g., such that the cross-sectional shape is in a plane substantially parallel to the bottom surface 4324 of the second layer 4320).

The set of second cavities 4350 can have an average characteristic dimension. The term "characteristic dimension," as used herein refers to the largest straight line distance between two points in the plane of the cross-sectional shape of each of the second cavities 4350 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of second cavities 4350, the cross-sectional shape can be substantially circular and the average characteristic dimension can refer to the average diameter. In some examples, the average characteristic dimension of the set of second cavities 4350 can be substantially the same for the entire thickness. In some examples, the average characteristic dimension of the set of second cavities 4350 can vary with the thickness (e.g., tapered or stepped).

The set of second cavities 4350 can have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the set of second cavities 4350 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the set of second cavities 4350 can range from any of the minimum values described above to any of the maximum values described above. For example, the average characteristic dimension of the set of second cavities 4350 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

In some examples, the average characteristic dimension of each of the set of second cavities 4350 is substantially the same (e.g., the average characteristic dimension of each of the set of second cavities 4350 is substantially the same as the average characteristic dimension of the set of second cavities 4350). In some examples, the average characteristic dimension of the set of second cavities 4350 is less than or equal to the average characteristic dimension of the inlet shaft 4332 and/or the outlet shaft 4334.

The groove 4340 traverses the bottom surface 4324 of the second layer 4320 from the inlet shaft 4332 to the outlet shaft 4334, intersecting with each of the second cavities 4350 therebetween. In some examples, the groove 4340 is serpentine, traversing the bottom surface 4324 of the second layer 4320 from the inlet shaft 4332 to the outlet shaft 4334, intersecting with each of the second cavities 4350 sequentially therebetween.

The second layer 4320 is disposed on the first layer 4210 in the device 4120, such that the bottom surface 4324 of the second layer 4320 is disposed on the top surface 4212 of the first layer 4210; wherein the inlet shaft 4332, the outlet shaft 4334, and the groove 4340 together with the top surface 4212 of the first layer 4210 defines a main conduit 4430 having a longitudinal axis, an inlet 4432, an outlet 4434 axially spaced apart from the inlet 4432, and a lumen 4436 for fluid flow extending from the inlet 4432 to the outlet 4434; wherein the set of second cavities 4350 together with the top surface 4212 of the first layer 4210 defines a set of receptacles 4450; and wherein each of the receptacles 4450 is in fluid communication with the lumen 4436 of the main conduit 4430; such that, when a fluid 4500 flows from the inlet 4432 to the outlet 4434 through the lumen 4436 of the main conduit 4430, the fluid 4500 further flows into each of the receptacles 4450 via capillary action, such that the fluid 4500 at least partially fills each of the receptacles 4450.

The inlet 4432, the outlet 4434, and the set of receptacles 4450 each have an open top (e.g., open at the top surface 4322 of the second layer 4320). In some examples, the top surface 4212 and the bottom surface 4214 of the first layer 4210 and the top surface 4322 and the bottom surface 4324 of the second layer 4320 are all substantially parallel to each other. In some examples, the second layer 4320 is disposed on the first layer 4210, such that the bottom surface 4324 of the second layer 4320 is disposed on and in physical contact with the top surface 4212 of the first layer 4210. In some examples, the first layer 4210 is bonded to the second layer 4320. For example, the first layer 4210 can be bonded to the second layer 4320 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein comprise, for example, flowing a fluid 4500 from the inlet 4432 to the outlet 4434 through the lumen 4436 of the main conduit 4430, such that the fluid 4500 further flows into each of the receptacles 4450 via capillary action and the fluid 4500 at least partially fills each of the receptacles 4450.

The fluid 4500 can, for example, comprise an alkali metal precursor and a solvent. The alkali metal precursor can, for example, comprise any compound or composition capable of reacting to form a free alkali metal. The alkali metal precursor can, for example, comprise an alkali metal compound, wherein the alkali metal can include an alkali atom, an alkaline earth atom, a lanthanide, an actinide, or combinations thereof. In some examples, the alkali metal precursor can, for example, comprise an alkali metal compound, wherein the alkali metal can include potassium (K), rubidium (Rb), cesium (Cs), or a combination thereof. The alkali metal precursor can, for example, comprise an alkali halide (e.g., an alkali chloride), an azide, a chromate, a molibdate, or a combination thereof. Exemplary alkali halides include RbCl, CsCl, KCl, RbBr, CsBr, KBr, and the like. Exemplary alkali azides include $RbN_3$, $CsN_3$, $KN_3$, and the like. In some examples, the alkali metal precursor can include $RbN_3$, $CsN_3$, $KN_3$ that can produce alkali metal in response to being subjected to ultraviolet light. Alkali halides can, for example, be reacted with $BaN_6$ or Ca to produce alkali metal. In some examples, alkali metal precursor includes $BaN_6$ and an alkali chloride, which can react to form $BaCl$, $N_2$, and alkali metal in response to heating. In some examples, the fluid can further comprise a reducing agent such as barium azide, calcium, zirconium, or aluminum. Examples of suitable solvents include, but are not limited to, tetrahydrofuran (THF), N-methyl-2-pyrrolidone (NMP), dimethylformamide (DMF), N-methylformamide, formamide, dimethyl sulfoxide (DMSO), dimethylacetamide, dichloromethane ($CH_2Cl_2$), ethylene glycol, polyethylene glycol, glycerol, alkane diol, tetraglyme, propylene carbonate, diglyme, dimethoxyethane, ethanol, methanol, propanol, isopropanol, water, acetonitrile, chloroform, acetone, hexane, heptane, toluene, xylene, methyl acetate, ethyl acetate, and combinations thereof. In some examples, the solvent comprises water such that the fluid comprises an aqueous solution comprising the alkali metal precursor.

The methods can, for example, comprise drying the fluid 4500, for example by evaporating the solvent, thereby forming a residue 4520 comprising the alkali metal precursor as a solid. Wherein, upon drying the liquid 4500, the residue 4520 comprising the alkali metal precursor as a solid is stable (e.g., stable at room temperature).

In some examples, the methods can further comprise making the set of first cavities 4330, the groove 4340, and the set of second cavities 4350 in second layer 4320. The set of first cavities 4330, the groove 4340, and the set of second cavities 4350 can be patterned in the second layer using standard techniques known in the art, such as lithographic patterning, etching, micromachining, deep reactive ion etching, direct laser ablation, and the like. In some examples, the methods can further comprise disposing the second layer 4320 on the first layer 4210. In some examples, the methods can further comprise bonding the first layer 4210 and the second layer 4320. For example, the first layer 4210 can be bonded to the second layer 4320 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

Also disclosed herein are vapor cell preforms comprising a third layer 4620 having a top surface 4622 and a bottom surface 4624 opposite and spaced apart from the top surface 4622. In some examples, the top surface 4622 and the bottom surface 4624 of the third layer 4620 are substantially parallel to each other.

The third layer 4620 can comprise any material consistent with the methods, devices, and systems disclosed herein. In some examples, the third layer 4620 can comprise a dielectric, a semiconductor, a ceramic, a transparent conducing oxide, a polymer, a metal, or a combination thereof. Examples of third layers 4620 include, but are not limited to, glass, quartz, Pyrex, fused silica, silicon dioxide, silicon nitride, sapphire, a polymer (e.g., polycarbonate), and combinations thereof. In some examples, the third layer 4620 can be transparent. As used herein, a "transparent layer" is meant to include any layer that is transparent at the wavelength or wavelength region of interest. In some examples, the third layer 4620 comprises glass (e.g., aluminosilicate glass, borosilicate glass, etc.).

The third layer 4620 has an average thickness, the average thickness being the average dimension from the top surface 4622 to the bottom surface 4624. The average thickness of the third layer 4620 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the third layer 4620 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the third layer 4620 can range from any of the minimum values described above to any of the maximum values described above. For example, the average thickness of the third layer 4620 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 4622 and the bottom surface 4624 of the third layer 4620 can, independently, be any shape. In some examples, the top surface 4622 and the bottom surface 4624 of the third layer 4620 can, independently, be substantially circular, ovate, ovoid, elliptic, triangular, rectangular, polygonal, etc. In some examples, the top surface 4622 and the bottom surface 4624 of the third layer 4620 can be substantially the same shape. In some examples, the top surface 4622 and the bottom surface 4624 of the third layer 4620 can be substantially circular.

The third layer 4620 has an average lateral dimension (e.g., diameter when the third layer 4620 is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the third layer 4620 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the third layer 4620 can range from any of the minimum values described above to any of the maximum values described above. For example, the average lateral dimension of the third layer 4620 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

The vapor cell preforms further comprise a fourth layer 4720 having a top surface 4722 and a bottom surface 4724 opposite and spaced apart from the top surface 4722. In some examples, the top surface 4722 and the bottom surface 4724 are substantially parallel to each other.

The fourth layer 4720 can comprise any material consistent with the methods, devices, and systems disclosed herein. In some examples, the fourth layer 4720 can comprise a dielectric, a semiconductor, a ceramic, a transparent conducting oxide, a polymer, a metal, or a combination thereof. Examples of fourth layers 4720 include, but are not limited to, silicon, glass (e.g. aluminum coated glass), sapphire, a ceramic, and combinations thereof. In some examples, the fourth layer 3720 comprises silicon.

The fourth layer 4720 has an average thickness, the average thickness being the average dimension from the top surface 4722 to the bottom surface 4724. The average thickness of the fourth layer 4720 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the fourth layer 4720 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average thickness of the fourth layer 4720 can range from any of the minimum values described above to any of the maximum values described above. For example, the average thickness of the fourth layer 4720 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 4722 and the bottom surface 4724 of the fourth layer 4720 can, independently, be any shape. In some examples, the top surface 4722 and the bottom surface 4724 of the fourth layer 4720 can, independently, be substantially circular, ovate, ovoid, elliptic, triangular, rectangular, polygonal, etc. In some examples, the top surface 4722 and the bottom surface 4724 of the fourth layer 4720 can be substantially the same shape. In some examples, the top surface 4722 and the bottom surface 4724 of the fourth layer 4720 can be substantially circular.

In some examples, the top surface 4622 and the bottom surface 4624 of the third layer 4620 and the top surface 4722 and the bottom surface 4724 of the fourth layer 4720 are all substantially circular. In some examples, the top surface 4212 and the bottom surface 4214 of the first layer 4210; the top surface 4322 and the bottom surface 4324 of the second layer 4320; the top surface 4622 and the bottom surface 4624 of the third layer 4620; and the top surface 4722 and the bottom surface 4724 of the fourth layer 4720 are all substantially circular.

The fourth layer 4720 has an average lateral dimension (e.g., diameter when the fourth layer 4720 is a circular wafer) of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the fourth layer 4720 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average lateral dimension of the fourth layer 4720 can range from any of the minimum values described above to any of the maximum values described above. For example, the average lateral dimension of the fourth layer 4720 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm).

In some examples, the average lateral dimension of the third layer 4620 and the average lateral dimension of the fourth layer 4720 are substantially equal. In some examples, the average lateral dimension of the first layer 4210, the average lateral dimension of the second layer 4320, the average lateral dimension of the third layer 4620, and the average lateral dimension of the fourth layer 4720 are substantially equal.

Figure 68:
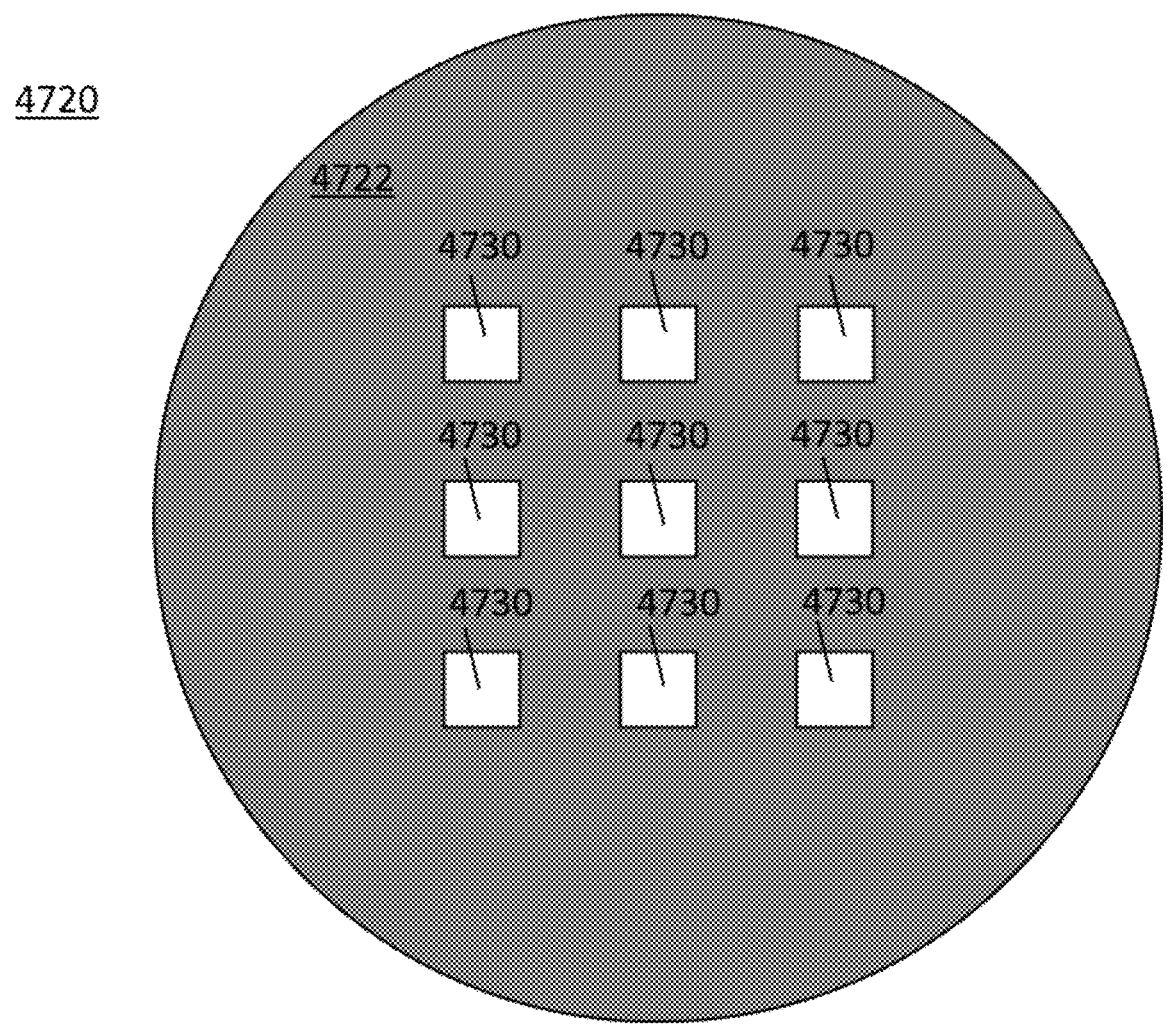
FIG. 68 is a schematic illustration of an example third layer as disclosed herein according to one implementation.

Referring now to FIG. 68, the fourth layer 4720 comprises a set of third cavities 4730, wherein each of the third cavities 4730 perforates the fourth layer 4720 from the top surface 4722 to the bottom surface 4724.

As used herein, "a set of third cavities 4730" and "the set of third cavities 4730" are meant to include any number of third cavities 4730 in any arrangement. Thus, for example, "a set of third cavities 4730" includes one or more third cavities 4730 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of third cavities 4730 can comprise a plurality of third cavities 4730. In some examples, the set of third cavities 4730 comprises a plurality of third cavities 4730 arranged in an ordered array. In some examples, the number of third cavities 4730 is equal to the number of second cavities 4350.

Each of the set of third cavities 4730 has a central longitudinal axis and a cross-sectional shape in a plane perpendicular to the central longitudinal axis of said cavity 4730, wherein the cross-sectional shape can be any shape, such as a regular shape, an irregular shape, an isotropic shape, or an anisotropic shape. In some examples, the cross-sectional shape of each of the set of third cavities 4730 can be substantially circular, ovate, ovoid, elliptic, triangular, rectangular, polygonal, etc. In some examples, the cross-sectional shape of each of the set of third cavities 4730 is substantially the same. In some examples, the cross-sectional shape of the set of third cavities 4730 can be substantially circular. In some examples, the cross-sectional shape of the set of third cavities 4730 can be substantially rectangular, as shown in FIG. 68. In some examples, the cross-sectional shape of each of the third cavities 4730 is the same. In some examples, the cross-sectional shape of the set of third cavities 4730 can be the same as the cross-sectional shape of the set of second cavities 4350. In some examples, the cross-sectional shape of the set of third cavities 4730 can be different than the cross-sectional shape of the set of second cavities 4350.

In some examples, the central longitudinal axis of each of the set of third cavities 4730 are substantially parallel to each other. In some examples, the central longitudinal axis of each of the set of third cavities 4730 is substantially perpendicular to the bottom surface 4724 of the fourth layer 4720 (e.g., such that the cross-sectional shape is in a plane substantially parallel to the bottom surface 4724 of the fourth layer 4720).

The set of third cavities 4730 can have an average characteristic dimension. The term "characteristic dimension," as used herein refers to the largest straight line distance between two points in the plane of the cross-sectional shape of each of the third cavities 4730 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of third cavities 4730, the cross-sectional shape can be substantially circular and the average characteristic dimension can refer to the average diameter. In some examples, the average characteristic dimension of the set of third cavities 4730 can be substantially the same for the entire thickness. In some examples, the average characteristic dimension of the set of third cavities 4730 can vary with the thickness (e.g., tapered or stepped).

The set of third cavities 4730 can have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the set of third cavities 4730 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the set of third cavities 4730 can range from any of the minimum values described above to any of the maximum values described above. For example, the average characteristic dimension of the set of third cavities 4730 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

In some examples, the average characteristic dimension of each of the set of third cavities 4730 is substantially the same (e.g., the average characteristic dimension of each of the set of third cavities 4730 is substantially the same as the average characteristic dimension of the set of third cavities 4730). In some examples, the average characteristic dimension of the set of third cavities 4730 is greater than the average characteristic dimension of the set of second cavities 4350.

The fourth layer 4720 is disposed on the third layer 4620 in the vapor cell preform 4130, such that the bottom surface 4724 of the fourth layer 4720 is disposed on the top surface 4622 of the third layer 4620; wherein the set of third cavities 4730 together with the top surface 4622 of the third layer 4620 defines a set of containers 4830. The set of containers 4830 each have an open top (e.g., open at the top surface 4722 of the fourth layer 4720).

In some examples, the top surface 4622 and the bottom surface 4624 of the third layer 4620 and the top surface 4722 and the bottom surface 4724 of the fourth layer 4720 are all substantially parallel to each other in the vapor cell preform 4130. In some examples, the fourth layer 4720 is disposed on the third layer 4620 in the vapor cell preform 4130, such that the bottom surface 4724 of the fourth layer 4720 is disposed on and in physical contact with the top surface 4622 of the third layer 4620. In some examples, the third layer 4620 is bonded to the fourth layer 4720. For example, the third layer 4620 can be bonded to the fourth layer 4720 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

In some examples, the methods can further comprise making the set of third cavities 4730 in fourth layer 4720. The set of third cavities 4730 can be patterned in the fourth layer 4720 using standard techniques known in the art, such as lithographic patterning, etching, micromachining, deep reactive ion etching, direct laser ablation, and the like. In some examples, the methods can further comprise disposing the fourth layer 4720 on the third layer 4620. In some examples, the methods can further comprise bonding the fourth layer 4720 and the third layer 4620. For example, the fourth layer 4720 can be bonded to the third layer 4620 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein can, for example, further comprise, disposing the vapor cell preform 4130 on the device 4120 after the fluid 4500 has dried to form the residue 4510.

Figure 69:
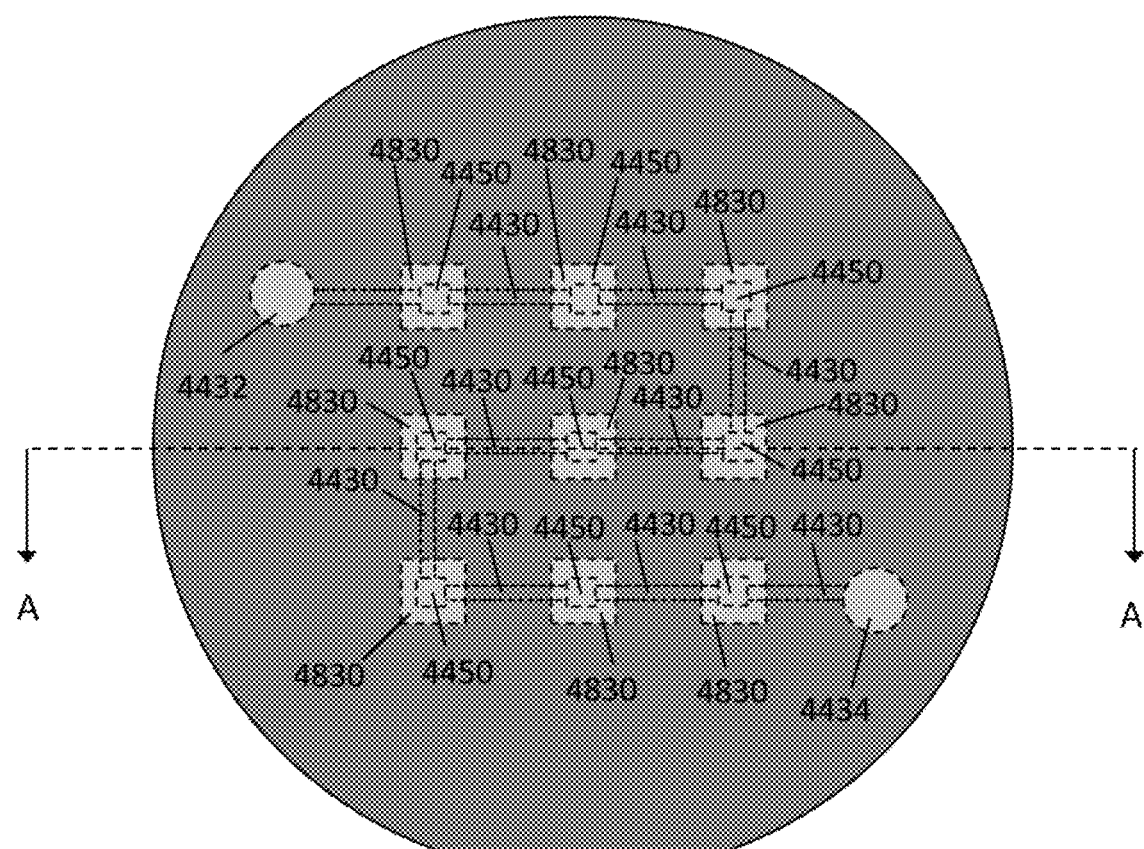
FIG. 69 is a schematic plan view of an example system comprising an example vapor cell preform and an example device as disclosed herein according to one implementation.
Figure 70:
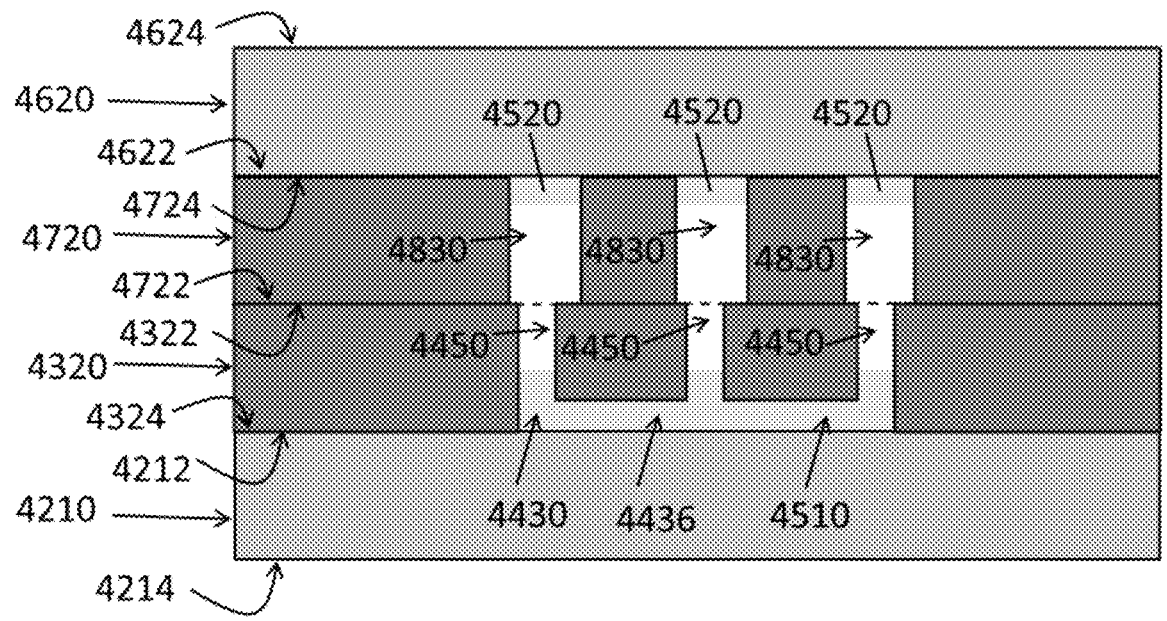
FIG. 70 is a schematic plan view of the example system along line A-A in FIG. 69, wherein the example system includes an alkali metal deposited in the containers according to one example implementation.

Referring now to FIG. 69-FIG. 70, also disclosed herein are systems wherein the vapor cell preform 4130 is disposed on the device 4120 such that the top surface 4722 of the fourth layer 4720 is disposed on the top surface 4322 of the second layer 4320 and the set of containers 4830 are aligned over the set of receptacles 4450. In some examples, the central longitudinal axis of each of the set of receptacles 4450 are substantially parallel to the central longitudinal axis of each of the set of containers 4830.

The methods disclosed herein can, for example, further comprise, disposing the vapor cell preform 4130 on the device 4120 after the fluid 5500 has dried to form the residue 4510, subjecting the residue 4510 to a reaction stimulus, thereby forming an alkali metal vapor, which enters the set of containers 4830, thereby depositing the alkali metal 4520 into the containers 4830. The alkali metal vapor can comprise, for example, potassium, rubidium, cesium, or a combination thereof. The reaction stimulus can, for example, comprise heating the residue 4510 at an elevated temperature, irradiating the residue 4510 with ultraviolet radiation, electrolyzing the residue 4510, a diffusive stimulus, or a combination thereof. In some examples, the alkali metal in the containers condenses to form a condensate.

The methods can, in some examples, further comprise separating the vapor cell preform 4130 from the device 4120 after the alkali metal has been deposited into the containers 4830, optionally injecting a buffer gas (e.g., Na, Ne, Ar, Xe, He, Kr, $CH_4$, etc.) into the containers (the alkali metal and the buffer gas being inert to each other), and sealing the containers 4830. As used herein, "sealed" and variants thereof (e.g., seal, sealing, and the like) refer to a fluid impermeable barrier the prevents communication of fluids into or out of the sealed container.

Figure 71:
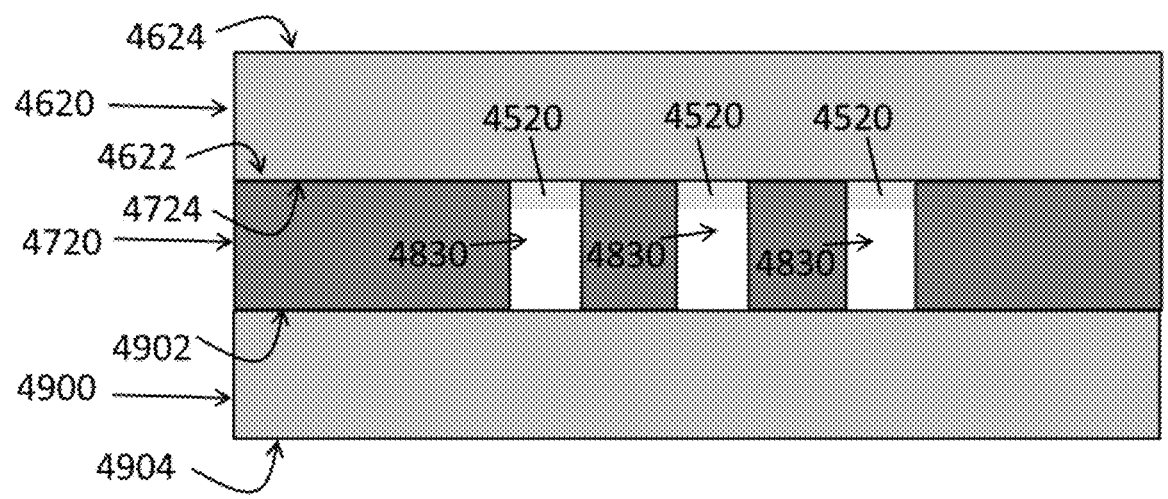
FIG. 71 is a cross-sectional plan view of the example system wherein the example system includes a substrate according to one example implementation.

Sealing the containers 4830 can, for example, comprise disposing the vapor cell preform on a substrate 4900 after the alkali metal has been deposited into the containers 4830, and optionally after injecting a buffer gas into the containers 4830, such that the top surface 4722 of the fourth layer 4720 is disposed on the substrate 4900, thereby closing the open tops of the set of containers 4830 (FIG. 71). In some examples, the methods can further comprise bonding the fourth layer 4720 to the substrate 4900, thereby sealing the alkali metal (and optional buffer gas) in the containers 4830. For example, the fourth layer 4720 can be bonded to the substrate 4900 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The substrate 4900 can have a top surface 4902 and a bottom surface 4904 opposite and spaced apart from the top surface 4902. In some examples, the top surface 4902 and the bottom surface 4904 of the substrate 4900 are substantially parallel to each other. The substrate 4900 can comprise any material consistent with the methods, devices, and systems disclosed herein. In some examples, the substrate 4900 can comprise a dielectric, a semiconductor, a ceramic, a transparent conducing oxide, a polymer, a metal, or a combination thereof. Examples of substrates 4900 include, but are not limited to, glass, quartz, Pyrex, fused silica, silicon dioxide, silicon nitride, sapphire, a polymer (e.g., polycarbonate), and combinations thereof. In some examples, the substrate 4900 can be transparent. As used herein, a "transparent substrate 4900" is meant to include any substrate 4900 that is transparent at the wavelength or wavelength region of interest. In some examples, the substrate 4900 comprises glass (e.g., aluminosilicate glass, borosilicate glass, etc.).

The substrate 4900 has an average thickness, the average thickness being the average dimension from the top surface 4902 to the bottom surface 4904. The average thickness of the substrate 4900 can, for example be 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the substrate 4900 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average thickness of the substrate 4900 can range from any of the minimum values described above to any of the maximum values described above. For example, the average thickness of the substrate 4900 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, or from 10 µm to 1 mm).

The top surface 4902 and the bottom surface 4904 of the substrate 4900 can, independently, be any shape. In some examples, the top surface 4902 and the bottom surface 4904 of the substrate 4900 can, independently, be substantially circular, ovate, ovoid, elliptic, triangular, rectangular, polygonal, etc. In some examples, the top surface 4902 and the bottom surface 4904 of the substrate 4900 can be substantially the same shape. In some examples, the top surface 4902 and the bottom surface 4904 of the substrate 4900 can be substantially circular.

The substrate 4900 has an average lateral dimension (e.g., diameter when the substrate 4900 is a circular wafer) of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the substrate 4900 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average lateral dimension of the substrate 4900 can range from any of the minimum values described above to any of the maximum values described above. For example, the average lateral dimension of the substrate 4900 can be from 1 micrometer (µm) to 300 millimeters (mm) (e.g., from 1 µm to 100 µm, from 100 µm to 10 mm, from 10 mm to 300 mm, from 1 µm to 10 µm, from 10 µm to 100 µm, from 100 µm to 1 mm, from 1 mm to 10 mm, from 10 mm to 150 mm, from 150 mm to 300 mm, from 1 µm to 100 mm, from 1 µm to 50 mm, from 1 µm to 10 mm, from 10 µm to 300 mm, from 100 µm to 300 mm, from 1 mm to 300 mm, from 25 mm to 300 mm, or from 10 µm to 100 mm).

In some examples, the average lateral dimension of the substrate 4900 and the average lateral dimension of the fourth layer 4720 are substantially equal. In some examples, the top surface 4902 and the bottom surface 4904 of the substrate 4900 and the top surface 4722 and the bottom surface 4724 of the fourth layer 4720 are all substantially parallel to each other. In some examples, the fourth layer 4720 is disposed on the substrate 4900, such that the top surface 4724 of the fourth layer 4720 is disposed on and in physical contact with the top surface 4902 of the substrate 4900.

In some examples, the methods described herein can be used to form a plurality of alkali metal vapor cells on a single wafer simultaneously in parallel (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more).

In some examples, the methods can further comprise separating one or more of the sealed containers (e.g., one or more of the alkali metal vapor cells) from the others without disrupting the seal. In some examples, the methods can further comprise separating each of the sealed containers (e.g., each of the alkali metal vapor cells) from one another without disrupting the seal. The sealed containers can be separated using methods known in the art, such as, for example, dicing, laser cutting, abrasive machining, chemical etching, micromachining, etc.

One or more of the method steps can, for example, be carried out either under vacuum or in a buffer-gas (e.g., anaerobic) environment, consistent with the requirements for application of the sealed containers in an atomic clock or magnetometer.

Also disclosed herein are devices comprising a first layer 5210 having a top surface 5212 and a bottom surface 5214 opposite and spaced apart from the top surface 5212. In some examples, the top surface 5212 and the bottom surface 5214 of the first layer 5210 are substantially parallel to each other.

The first layer 5210 can comprise any material consistent with the methods, devices, and systems disclosed herein. In some examples, the first layer 5210 can comprise a dielectric, a semiconductor, a ceramic, a transparent conducing oxide, a polymer, a metal, or a combination thereof. Examples of first layers 5210 include, but are not limited to, glass, quartz, Pyrex, fused silica, silicon dioxide, silicon nitride, sapphire, a polymer (e.g., polycarbonate), and combinations thereof. In some examples, the first layer 5210 can be transparent. As used herein, a "transparent layer" is meant to include any layer that is transparent at the wavelength or wavelength region of interest. In some examples, the first layer 5210 comprises glass (e.g., aluminosilicate glass, borosilicate glass, etc.).

The first layer 5210 has an average thickness, the average thickness being the average dimension from the top surface 5212 to the bottom surface 5214. The average thickness of the first layer 5210 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the first layer 5210 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the first layer 5210 can range from any of the minimum values described above to any of the maximum values described above. For example, the average thickness of the first layer 5210 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 5212 and the bottom surface 5214 of the first layer 5210 can, independently, be any shape. In some examples, the top surface 5212 and the bottom surface 5214 of the first layer 5210 can, independently, be substantially circular, ovate, ovoid, elliptic, triangular, rectangular, polygonal, etc. In some examples, the top surface 5212 and the bottom surface 5214 of the first layer 5210 can be substantially the same shape. In some examples, the top surface 5212 and the bottom surface 5214 of the first layer 5210 can be substantially circular.

The first layer 5210 has an average lateral dimension (e.g., diameter when the first layer 5210 is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the first layer 5210 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the first layer 5210 can range from any of the minimum values described above to any of the maximum values described above. For example, the average lateral dimension of the first layer 5210 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 mm to 300 mm, from 100 μm to 300 mm, from 1 mm to 300 mm, from 25 mm to 300 mm, or from 10 μm to 100 mm).

The devices further comprise a second layer 5320 having a top surface 5322 and a bottom surface 5324 opposite and spaced apart from the top surface. In some examples, the top surface 5322 and the bottom surface 5324 of the second layer 5320 are substantially parallel to each other.

The second layer 5320 can comprise any material consistent with the methods, devices, and systems disclosed herein. In some examples, the second layer 5320 can comprise a dielectric, a semiconductor, a ceramic, a transparent conducting oxide, a polymer, a metal, or a combination thereof. Examples of second layers 5320 include, but are not limited to, silicon, glass (e.g. aluminum coated glass), sapphire, a ceramic, and combinations thereof. In some examples, the second layer 5320 comprises silicon. In some examples, the second layer 5320 is hydrophilic.

The second layer 5320 has an average thickness, the average thickness being the average dimension from the top surface 5322 to the bottom surface 5324. The average thickness of the second layer 5320 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the second layer 5320 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the second layer 5320 can range from any of the minimum values described above to any of the maximum values described above. For example, the average thickness of the second layer 5320 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 5322 and the bottom surface 5324 of the second layer 5320 can, independently, be any shape. In some examples, the top surface 5322 and the bottom surface 5324 of the second layer 5320 can, independently, be substantially circular, ovate, ovoid, elliptic, triangular, rectangular, polygonal, etc. In some examples, the top surface 5322 and the bottom surface 5324 of the second layer 5320 can be substantially the same shape. In some examples, the top surface 5322 and the bottom surface 5324 of the second layer 5320 can be substantially circular.

In some examples, the top surface 5212 and the bottom surface 5214 of the first layer 5210 and the top surface 5322 and the bottom surface 5324 of the second layer 5320 are all substantially circular.

The second layer 5320 has an average lateral dimension (e.g., diameter when the second layer 5320 is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the second layer 5320 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the second layer 5320 can range from any of the minimum values described above to any of the maximum values described above. For example, the average lateral dimension of the second layer 5320 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm). In some examples, the average lateral dimension of the second layer 5320 and the average lateral dimension of the first layer 5210 are substantially equal.

Figure 72:
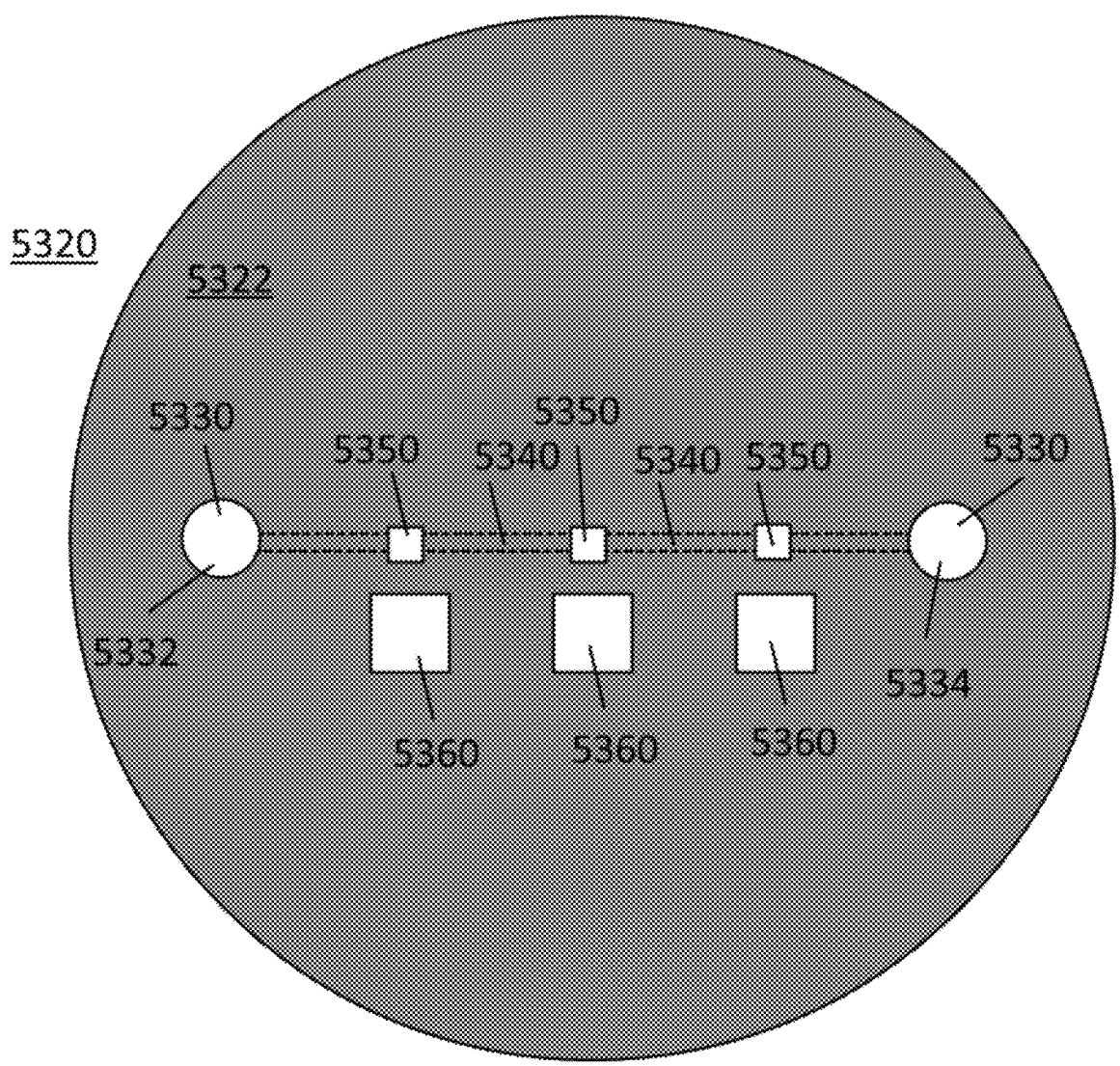
FIG. 72 is a schematic plan view of an example second layer as disclosed herein according to one implementation.

Referring now to FIG. 72, the second layer 5320 comprises a set of first cavities 5330, a groove 5340, a set of second cavities 5350, and a set of third cavities 5360; wherein the set of first cavities 5330 comprise an inlet shaft 5332 and an outlet shaft 5334, wherein the inlet shaft 5332 and the outlet shaft 5334 each perforates the second layer 5320 from the top surface 5322 to the bottom surface 5324; wherein each of the second cavities 5350 perforates the second layer 5320 from the top surface 5322 to the bottom surface 5324; wherein each of the third cavities 5360 perforates the second layer 5320 from the top surface 5322 to the bottom surface 5324; wherein the groove 5340 extends from the inlet shaft 5332 to the outlet shaft 5334 along the bottom surface 5324 of the second layer 5320; wherein the inlet shaft 5332, the outlet shaft 5334, and each of the second cavities 5350 are in fluid communication with the groove 5340; wherein each of the third cavities 5360 is fluidly isolated from the inlet shaft 5332, the outlet shaft 5334, the groove 5340, and the set of second cavities 5350; and wherein each of the third cavities 5360 is located adjacent to one of the second cavities 5350.

The inlet shaft 5332 and the outlet shaft 5334 each independently has a central longitudinal axis and a cross-sectional shape in a plane perpendicular to the central longitudinal axis of said shaft, wherein the cross-sectional shape can be any shape, such as a regular shape, an irregular shape, an isotropic shape, or an anisotropic shape. In some examples, the cross-sectional shape of the inlet shaft 5332 and/or the outlet shaft 5334 can be substantially circular, ovate, ovoid, elliptic, triangular, rectangular, polygonal, etc. In some examples, the cross-sectional shape of the inlet shaft 5332 and/or the outlet shaft 5334 can be substantially circular, as shown in FIG. 72. In some examples, the central longitudinal axis of the inlet shaft 5332 and/or the outlet shaft 5334 is substantially perpendicular to the bottom surface 5324 of the second layer 5320 (e.g., such that the cross-sectional shape is in a plane substantially parallel to the bottom surface 5324 of the second layer 5320). In some examples, the central longitudinal axis of the inlet shaft 5332 and the central longitudinal axis of the outlet shaft 5334 are substantially parallel. In some examples, the cross-sectional shape of each of the first cavities 5330 is the same. In some examples, the cross-sectional shape of the inlet shaft 5332 can be the same as the cross-sectional shape of the outlet shaft 5334. In some examples, the cross-sectional shape of the inlet shaft 5332 can be different than the cross-sectional shape of the outlet shaft 5334.

The inlet shaft 5332 and the outlet shaft 5334 can each independently have an average characteristic dimension. The term "characteristic dimension," as used herein refers to the largest straight line distance between two points in the plane of the cross-sectional shape (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension. For example, for a cylindrical inlet shaft 5332 and/or outlet shaft 5334, the cross-sectional shape can be substantially circular and the average characteristic dimension can refer to the diameter. In some examples, the average characteristic dimension of the inlet shaft 5332 and/or the outlet shaft 5334 can be substantially the same for the entire thickness. In some examples, the average characteristic dimension of the inlet shaft 5332 and/or the outlet shaft 5334 can vary with the thickness (e.g., tapered or stepped).

The inlet shaft 5332 and/or the outlet shaft 5334 can independently have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the inlet shaft 5332 and/or the outlet shaft 5334 can independently have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the inlet shaft 5332 and/or the outlet shaft 5334 can independently range from any of the minimum values described above to any of the maximum values described above. For example, the average characteristic dimension of the inlet shaft 5332 and/or the outlet shaft 5334 can independently be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm). In some examples, the average characteristic dimension of the inlet shaft 5332 and the average characteristic dimension of the outlet shaft 5334 are substantially equal.

As used herein, "a set of second cavities 5350" and "the set of second cavities 5350" are meant to include any number of second cavities 5350 in any arrangement. Thus, for example, "a set of second cavities 5350" includes one or more second cavities 5350 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of second cavities 5350 can comprise a plurality of second cavities 5350. In some examples, the set of second cavities 5350 comprises a plurality of second cavities 5350 in an ordered array.

Each of the set of second cavities 5350 has a central longitudinal axis and a cross-sectional shape in a plane perpendicular to the central longitudinal axis of said cavity 5350, wherein the cross-sectional shape can be any shape, such as a regular shape, an irregular shape, an isotropic shape, or an anisotropic shape. In some examples, the cross-sectional shape of each of the set of second cavities 5350 can be substantially circular, ovate, ovoid, elliptic, triangular, rectangular, polygonal, etc. In some examples, the cross-sectional shape of each of the set of second cavities 5350 is substantially the same. In some examples, the cross-sectional shape of the set of second cavities can be substantially circular. In some examples, the cross-sectional shape of the set of second cavities 5350 can be substantially rectangular, as shown in FIG. 72. In some examples, the cross-sectional shape of each of the second cavities 5350 is the same. In some examples, the cross-sectional shape of the set of second cavities 5350 can be the same as the cross-sectional shape of the set of first cavities 5330. In some examples, the cross-sectional shape of the set of second cavities 5350 can be different than the cross-sectional shape of the set of first cavities 5330.

In some examples, the central longitudinal axis of each of the set of second cavities 5350 are substantially parallel to each other. In some examples, the central longitudinal axis of each of the set of second cavities 5350 are substantially parallel to the central longitudinal axis of the inlet shaft 5332. In some examples, the central longitudinal axis of each of the set of second cavities 5350 are substantially parallel to the central longitudinal axis of the outlet shaft 5334. In some examples, the central longitudinal axis of each of the set of second cavities 5350, the central longitudinal axis of the inlet shaft 5332, and the central longitudinal axis of the outlet shaft 5334 are all substantially parallel to one another. In some examples, the central longitudinal axis of each of the set of second cavities 5350 is substantially perpendicular to the bottom surface 5324 of the second layer 5320 (e.g., such that the cross-sectional shape is in a plane substantially parallel to the bottom surface 5324 of the second layer 5320).

The set of second cavities 5350 can have an average characteristic dimension. The term "characteristic dimension," as used herein refers to the largest straight line distance between two points in the plane of the cross-sectional shape of each of the second cavities 5350 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of second cavities 5350, the cross-sectional shape can be substantially circular and the average characteristic dimension can refer to the average diameter. In some examples, the average characteristic dimension of the set of second cavities 5350 can be substantially the same for the entire thickness. In some examples, the average characteristic dimension of the set of second cavities 5350 can vary with the thickness (e.g., tapered or stepped).

The set of second cavities 5350 can have an average characteristic dimension of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the set of second cavities 5350 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average characteristic dimension of the set of second cavities 5350 can range from any of the minimum values described above to any of the maximum values described above. For example, the average characteristic dimension of the set of second cavities 5350 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, from 10 μm to 1 mm, from 100 μm to 10 mm, from or 100 μm to 1 mm).

In some examples, the average characteristic dimension of each of the set of second cavities 5350 is substantially the same (e.g., the average characteristic dimension of each of the set of second cavities 5350 is substantially the same as the average characteristic dimension of the set of second cavities 5350). In some examples, the average characteristic dimension of the set of second cavities 5350 is less than or equal to the average characteristic dimension of the inlet shaft 5332 and/or the outlet shaft 5334.

As used herein, "a set of third cavities 5360" and "the set of third cavities 5360" are meant to include any number of third cavities 5360 in any arrangement. Thus, for example, "a set of third cavities 5360" includes one or more third cavities 5360 (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more). In some examples, the set of third cavities 5360 can comprise a plurality of third cavities 5360, wherein each of the third cavities 5360 is located adjacent one of the second cavities 5350. In some examples, the set of third cavities 5360 comprises a plurality of third cavities 5360, wherein each of the third cavities 5360 is located adjacent one of the second cavities 5350 in an ordered array. In some examples, the number of third cavities 5360 and the number of second cavities 5350 is the same.

Each of the set of third cavities 5360 has a central longitudinal axis and a cross-sectional shape in a plane perpendicular to the central longitudinal axis of said cavity 5360, wherein the cross-sectional shape can be any shape, such as a regular shape, an irregular shape, an isotropic shape, or an anisotropic shape. In some examples, the cross-sectional shape of each of the set of third cavities 5360 can be substantially circular, ovate, ovoid, elliptic, triangular, rectangular, polygonal, etc. In some examples, the cross-sectional shape of each of the set of third cavities 5360 is substantially the same. In some examples, the cross-sectional shape of the set of third cavities can be substantially circular. In some examples, the cross-sectional shape of the set of third cavities 5360 can be substantially rectangular, as shown in FIG. 72. In some examples, the cross-sectional shape of each of the third cavities 5360 is the same. In some examples, the cross-sectional shape of the set of third cavities 5360 can be the same as the cross-sectional shape of the set of second cavities 5350. In some examples, the cross-sectional shape of the set of third cavities 5360 can be different than the cross-sectional shape of the set of second cavities 5350.

In some examples, the central longitudinal axis of each of the set of third cavities 5360 are substantially parallel to each other. In some examples, the central longitudinal axis of each of the set of third cavities 5360 are substantially parallel to the central longitudinal axis of the inlet shaft 5332. In some examples, the central longitudinal axis of each of the set of third cavities 5360 are substantially parallel to the central longitudinal axis of the outlet shaft 5334. In some examples, the central longitudinal axis of each of the set of third cavities 5360 are substantially parallel to the central longitudinal axis of each of the set of second cavities 5350. In some examples, the central longitudinal axis of each of the set of second cavities 5350, the central longitudinal axis of each of the set of third cavities 5350, the central longitudinal axis of the inlet shaft 5332, and the central longitudinal axis of the outlet shaft 5334 are all substantially parallel to one another. In some examples, the central longitudinal axis of each of the set of third cavities 5360 is substantially perpendicular to the bottom surface 5324 of the second layer 5320 (e.g., such that the cross-sectional shape is in a plane substantially parallel to the bottom surface 5324 of the second layer 5320).

The set of third cavities 5360 can have an average characteristic dimension. The term "characteristic dimension," as used herein refers to the largest straight line distance between two points in the plane of the cross-sectional shape of each of the third cavities 5360 (e.g., the diameter of a circular cross-sectional shape, the diagonal of a rectangular cross-sectional shape, the bisector of a triangular cross-sectional shape, etc.). "Average characteristic dimension" and "mean characteristic dimension" are used interchangeably herein, and generally refer to the statistical mean characteristic dimension of the cavities in a population of cavities. For example, for a cylindrical set of third cavities 5360, the cross-sectional shape can be substantially circular and the average characteristic dimension can refer to the average diameter. In some examples, the average characteristic dimension of the set of third cavities 5360 can be substantially the same for the entire thickness. In some examples, the average characteristic dimension of the set of third cavities 5360 can vary with the thickness (e.g., tapered or stepped).

The set of third cavities 5360 can have an average characteristic dimension of 1 micrometer (micron, µm) or more (e.g., 5 µm or more, 10 µm or more, 15 µm or more, 20 µm or more, 25 µm or more, 30 µm or more, 40 µm or more, 50 µm or more, 75 µm or more, 100 µm or more, 125 µm or more, 150 µm or more, 200 µm or more, 250 µm or more, 300 µm or more, 400 µm or more, 500 µm or more, 750 µm or more, 1 millimeter (mm) or more, 1.25 mm or more, 1.5 mm or more, 2 mm or more, 2.5 mm or more, 3 mm or more, 4 mm or more, 5 mm or more, 6 mm or more, 7 mm or more, 8 mm or more, or 9 mm or more). In some examples, the set of third cavities 5360 can have an average characteristic dimension of 10 millimeters (mm) or less (e.g., 9 mm or less, 8 mm or less, 7 mm or less, 6 mm or less, 5 mm or less, 4 mm or less, 3 mm or less, 2.5 mm or less, 2 mm or less, 1.5 mm or less, 1.25 mm or less, 1 mm or less, 750 micrometer (µm) or less, 500 µm or less, 400 µm or less, 300 µm or less, 250 µm or less, 200 µm or less, 150 µm or less, 125 µm or less, 100 µm or less, 75 µm or less, 50 µm or less, 40 µm or less, 30 µm or less, 25 µm or less, 20 µm or less, 15 µm or less, 10 µm or less, or 5 µm or less). The average characteristic dimension of the set of third cavities 5360 can range from any of the minimum values described above to any of the maximum values described above. For example, the average characteristic dimension of the set of third cavities 5360 can be from 1 micrometer (µm) to 10 millimeters (mm) (e.g., from 1 µm to 100 µm, from 100 µm to 10 mm, from 1 µm to 10 µm, from 10 µm to 100 µm, from 100 µm to 1 mm, from 1 mm to 10 mm, from 1 µm to 1 mm, from 10 µm to 10 mm, from 10 µm to 1 mm, from 100 µm to 10 mm, from or 100 µm to 1 mm).

In some examples, the average characteristic dimension of each of the set of third cavities 5360 is substantially the same (e.g., the average characteristic dimension of each of the set of third cavities 5360 is substantially the same as the average characteristic dimension of the set of third cavities 5360). In some examples, the average characteristic dimension of the set of third cavities 5360 is greater than the average characteristic dimension of the set of second cavities 5350.

The groove 5340 traverses the bottom surface 5324 of the second layer 5320 from the inlet shaft 5332 to the outlet shaft 5334, intersecting with each of the second cavities 5350 therebetween. In some examples, the groove 5340 traverses the bottom surface 5324 of the second layer 5320 from the inlet shaft 5332 to the outlet shaft 5334, intersecting with each of the second cavities 5350 sequentially therebetween.

The second layer 5320 is disposed on the first layer 5210 in the device 5120, such that the bottom surface 5324 of the second layer 5320 is disposed on the top surface 5212 of the first layer 5210; wherein the inlet shaft 5332, the outlet shaft 5334, and the groove 5340 together with the top surface 5212 of the first layer 5210 defines a main conduit 5430 having a longitudinal axis, an inlet 5432, an outlet 5434 axially spaced apart from the inlet 5432, and a lumen 5436 for fluid flow extending from the inlet 5432 to the outlet 5434; wherein the set of second cavities 5350 together with the top surface 5212 of the first layer 5210 defines a set of receptacles 5450; wherein the set of third cavities 5360 together with the top surface 5212 of the first layer 5210 defines a set of containers 5416; and wherein each of the receptacles 5450 is in fluid communication with the lumen 5436 of the main conduit 5430; such that, when a fluid 5500 flows from the inlet 5432 to the outlet 5434 through the lumen 5436 of the main conduit 5430, the fluid 5500 further flows into each of the receptacles 5450 via capillary action, such that the fluid 5500 at least partially fills each of the receptacles 5450.

The inlet 5432, the outlet 5434, the set of receptacles 5450, and the set of containers 5416 each have an open top (e.g., open at the top surface 5322 of the second layer 5320). In some examples, the top surface 5212 and the bottom surface 5214 of the first layer 5210 and the top surface 5322 and the bottom surface 5324 of the second layer 5320 are all substantially parallel to each other. In some examples, the second layer 5320 is disposed on the first layer 5210, such that the bottom surface 5324 of the second layer 5320 is disposed on and in physical contact with the top surface 5212 of the first layer 5210. In some examples, the first layer 5210 is bonded to the second layer 5320. For example, the first layer 5210 can be bonded to the second layer 5320 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

The methods disclosed herein comprise, for example, flowing a fluid 5500 from the inlet 5432 to the outlet 5434 through the lumen 5436 of the main conduit 5430, such that the fluid 5500 further flows into each of the receptacles 5450 via capillary action and the fluid 5500 at least partially fills each of the receptacles 5450.

The fluid 5500 can, for example, comprise an alkali metal precursor and a solvent. The alkali metal precursor can, for example, comprise any compound or composition capable of reacting to form a free alkali metal. The alkali metal precursor can, for example, comprise an alkali metal compound, wherein the alkali metal can include an alkali atom, an alkaline earth atom, a lanthanide, an actinide, or combinations thereof. In some examples, the alkali metal precursor can, for example, comprise an alkali metal compound, wherein the alkali metal can include potassium (K), rubidium (Rb), cesium (Cs), or a combination thereof. The alkali metal precursor can, for example, comprise an alkali halide (e.g., an alkali chloride), an azide, a chromate, a molibdate, or a combination thereof. Exemplary alkali halides include RbCl, CsCl, KCl, RbBr, CsBr, KBr, and the like. Exemplary alkali azides include $RbN_3$, $CsN_3$, $KN_3$, and the like. In some examples, the alkali metal precursor can include $RbN_3$, $CsN_3$, $KN_3$ that can produce alkali metal in response to being subjected to ultraviolet light. Alkali halides can, for example, be reacted with $BaN_6$ or Ca to produce alkali metal. In some examples, alkali metal precursor includes $BaN_6$ and an alkali chloride, which can react to form $BaCl$, $N_2$, and alkali metal in response to heating. In some examples, the fluid can further comprise a reducing agent such as barium azide, calcium, zirconium, or aluminum. Examples of suitable solvents include, but are not limited to, tetrahydrofuran (THF), N-methyl-2-pyrrolidone (NMP), dimethylformamide (DMF), N-methylformamide, formamide, dimethyl sulfoxide (DMSO), dimethylacetamide, dichloromethane ($CH_2Cl_2$), ethylene glycol, polyethylene glycol, glycerol, alkane diol, tetraglyme, propylene carbonate, diglyme, dimethoxyethane, ethanol, methanol, propanol, isopropanol, water, acetonitrile, chloroform, acetone, hexane, heptane, toluene, xylene, methyl acetate, ethyl acetate, and combinations thereof. In some examples, the solvent comprises water such that the fluid comprises an aqueous solution comprising the alkali metal precursor.

The methods can, for example, comprise drying the fluid 5500, for example by evaporating the solvent, thereby forming a residue 5520 comprising the alkali metal precursor as a solid. Wherein, upon drying the liquid 5500, the residue 5520 comprising the alkali metal precursor as a solid is stable (e.g., stable at room temperature).

In some examples, the methods can further comprise making the set of first cavities 5330, the groove 5340, the set of second cavities 5350, and the set of third cavities 5360 in second layer 5320. The set of first cavities 5330, the groove 5340, the set of second cavities 5350, and the set of third cavities 5360 can be patterned in the second layer using standard techniques known in the art, such as lithographic patterning, etching, micromachining, deep reactive ion etching, direct laser ablation, and the like. In some examples, the methods can further comprise disposing the second layer 5320 on the first layer 5210. In some examples, the methods can further comprise bonding the first layer 5210 and the second layer 5320. For example, the first layer 5210 can be bonded to the second layer 5310 via adhesive bonding (e.g., via an appropriate glue or other adhesive), anodic bonding, thermocompression bonding, fusion bonding, eutectic bonding, direct bonding, complex oxide bonding, metallic bonding, or a combination thereof.

In some examples, the devices further comprise a third layer 5610 having a top surface 5612 and a bottom surface 5614 opposite and spaced apart from the top surface 5612. In some examples, the top surface 5612 and the bottom surface 5614 of the third layer 5610 are substantially parallel to each other.

The third layer 5610 can comprise any material consistent with the methods, devices, and systems disclosed herein. In some examples, the third layer 5610 can comprise a dielectric, a semiconductor, a ceramic, a transparent conducing oxide, a polymer, a metal, or a combination thereof. Examples of third layers 5610 include, but are not limited to, glass, quartz, Pyrex, fused silica, silicon dioxide, silicon nitride, sapphire, a polymer (e.g., polycarbonate), and combinations thereof. In some examples, the third layer 5610 can be transparent. As used herein, a "transparent layer" is meant to include any layer that is transparent at the wavelength or wavelength region of interest. In some examples, the third layer 5610 comprises glass (e.g., aluminosilicate glass, borosilicate glass, etc.).

The third layer 5610 has an average thickness, the average thickness being the average dimension from the top surface 5612 to the bottom surface 5614. The average thickness of the third layer 5610 can, for example be 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.25 mm or more, 1.5 mm or more, 1.75 mm or more, 2 mm or more, 2.5 mm or more, 3 mm or more, 3.5 mm or more, 4 mm or more, 4.5 mm or more, 5 mm or more, 6 mm or more, 7 mm or more, 8 mm or more, or 9 mm or more). In some examples, the average thickness of the third layer 5610 can be 10 millimeters (mm) or less (e.g., 9 mm or less, 8 mm or less, 7 mm or less, 6 mm or less, 5 mm or less, 4.5 mm or less, 4 mm or less, 3.5 mm or less, 3 mm or less, 2.5 mm or less, 2 mm or less, 1.75 mm or less, 1.5 mm or less, 1.25 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average thickness of the third layer 5610 can range from any of the minimum values described above to any of the maximum values described above. For example, the average thickness of the third layer 5610 can be from 1 micrometer (μm) to 10 millimeters (mm) (e.g., from 1 μm to 100 μm, from 100 μm to 10 mm, from 1 μm to 10 μm, from 10 μm to 100 μm, from 100 μm to 1 mm, from 1 mm to 10 mm, from 1 μm to 1 mm, from 10 μm to 10 mm, or from 10 μm to 1 mm).

The top surface 5612 and the bottom surface 5614 of the third layer 5610 can, independently, be any shape. In some examples, the top surface 5612 and the bottom surface 5614 of the third layer 5610 can, independently, be substantially circular, ovate, ovoid, elliptic, triangular, rectangular, polygonal, etc. In some examples, the top surface 5612 and the bottom surface 5614 of the third layer 5610 can be substantially the same shape. In some examples, the top surface 5612 and the bottom surface 5614 of the third layer 5610 can be substantially circular.

The third layer 5610 has an average lateral dimension (e.g., diameter when the third layer 5610 is a circular wafer) of 1 micrometer (micron, μm) or more (e.g., 5 μm or more, 10 μm or more, 15 μm or more, 20 μm or more, 25 μm or more, 30 μm or more, 40 μm or more, 50 μm or more, 75 μm or more, 100 μm or more, 125 μm or more, 150 μm or more, 200 μm or more, 250 μm or more, 300 μm or more, 400 μm or more, 500 μm or more, 750 μm or more, 1 millimeter (mm) or more, 1.5 mm or more, 2 mm or more, 2.5 mm or more, 3 mm or more, 4 mm or more, 5 mm or more, 10 mm or more, 15 mm or more, 20 mm or more, 25 mm or more, 30 mm or more, 40 mm or more, 50 mm or more, 75 mm or more, 100 mm or more, 125 mm or more, 150 mm or more, 200 mm or more, or 250 mm or more). In some examples, the average lateral dimension of the third layer 5610 can be 300 millimeters (mm) or less (e.g., 250 mm or less, 200 mm or less, 150 mm or less, 125 mm or less, 100 mm or less, 75 mm or less, 50 mm or less, 40 mm or less, 30 mm or less, 25 mm or less, 20 mm or less, 15 mm or less, 10 mm or less, 5 mm or less, 4 mm or less, 3 mm or less, 2.5 mm or less, 2 mm or less, 1.5 mm or less, 1 mm or less, 750 micrometer (μm) or less, 500 μm or less, 400 μm or less, 300 μm or less, 250 μm or less, 200 μm or less, 150 μm or less, 125 μm or less, 100 μm or less, 75 μm or less, 50 μm or less, 40 μm or less, 30 μm or less, 25 μm or less, 20 μm or less, 15 μm or less, 10 μm or less, or 5 μm or less). The average lateral dimension of the third layer 5610 can range from any of the minimum values described above to any of the maximum values described above. For example, the average lateral dimension of the third layer 5610 can be from 1 micrometer (μm) to 300 millimeters (mm) (e.g., from 1 μm to 100 μm, from 100 μm to 10 mm, from 10 mm to 300 mm, from 1 μm to 10 μm, from 10 μm to 100 μm, from 100 μm to 1 mm, from 1 mm to 10 mm, from 10 mm to 150 mm, from 150 mm to 300 mm, from 1 μm to 100 mm, from 1 μm to 50 mm, from 1 μm to 10 mm, from 10 μm to 300 mm, from 100 μm to 300 mm, from 1 mm to 300 mm, from 25 mm to 300 mm, or from 10 μm to 100 mm).

The methods disclosed herein can, for example, further comprise, disposing the third layer 5610 on the second layer 5320 after the fluid 5500 has dried to form the residue 5510.

The third layer 5610 is disposed on the second layer 5320, such that the bottom surface 5614 of the third layer 5610 is disposed on the top surface 5322 of the second layer 5320, such that the bottom surface 5614 of the third layer 5610 encloses the open top of the inlet 5432, the outlet 5434, the set of receptacles 5450, and the set of containers 5416. In some examples, the third layer 5610 is disposed on the second layer 5320, such that the bottom surface 5614 of the third layer 5610 is disposed on and in physical contact with the top surface 5322 of the second layer 5320. In some examples, the top surface 5612 and the bottom surface 5614 of the third layer 5610, the top surface 5322 and the bottom surface 5324 of the second layer 5320, and the top surface 5212 and the bottom surface 5214 of the first layer 5210 are all substantially parallel to each other in the device.

The methods disclosed herein comprise, for example, comprise subjecting the residue 5510 to a reaction stimulus, thereby forming an alkali metal vapor, which forms a condensate 5520 on the portion of the bottom surface of the third layer 5610 above the set of receptacles 5450. The alkali metal vapor can comprise, for example, potassium, rubidium, cesium, or a combination thereof. The reaction stimulus can, for example, comprise heating the residue 5510 at an elevated temperature, irradiating the residue 5510 with ultraviolet radiation, electrolyzing the residue 5510, a diffusive stimulus, or a combination thereof. The methods can further comprise laterally shifting the third layer 5610 relative to the first layer 5210 and second layer 5320, such that the condensate 5520 is aligned within the set of containers 5416.

In some examples, the methods described herein can be used to form a plurality of alkali metal vapor cells on a single wafer simultaneously in parallel (e.g., 2 or more; 3 or more; 4 or more; 5 or more; 10 or more; 15 or more; 20 or more; 25 or more; 30 or more; 40 or more; 50 or more; 75 or more; 100 or more; 125 or more; 150 or more; 200 or more; 250 or more; 300 or more; 400 or more; 500 or more; 750 or more; 1000 or more; 1250 or more; 1500 or more; 2000 or more; 2500 or more; 3000 or more; 4000 or more; 5000 or more; 7500 or more; 10,000 or more; 15,000 or more; 20,000 or more; 25,000 or more; 30,000 or more; 40,000 or more; 50,000 or more; 75,000 or more; 100,000 or more; 150,000 or more; 200,000 or more; 250,000 or more; 300,000 or more; 400,000 or more; 500,000 or more; 750,000 or more; or 1,000,000 or more).

In some examples, the methods can further comprise separating one or more of the sealed containers (e.g., one or more of the alkali metal vapor cells) from the others without disrupting the seal. In some examples, the methods can further comprise separating each of the sealed containers (e.g., each of the alkali metal vapor cells) from one another without disrupting the seal. The sealed containers can be separated using methods known in the art, such as, for example, dicing, laser cutting, abrasive machining, chemical etching, micromachining, etc.

One or more of the method steps can, for example, be carried out either under vacuum or in a buffer-gas (e.g., anaerobic) environment, consistent with the requirements for application of the sealed containers in an atomic clock or magnetometer.

Also disclosed herein are methods of use of any of the alkali metal vapor cells described herein (e.g., made by any of the methods described herein). Any of the alkali metal vapor cells described herein (e.g., made by any of the methods described herein) can be used, for example, as the alkali metal vapor source in atomic clocks, atomic magnetometers, gyroscopes based on nuclear magnetic resonance, wavelength references, quantum information storage devices, voltage references, current references, temperature sensors, and other sensors.

The examples below are intended to further illustrate certain aspects of the systems and methods described herein, and are not intended to limit the scope of the claims.

EXAMPLES

The following examples are set forth below to illustrate the methods and results according to the disclosed subject matter. These examples are not intended to be inclusive of all aspects of the subject matter disclosed herein, but rather to illustrate representative methods and results. These examples are not intended to exclude equivalents and variations of the present invention which are apparent to one skilled in the art.

Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of measurement conditions, e.g., component concentrations, temperatures, pressures and other measurement ranges and conditions that can be used to optimize the described process.

Example 1

Various embodiments of the present technology generally relate to techniques for fabrication of alkali vapor cells which can have arbitrary or no buffer gasses. In some examples, described herein are processes and experimental parameters for fabrication of alkali vapor cells which can have arbitrary or no buffer gasses wherein the vapor cells are hermetic. The devices, systems, and methods described herein can be combined with other wafer and thin film processes. The devices, systems, and methods described herein can provide a tout toward creating small alkali vapor cells with a wafer level technique.

Some embodiments of the technology can be combined with other wafer level processes and thin films to create the smallest alkali vapor cells with a wafer level technique. There are many ways of fabricating alkali vapor cells and all have some detracting features. Existing methods for fabricating cells based on deposition of alkali metal are complicated to implement.

In contrast, various embodiments of the present technology allow for fabricating cells is a commercial system, while significantly reducing the risk of reengineering such a system. However, various embodiments could also be implemented in a different bonding system provided the wafers can be moved with respect to each other under vacuum.

Sealed cells containing a vapor of alkali metal (potassium, rubidium, or cesium) are widely used in almost all commercial atomic clocks and magnetometers, as well as other instruments. Various embodiments of the present technology provide allow for large numbers of vapor cells to be fabricated at the wafer-level with a commercial tool. The simplicity of some embodiments will result in considerably lower fabrication costs than existing methods of fabricating vapor cells.

There are a number of methods developed to fabricate alkali vapor cells using micromachined silicon and glass. The main challenge is how to get the alkali atoms into the cell and seal it, since alkali metal is highly reactive and difficult to handle. In one class of methods, three elements are present in an inert environment (a vacuum system or glovebox with a controlled atmosphere). There, an open "preform", consisting of a silicon wafer with holes etched all the way through it, and with glass bonded on one side, leaving the hole on the other side open. It is through this second hole that the alkali metal is introduced into the cell.

The second element is an alkali deposition head, which contains the chemical precursors to the alkali atoms. In a typical process, this deposition head is positioned over the preform and alkali metal is transferred into the hole. Then the deposition head is retracted allowing the third element, a glass lid, to be lowered onto the cell and bonded to the exposed silicon facet, sealing the alkali atoms in the hole. A significant disadvantage to this traditional method is the need for all three of these elements, and the required motion of each of them in the inert environment. The alkali deposition is by far the most challenging component in the cell fabrication process, and most deposition methods developed so far and challenging to get working and produce cells with low yield.

Moreover, handling pure alkali metal in an inert environment is complicated by the extremely small volumes of alkali metal desired in a typical vapor cell. Too much alkali metal leaves droplets on the glass surfaces which impedes their function in clocks and magnetometers. Alternative techniques produce too little alkali metal that is consumed by the glass surfaces. In contrast, various embodiments of the present technology provide techniques that use an aqueous solution of chemical precursors which through dilution can precisely tune the volume of alkali metal produced which is in unique contrast to manipulating pure alkali metal in a glovebox which is not robust nor is it nearly as precise.

Various embodiments of the present technology provide for a process in which the deposition head is incorporated into a wafer. The chemical precursors (usually $BaN_6$ and an alkali chloride) are placed in an array of holes in a wafer and are activated by heating. The resulting alkali metal is then deposited into an array of vapor cells held above.

Some embodiments of this method can be easily implemented using a commercial anodic bonding machine, meaning that the cell-filling apparatus can be simply purchased, rather than reengineered from scratch. The process is also very simple, meaning a recipe for fabricating the cells can be easily explained with a high chance of successful adoption by the receiving party.

In some examples, holes are drilled in a glass wafer (W2) that will form the lid of the cells. A frame is attached to the back of the glass wafer (W2) to form a deposition cavity, into which chemical precursors are inserted. An array of cell preforms (W1) is fabricated by etching holes in a silicon wafer and bonding glass to one side, leaving the holes in the wafer open on the other side. The two wafers are placed inside a vacuum system and are placed in contact such that the holes in W2 are situated above the holes in W1. The assembly is then heated to react the chemical precursors and produce a resultant compound, that exits the holes in W2 and is deposited into the bottom of the holes in W1. The wafers are then moved laterally, such that a solid part of W2 covers the holes in W1. The wafers are then bonded together, sealing the resultant compound in the cell preforms.

In some examples, blind holes are etched in the silicon wafer of the preform (W1) adjacent to the cell cavities. These blind holes are not connected to the cell cavities. The chemical precursors are placed in the blind holes. W1 is placed into a vacuum system, along with a glass wafer, W2. The wafers are placed into contact and the assembly is heated to cause the chemical precursors to react. The reaction creates a resultant compound, which is deposited onto the surface of W2. The wafers are then moved laterally such that the resultant compound is situated over the cell cavities. The wafers are then bonded together to form the cells.

In accordance with various embodiments, the chemical precursors could be $BaN_6$ and an alkali chloride, which reacts to form BaCl, $N_2$ and alkali metal at elevated temperature. The chemical precursors could also be an alkali azide ($RbN_3$, $CsN_3$, $KN_3$) that can be reacted with ultraviolet light rather than heating. The chemical precursors could also be any others that would result in desirable contents in the vapor cell.

A buffer gas could be added before bonding to fill the cell with a desirable species of buffer gas suitable for atomic clocks, magnetometers, and gyroscopes also in some embodiments.

Figure 73:
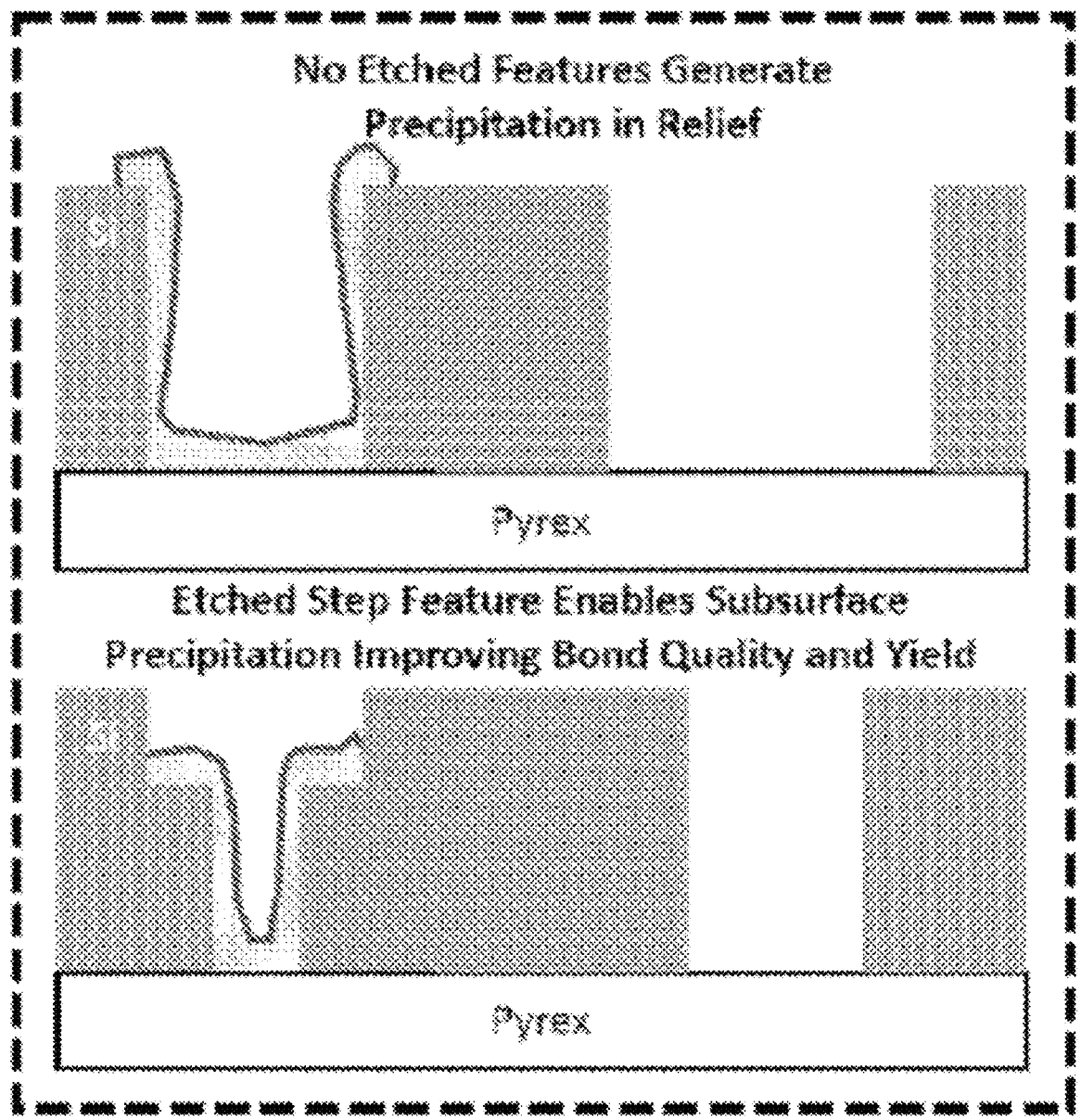
FIG. 73 illustrates an example of a recessed counterbore or ledge etched into the deposition cavity to prevent precipitation of precursor onto the bonding area.

A counterbore etched in the silicon around the blind holes is useful in preventing the precipitation of the liquid precursor chemicals from contaminating the surface of the silicon wafer and preventing bonding to the glass wafer, as shown in FIG. 73.

To execute the general idea of reacting chemicals in one cavity, depositing them on a surface, and then laterally moving the two surfaces such that the deposited surface can be bonded shut separately from the reacting chemicals, many experimental and design efforts were involved.

The process is broken into the following parts: design of the wafer structurally and chemically; experimental methods to fill the deposition cavities with precursors; experimental methods to thermally drive the reacted chemicals to a desired location with some constraints on the temperature profile; experimental methods to prevent optical contacting and enable lifting of the wafer for subsequent lateral transfer; experimental parameters determined to successfully seal the cells by anodic bonding.

It has been experimentally demonstrated that anodic bonding, a robust bonding method, is sensitive to any deposited alkali films on the surface and fails to anodically bond if a small volume of alkali metal condenses between the surfaces to be bonded. To prevent fouling of the surface and to make a good bond, the deposited area of alkali metal must be less than the dimensions of the cell cavity in some embodiments.

To hold and trap aqueous precursors, the patterned silicon wafer connected to glass should be hydrophilic. The process of DRIE incorporates a time multiplexed deposition of a hydrophobic hydrocarbon and should be stripped away to aid in wettability. In this embodiment, Nanostrip, a mixture of sulfuric acid and hydrogen peroxide, was used to strip this hydrophobic coating and allow a native oxide to form on the exposed silicon which provides a hydrophilic surface for aqueous solutions to adhere to. Further choices in surface modification including oxidation, high roughness, and microfabricated structures aid in the entrapment of solution. Finally, as alkali salt solutions dry, they precipitate crystalline material. This material typically precipitates vertically out of the deposition cavities which creates a raised surface feature which impedes anodic bonding. This embodiment features a small counterbore (illustrated in FIG. 73) which provides a location below the surface of the wafer for the precipitate to form proud of the original recess it was deposited in.

A typical wafer can be patterned with 100-1000 vapor cell cavities as well as deposition cavities. Each deposition cavity requires a small volume of aqueous reactants to be introduced and because the size of the deposition cavities must be smaller than the cell cavities, the built-in conflict of having large deposition cavities for ease of pipetting and small deposition cavities for small cell dimensions and large wafer yields must be solved as well as a method or methods to fill wafers with precursors in an expedited manner.

Two methods are proposed to do so: method 1 (illustrated in FIG. 75) involves a microfluidic design with a winding channel in the Si substrate with an inlet and an outlet port to flow an aqueous precursor through multiple deposition cavities delivering the precursors to the deposition cavities with a subsequent drying step.

Figure 74:
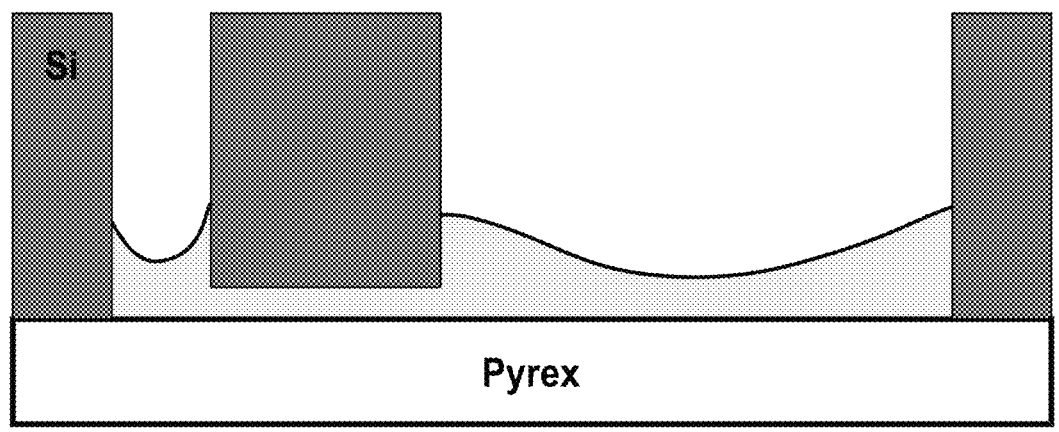
FIG. 74 illustrates smaller deposition cavities with additional pipetting cavity connected through a backside channel according to one or more embodiments of the present technology.
Figure 75:
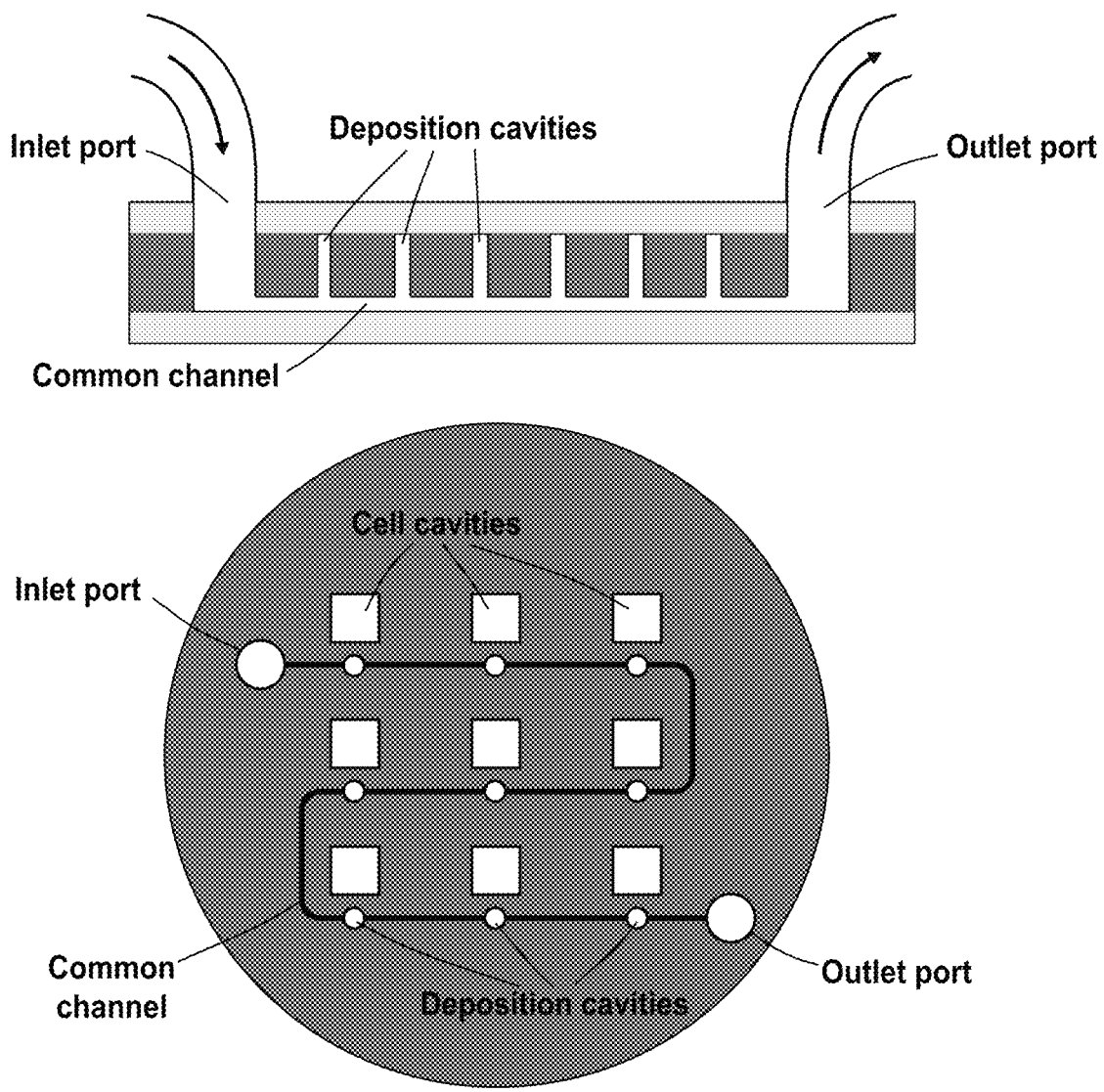
FIG. 75 illustrates multiple deposition cavities connected by a common channel to facilitate the introduction of the precursor solution. in accordance with some embodiments of the present technology.

Method 2 (illustrated in FIG. 74) is to have small deposition cavities connected by thin channels to a larger deposition cavity that can be easily filled with a pipette the volume of which is wicked by capillary action into the deposition chambers. These methods have the benefits of being able to fill many deposition chambers simultaneously as well as removing the limitation of having to mechanically align a syringe filled with aqueous precursor to the <50 micron level across a wafer for very small (<100 micron on each side) vapor cells (FIG. 75). In this embodiment, 1 mm×1 deposition cavities were used for ease of pipetting ~1-3 microliters of solution into each cavity and a subsequent drying step was performed at 85 C for 1 hour. The first embodiment did not include the counterbore and material precipitated out of the top which was cleaned with a wet cotton swab and left behind a few small streaks which proved important for avoiding optical contacting (described below).

To ensure the majority of the desired products condense in a desired area, the thermal gradient must be engineered to create a substantial thermal flux of material while preventing undo increases in the temperature of the glass. Alkali metals have a strong tendency to infiltrate borosilicate and aluminosilicate glasses (those typically used in anodic bonding) at elevated (>200-250 C) temperatures. Incidentally, this is a lower temperature range than anodic bonding typically proceeds (~300-350 C). Additionally, the reaction between alkali-chloride and barium azide, the reaction used in these embodiments, proceeds at about 180-200 C.

Figure 76:
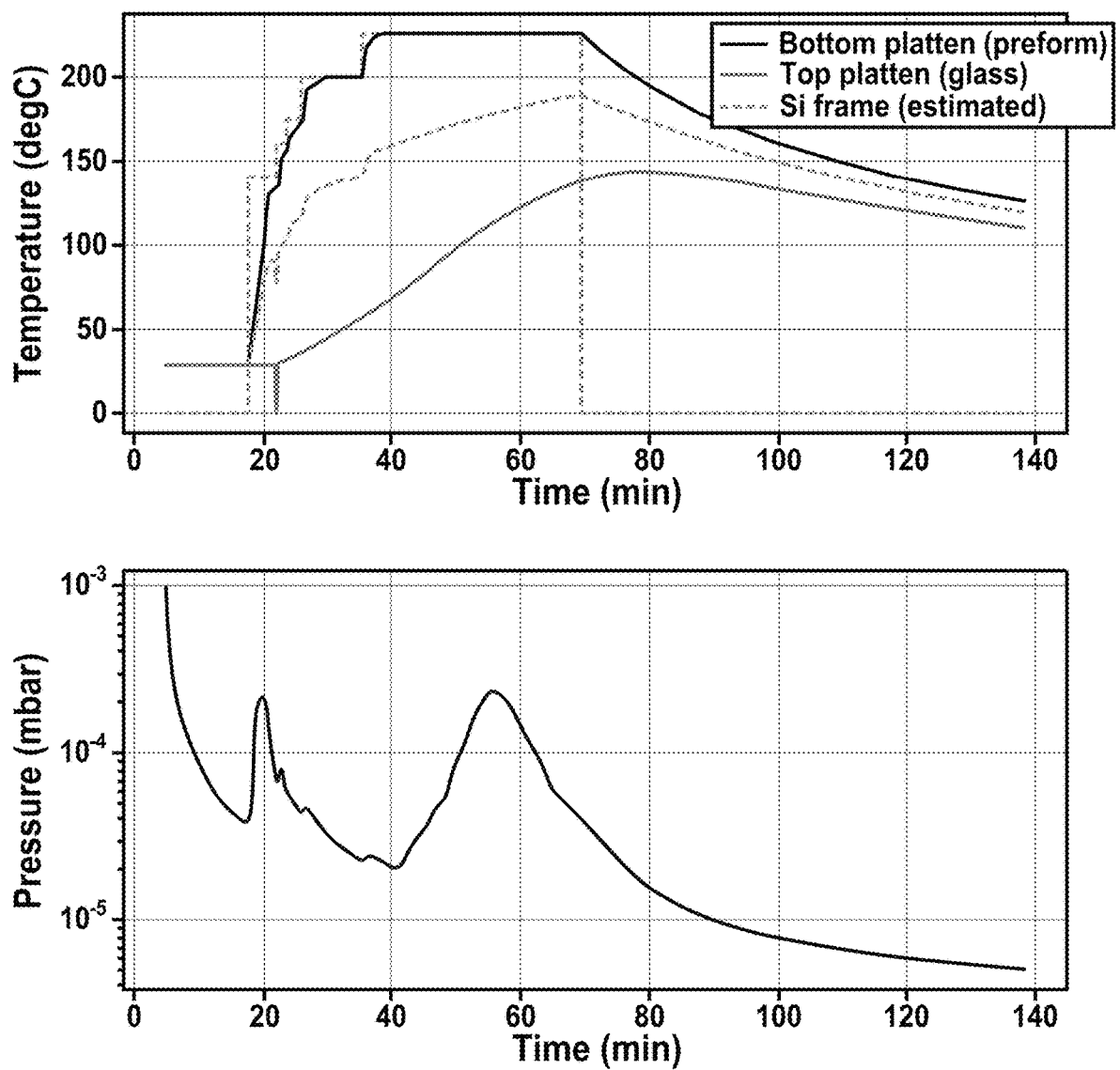
FIG. 76 are graphs of Temperature vs Time (top) and Pressure vs. Time (bottom) while activating the precursors thermally and driving the alkali metal to a desired location in accordance with one or more embodiments of the present technology.

The thermal gradient was formed by separately controlling the temperatures of the upper and lower platens which hold the window wafer and the preform wafer including the deposition and cell cavities, respectively (FIG. 76). The first stage of the reaction is activated and a small increase in the background pressure can be attributed to nitrogen release at ~160 C (FIG. 76). Thermal latency in most vacuum systems led to a procedure which activates the decomposition reaction of $BaN_6 \rightarrow Ba+3N_2$ first, fully (measured by monitoring the decrease in the pressure indicating an end of the release of nitrogen), and then elevating the temperature profile to achieve the second reaction stage where $Ba+2RbCl \rightarrow 2Rb+BaCl_2$ (FIG. 76).

Condensed droplets were initially observed during the second temperature gradient application and the heating was turned off but the reaction continued to proceed generating macroscopic quantities of Rb deposited onto the unbonded glass window. To achieve the deposition, the bottom platen containing the preform wafer and precursor material was kept at ~225 C while the upper platen was not heated while the wafers were in contact. Nevertheless, the temperature of the lower platen increased due to conductive heating generating an appropriate thermal gradient (FIG. 76).

The problem of surface fouling an anodic bond due to errant deposition of alkali metal was solved by ensuring that the glass wafer and the silicon wafer were in contact during deposition. This ensures that the deposition cavity does not errantly effuse material onto the surface of the glass which is a considerable concern due to the high vapor pressure of alkali metals at elevated (~200 C) temperatures. Glass and silicon wafers are typically very smooth and it is common to observe optical contacting between two such wafers. The strength of this reaction can be strong and can overpower wafer holding clips in commercial anodic bonding machines. To circumvent this problem, a solution was devised to keep the surface of the wafers slightly apart prior to bonding. In this embodiment, the streaks left behind from cleaning the wafer with a wet cotton swab provided a very thin separation of the wafers which was thick enough to prevent optical contacting but thin enough for anodic bonding to overcome keeping in mind that any streaks were kept greater than 1 mm from the cell cavities to ensure successful hermetic sealing.

The level of excess debris simulated the application of ultrathin coatings which provide a slight gap between the two wafers at the submicron scale. This step, while crude, enables the two wafers to be pulled apart after making mechanical contact which is important for three reasons: 1) this allows the wafers to be translated relative to each other without scraping deposited material off the glass, 2) releases gaseous byproducts of the chemical reaction such as nitrogen, and 3) enables the cell cavities to be backfilled with various relevant gases before the final bonding step is completed. The separation of the wafer can be generated in a reliable means using ultrathin patterned coatings which are thick enough to prevent optical contacting >10 nm but thin enough to allow anodic bonding (nominally <50 nm but can be greater if the patterned areas are greater than 1 mm from cell cavities).

To form an anodic bond, completing the isolation of the alkali metal inside the cell cavities without the precursor material the following procedure was followed:

1) After deposition, the wafers were allowed to cool to room temperature to reduce the alkali metal vapor pressure.

2) The wafers were then lifted tens of microns relative to each other and translated laterally ~5 mm to move the deposited alkali metal containing window sections to nest inside the cell cavities. The excess gaseous byproduct, nitrogen, was allowed to exit at this time. At this step, buffer gas backfilling of virtually any buffer gas can also be completed.

3) The wafers were brought back into contact with moderate surface pressure partially sealing the alkali metal inside the cell cavity with a non-hermetic bond. This prevents the alkali metal from evaporating into the space between wafers which would foul the bond as the temperature is increased.

Figure 77:
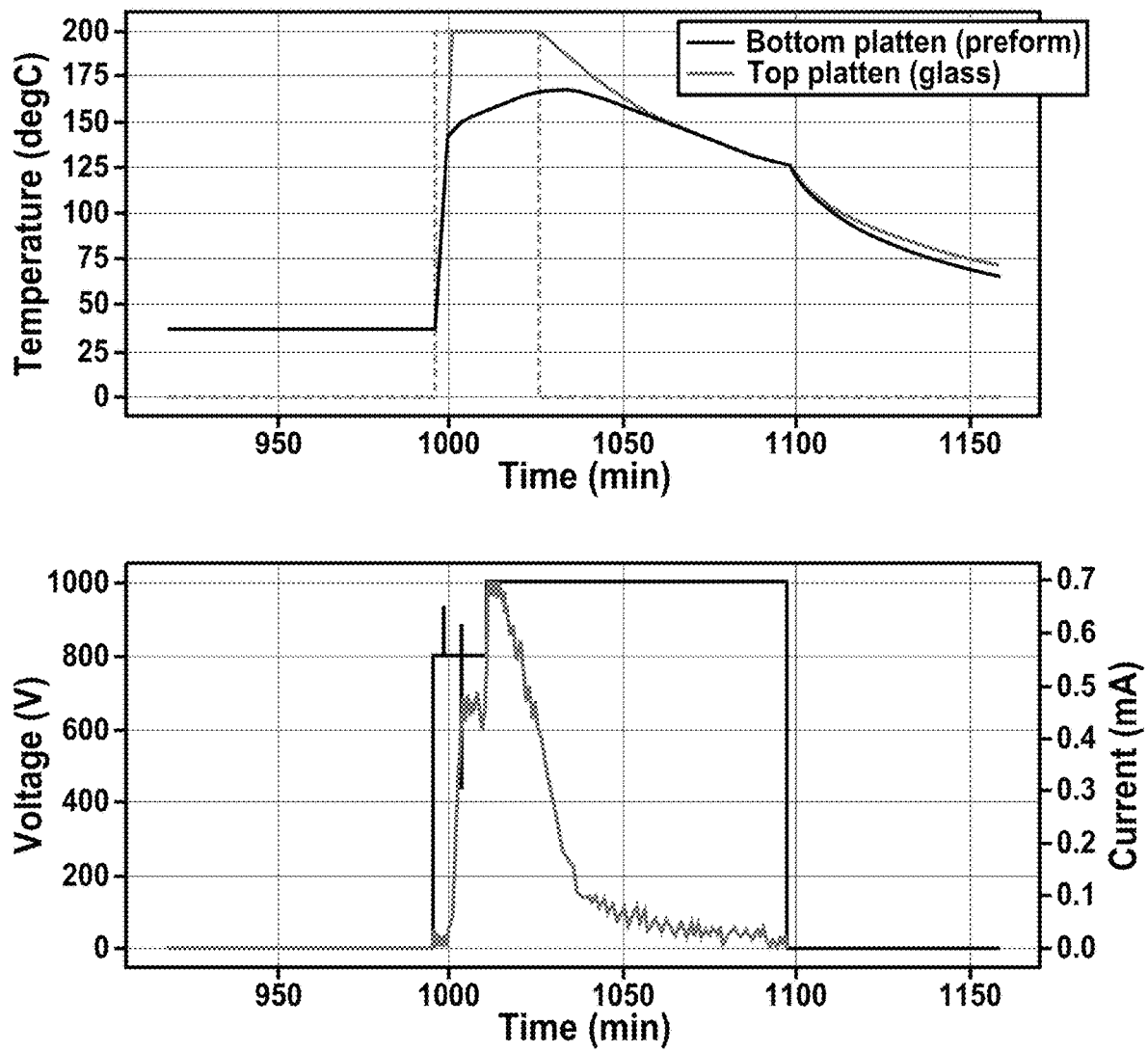
FIG. 77 are graphs of Temperature vs Time (top) and Voltage and Current vs Time (bottom) while bonding according to various embodiments of the present technology.

4) The temperature of the wafers is increased independently such that the glass window to be bonded is the hottest part of the system and the preform on the lower platen is kept the coldest to drive condensed alkali metal away from the hot glass surface while also providing the thermal energy for the anodic bond to take place in less than an hour. The upper platen containing the glass wafer was temperature stabilized to 200 C and the lower platen was heated to 150 C but was conductively heated to about 170 C due to the upper heater (traditionally, anodic bonding takes place at 350 C) (FIG. 77). The voltage was applied in two steps, the first at 800 V and the second at 1000 V over the course of approximately one hour with a maximum current of 0.7 mA which is substantially less than most anodic bonds use (which is about 4 mA) (FIG. 77). A total deposited charge of 1000 mC is achieved which is a factor of 60% lower than typical anodic bonds use but was nevertheless shown to form a strong bond (FIG. 77).

In some examples, disclosed herein are wafers comprising: a first glass wafer; a silicon wafer having a series of cell preforms having a plurality of cavities, an inlet, port, and an outlet port, wherein the first glass wafer is bonded to one side of the silicon wafer; wherein the series of cell preforms include an under-etched conduit to between the inlet port and the outlet port allowing chemical precursors inserted through the inlet port to fill the plurality of cavities; and alternatively filling a plurality of microdeposition cavities by microfluidic capillary action enabling a size reduction of the minimum alkali vapor cell fabricated using these methods to reach the 10 micron characteristic length scale. In some examples, the chemical precursors include an alkali chloride or an alkali azide. In some examples, the plurality of cavities are 1 mm×1 mm deposition cavities but can be made as small as 10 microns characteristic size.

Also disclosed herein are methods comprising: inserting chemical precursors into a deposition cavity created by attaching a frame to a back side of a glass wafer having multiple holes therein; fabricating an array of cell preforms by etching holes in a silicon wafer having a counterbore etch and bonding glass to one side and leaving the holes in the silicon wafer open on the other side; placing the glass wafer and the silicon wafer inside a vacuum system such that the holes in the silicon wafer are situated above the holes in the glass wafer; heating the assembly to react with the chemical precursor and produce a resultant compound, that exits the holes in the silicon wafer and is condensed into the bottom of the holes in the glass wafer or directly onto a glass wafer; laterally moving the silicon wafer and the glass wafer such that a solid part of the silicon wafer covers the holes in the glass wafer and the counterbore etch prevents the precipitation of chemical precursors from contaminating a surface of the silicon wafer and bonding to the glass wafer; and bonding the silicon wafer and the glass wafer together to seal the resultant compound in the cell preforms. In some examples, the chemical precursors include an alkali chloride or an alkali azide. In some examples, the alkali chloride include $BaN_6$ which reacts to form $BaCl$, $N_2$ and alkali metal at elevated temperature. In some examples, the alkali azide include $RbN_3$, $CsN_3$, or $KN_3$ and the method further comprises applying an ultraviolet light to the alkali azide. In some examples, the methods can further comprise adding a buffer gas before bonding the silicon wafer to the glass wafer.

Other advantages which are obvious and which are inherent to the invention will be evident to one skilled in the art. It will be understood that certain features and sub-combinations are of utility and may be employed without reference to other features and sub-combinations. This is contemplated by and is within the scope of the claims. Since many possible embodiments may be made of the invention without departing from the scope thereof, it is to be understood that all matter herein set forth or shown in the accompanying drawings is to be interpreted as illustrative and not in a limiting sense.

The methods of the appended claims are not limited in scope by the specific methods described herein, which are intended as illustrations of a few aspects of the claims and any methods that are functionally equivalent are intended to fall within the scope of the claims. Various modifications of the methods in addition to those shown and described herein are intended to fall within the scope of the appended claims. Further, while only certain representative method steps disclosed herein are specifically described, other combinations of the method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

What is claimed is:

1. A method comprising:
    depositing a fluid into a reservoir of a device, the device comprising:
        a first layer having a top surface and a bottom surface opposite and spaced apart from the top surface;
        a second layer having a top surface and a bottom surface opposite and spaced apart from the top surface;
        the second layer comprising a first cavity, a set of second cavities, and a set of grooves; wherein the first cavity perforates the second layer from the top surface to the bottom surface; wherein each of the second cavities perforates the second layer from the top surface to the bottom surface;
        wherein each of the grooves extends from the first cavity to one of the second cavities on the bottom surface; wherein the second layer is disposed on the first layer, such that the bottom surface of the second layer is disposed on the top surface of the first layer; wherein the first cavity together with the top surface of the first layer defines the reservoir; wherein the set of second cavities together with the top surface of the first layer defines a set of receptacles; and wherein the set of grooves together with the top surface of the first layer define a set of conduits fluidly connecting each of the receptacles to the reservoir;
    such that, when the fluid is placed in the reservoir, the fluid flows to each of the receptacles via capillary action, such that the fluid at least partially fills each of the receptacles;
    wherein the fluid comprises an alkali metal precursor and a solvent.

2. The method of claim 1, wherein the alkali metal precursor comprises an alkali halide, an alkali azide, or a combination thereof.

3. The method of claim 1, wherein the method further comprises drying the fluid to form a residue comprising the alkali metal precursor as a solid in the receptacles and reservoir.

4. The method of claim 3, further comprising disposing a vapor cell preform on the device, the vapor cell preform comprising:
    a third layer having a top surface and a bottom surface opposite and spaced apart from the top surface;
    a fourth layer having a top surface and a bottom surface opposite and spaced apart from the top surface;
    the fourth layer comprising a set of third cavities, wherein each of the third cavities perforates the fourth layer from the top surface to the bottom surface;
    wherein the fourth layer is disposed on the third layer, such that the bottom surface of the fourth layer is disposed on the top surface of the third layer; wherein the set of third cavities together with the top surface of the third layer defines a set of containers; and
    wherein the vapor cell preform is disposed on the device such that the top surface of the fourth layer is disposed on the top surface of the second layer and the set of containers are aligned over the set of receptacles.

5. The method of claim 4, wherein the method further comprises making the vapor cell preform.

6. The method of claim 4, further comprising subjecting the residue to a reaction stimulus to form an alkali metal vapor, which enters the set of containers, thereby depositing an alkali metal into the containers.

7. The method of claim 6, wherein the reaction stimulus comprises heating the residue at an elevated temperature, irradiating the residue with ultraviolet radiation, or a combination thereof.

8. The method of claim 6, further comprising separating the vapor cell preform from the device after the alkali metal has been deposited into the containers, optionally injecting a buffer gas into the containers, and sealing the containers, thereby forming alkali metal vapor cells.

9. The method of claim 1, wherein the first layer comprises glass.

10. The method of claim 1, wherein the second layer comprises silicon.

11. A method comprising:
flowing a fluid from an inlet to an outlet of a lumen of a main conduit of a device, the device comprising:
a first layer having a top surface and a bottom surface opposite and spaced apart from the top surface;
a second layer having a top surface and a bottom surface opposite and spaced apart from the top surface;
the second layer comprising a set of first cavities, a groove, and a set of second cavities; wherein the set of first cavities comprise an inlet shaft and an outlet shaft, wherein the inlet shaft and the outlet shaft each perforates the second layer from the top surface to the bottom surface; wherein each of the second cavities perforates the second layer from the top surface to the bottom surface; wherein the groove extends from the inlet shaft to the outlet shaft along the bottom surface of the second layer; wherein the inlet shaft, the outlet shaft, and each of the second cavities are in fluid communication with the groove;
wherein the second layer is disposed on the first layer, such that the bottom surface of the second layer is disposed on the top surface of the first layer; wherein the inlet shaft, the outlet shaft, and the groove together with the top surface of the first layer defines the main conduit having a longitudinal axis, the inlet, the outlet axially spaced apart from the inlet, and the lumen for fluid flow extending from the inlet to the outlet; wherein the set of second cavities together with the top surface of the first layer defines a set of receptacles; and wherein each of the receptacles is in fluid communication with the lumen of the main conduit;
such that, when the fluid flows from the inlet to the outlet through the lumen of the main conduit, the fluid further flows into each of the receptacles via capillary action, such that the fluid at least partially fills each of the receptacles;
wherein the fluid comprises an alkali metal precursor and a solvent.

12. The method of claim 11, wherein the alkali metal precursor comprises an alkali halide, an alkali azide, or a combination thereof.

13. The method of claim 11, wherein the method further comprises drying the fluid to form a residue comprising the alkali metal precursor as a solid in the receptacles and reservoir.

14. The method of claim 13, wherein the method further comprises disposing a vapor cell preform on the device, the vapor cell preform comprising:
a third layer having a top surface and a bottom surface opposite and spaced apart from the top surface;
a fourth layer having a top surface and a bottom surface opposite and spaced apart from the top surface;
the fourth layer comprising a set of third cavities, wherein each of the third cavities perforates the fourth layer from the top surface to the bottom surface;
wherein the fourth layer is disposed on the third layer, such that the bottom surface of the fourth layer is disposed on the top surface of the third layer;
wherein the set of third cavities together with the top surface of the third layer defines a set of containers;
wherein the vapor cell preform is disposed on the device such that the top surface of the fourth layer is disposed on the top surface of the second layer and the set of containers are aligned over the set of receptacles.

15. The method of claim 14, wherein the method further comprises making the vapor cell preform.

16. The method of claim 14, further comprising subjecting the residue to a reaction stimulus, thereby forming an alkali metal vapor, which enters the set of containers, thereby depositing the alkali metal into the containers.

17. The method of claim 16, wherein the reaction stimulus comprises heating the residue at an elevated temperature, irradiating the residue with ultraviolet radiation, or a combination thereof.

18. The method of claim 16, further comprising separating the vapor cell preform from the device after the alkali metal has been deposited into the containers, optionally injecting a buffer gas into the containers, and sealing the containers, thereby forming alkali metal vapor cells.

19. The method of claim 11, wherein the first layer comprises glass.

20. The method of claim 11, wherein the second layer comprises silicon.

* * * * *